(12) United States Patent
Watanabe et al.

(10) Patent No.: US 12,347,583 B2
(45) Date of Patent: Jul. 1, 2025

(54) DISPLAY DEVICE AND ELECTRONIC DEVICE

(71) Applicants: Sony Group Corporation, Tokyo (JP); Sony Semiconductor Solutions Corporation, Kanagawa (JP)

(72) Inventors: Akira Watanabe, Kanagawa (JP); Yoshifumi Zaizen, Kanagawa (JP)

(73) Assignees: Sony Group Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 568 days.

(21) Appl. No.: 17/294,654

(22) PCT Filed: Nov. 28, 2019

(86) PCT No.: PCT/JP2019/046664
§ 371 (c)(1),
(2) Date: May 17, 2021

(87) PCT Pub. No.: WO2020/111202
PCT Pub. Date: Jun. 4, 2020

(65) Prior Publication Data
US 2022/0013593 A1     Jan. 13, 2022

(30) Foreign Application Priority Data
Nov. 28, 2018   (JP) .................. 2018-222474

(51) Int. Cl.
*H01B 1/02*       (2006.01)
*H10K 50/818*     (2023.01)
(Continued)

(52) U.S. Cl.
CPC .............. *H01B 1/02* (2013.01); *H10K 50/818* (2023.02); *H10K 50/852* (2023.02);
(Continued)

(58) Field of Classification Search
CPC ...................... H10K 59/122; H10K 2102/351
See application file for complete search history.

(56) References Cited

U.S. PATENT DOCUMENTS 7,777,411 B2 *   8/2010   Seki .................... H10K 59/122
                                                              313/506
9,450,211 B2 *   9/2016   Ahn ..................... H10K 59/173
                          (Continued)

FOREIGN PATENT DOCUMENTS

CN       104218062 A      12/2014
JP       2002333862 A     11/2002
                  (Continued)

OTHER PUBLICATIONS

International Search Report (PCT/ISA/210), International Application No. PCT/JP2019/046664, dated Feb. 19, 2020.
(Continued)

*Primary Examiner* — Vincent Wall
(74) *Attorney, Agent, or Firm* — Michael Best & Friedrich LLP

(57) ABSTRACT

A display device includes a plurality of first electrodes each provided for each pixel, an insulating layer containing a silicon compound, provided between the first electrodes, and covering a peripheral edge portion of the first electrode, a first interface layer containing a first silicon oxide and provided at an interface between the first electrode and the insulating layer, an organic layer including a light emitting layer, and provided on the first electrodes and the insulating layer, commonly to all of pixels, and a second electrode provided on the organic layer. The insulating layer contains a second silicon oxide on a surface portion on a side of the organic layer.

19 Claims, 42 Drawing Sheets

(51) Int. Cl.
*H10K 50/852* (2023.01)
*H10K 59/121* (2023.01)
*H10K 59/80* (2023.01)

(52) U.S. Cl.
CPC ......... *H10K 59/121* (2023.02); *H10K 59/876* (2023.02); *H10K 59/80518* (2023.02); *H10K 59/80524* (2023.02)

(56) References Cited

U.S. PATENT DOCUMENTS

| | | | |
|---|---|---|---|
| 11,730,017 B2 * | 8/2023 | Hwang | H10K 71/135 |
| 2004/0183433 A1 | 9/2004 | Cho | |
| 2005/0057154 A1 | 3/2005 | Masumo | |
| 2005/0245078 A1 | 11/2005 | Ohnuma | |
| 2007/0252525 A1 * | 11/2007 | Seki | H10K 59/122 |
| | | | 313/509 |
| 2007/0278946 A1 | 12/2007 | Ito | |
| 2017/0141167 A1 | 5/2017 | Naganuma | |
| 2018/0212006 A1 * | 7/2018 | Yamazaki | H10K 50/844 |
| 2019/0096971 A1 * | 3/2019 | Ukigaya | H10K 59/122 |
| 2019/0267437 A1 * | 8/2019 | Hou | H10K 59/122 |
| 2019/0386248 A1 * | 12/2019 | Itonaga | H10K 59/122 |

FOREIGN PATENT DOCUMENTS

| | | | |
|---|---|---|---|
| JP | 2004127933 A | 4/2004 | |
| JP | 2007-242592 A | 9/2007 | |
| JP | 2010-045050 A | 2/2010 | |
| JP | 2010182668 A | 8/2010 | |
| JP | 2012-114073 A | 6/2012 | |
| JP | 2012216338 A | 11/2012 | |
| JP | 2018063910 A | 4/2018 | |
| JP | 2018181578 A | 11/2018 | |
| KR | 20140112260 A | 9/2014 | |
| KR | 20140140869 A | 12/2014 | |
| KR | 20180054983 A | 5/2018 | |
| WO | 2017/051606 A1 | 3/2017 | |
| WO | WO-2018147050 A1 * | 8/2018 | ............... G09F 9/30 |
| WO | 2018/173465 A1 | 9/2018 | |

OTHER PUBLICATIONS

Notification of Transmittal of the International Search Report and the Written Opinion of the International Searching Authority, or the Declaration (PCT/ISA/220), International Application No. PCT/JP2019/046664, dated Mar. 10, 2020.

Written Opinion of the International Search Authority (PCT/ISA/237), International Application No. PCT/JP2019/046664, dated Mar. 10, 2020.

* cited by examiner

FIG. 15
A 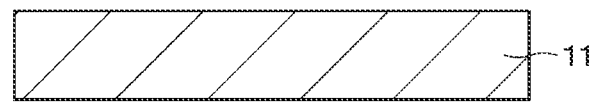
B 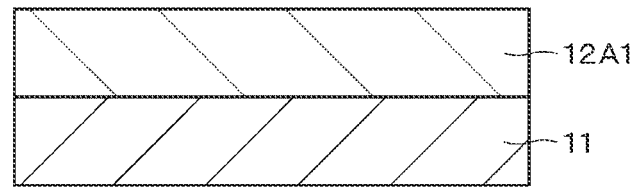
C 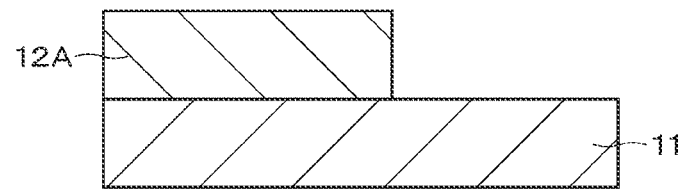
D 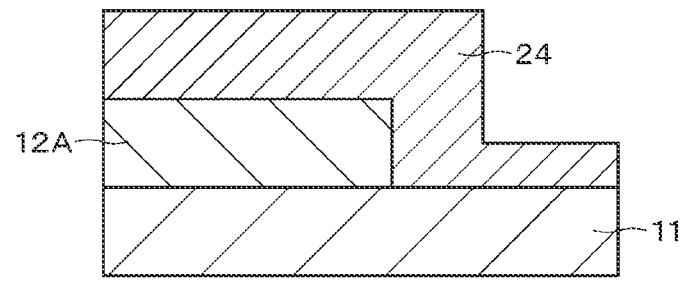
E 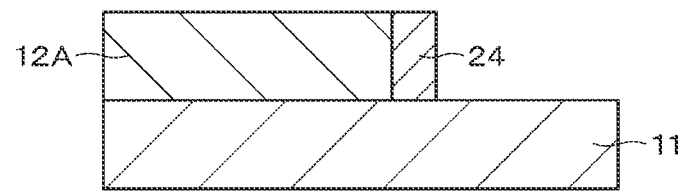
F 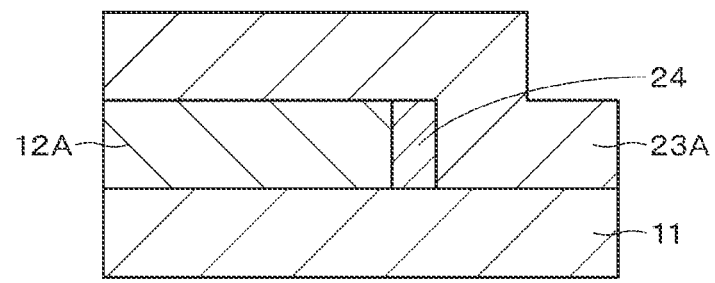

FIG. 16
A 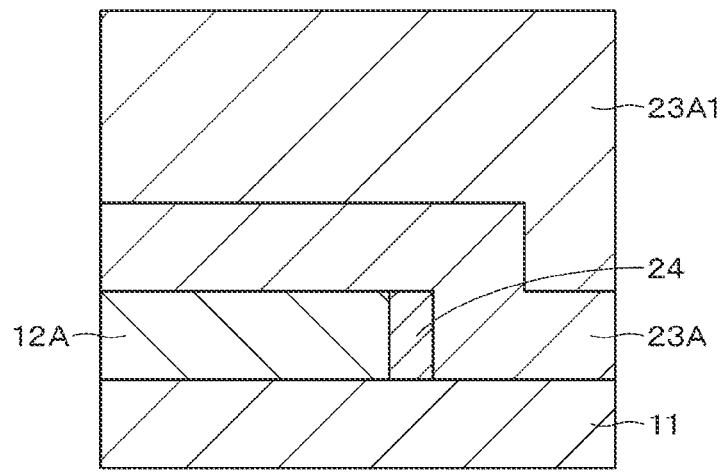
B 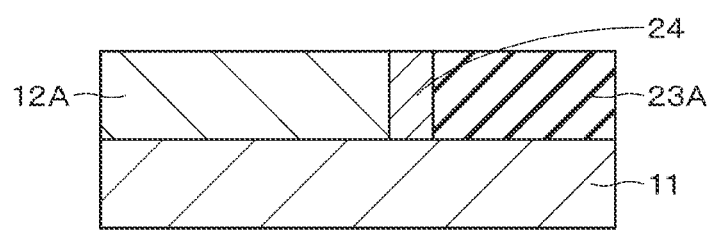
C 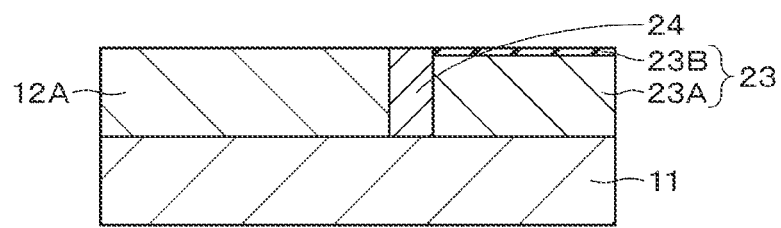
D 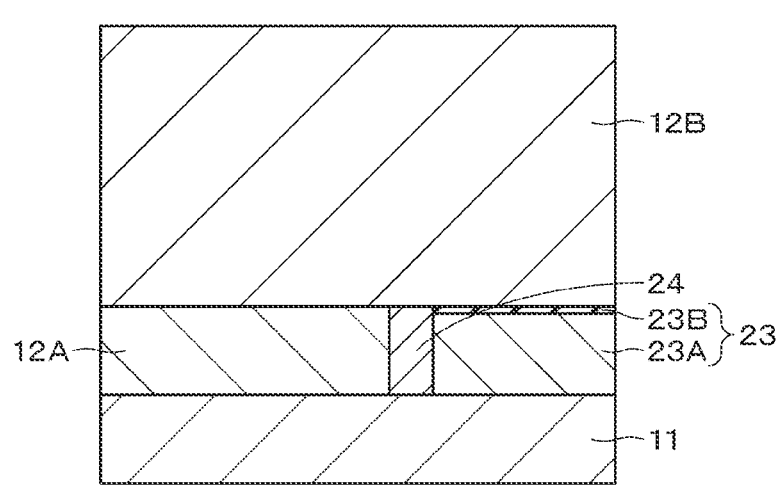

FIG. 20
A
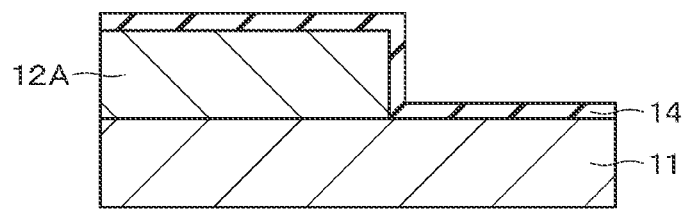
B
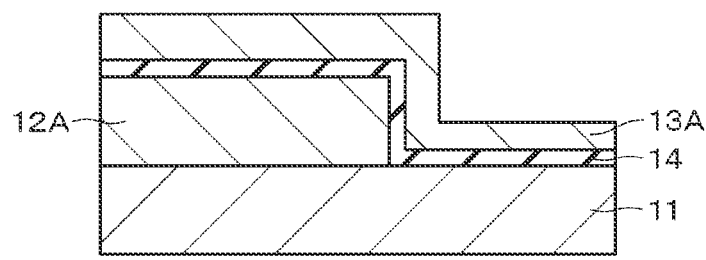
C
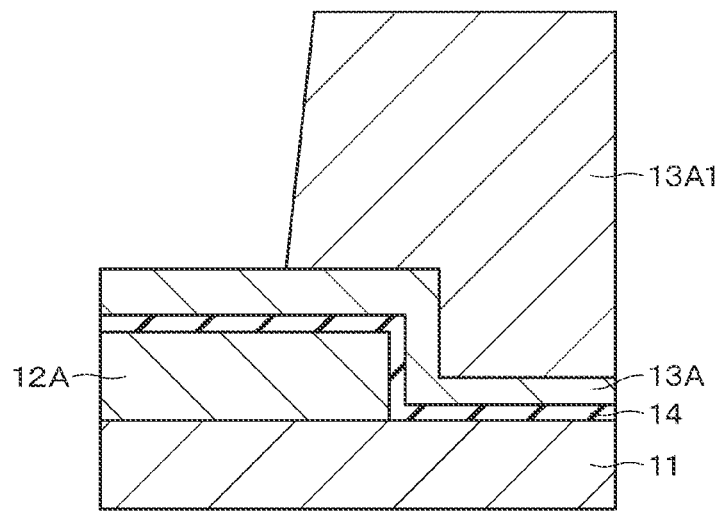

FIG. 21
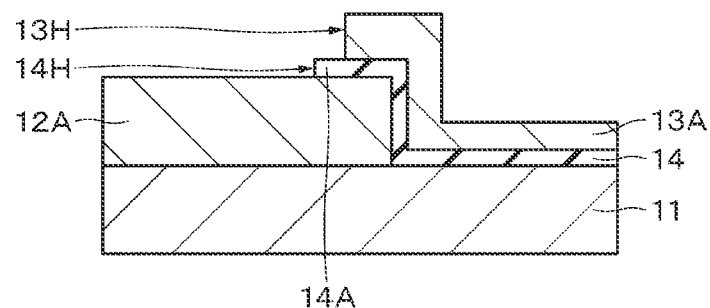
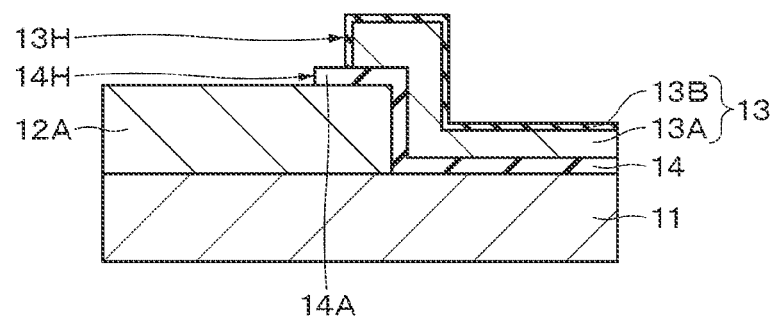
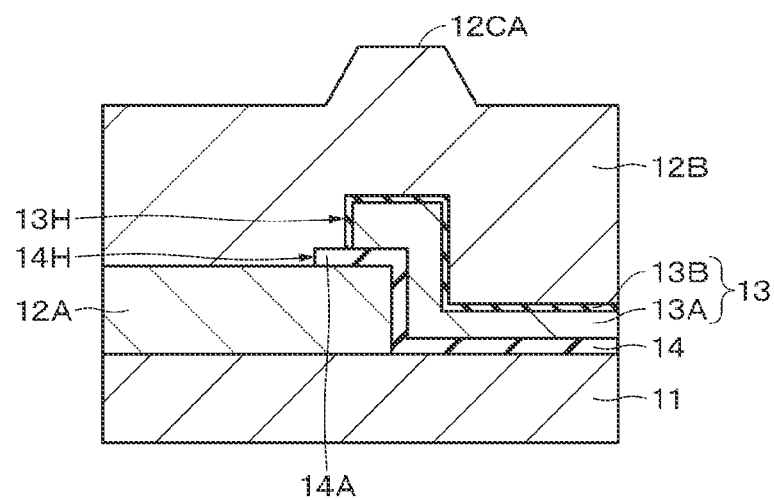

FIG. 24
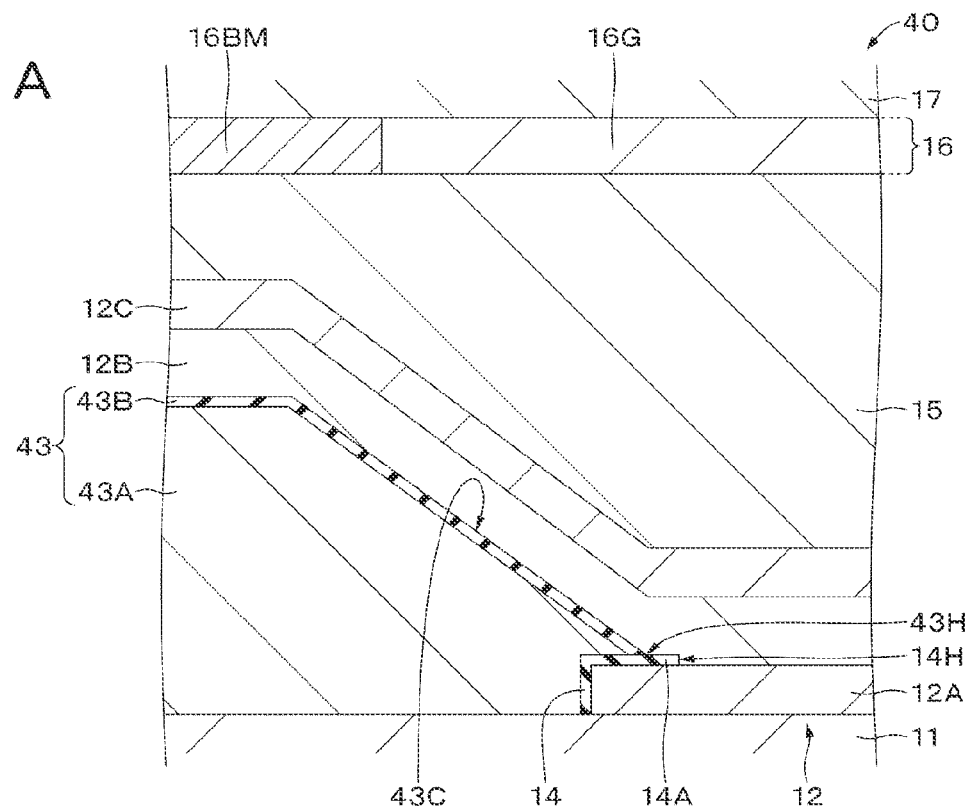
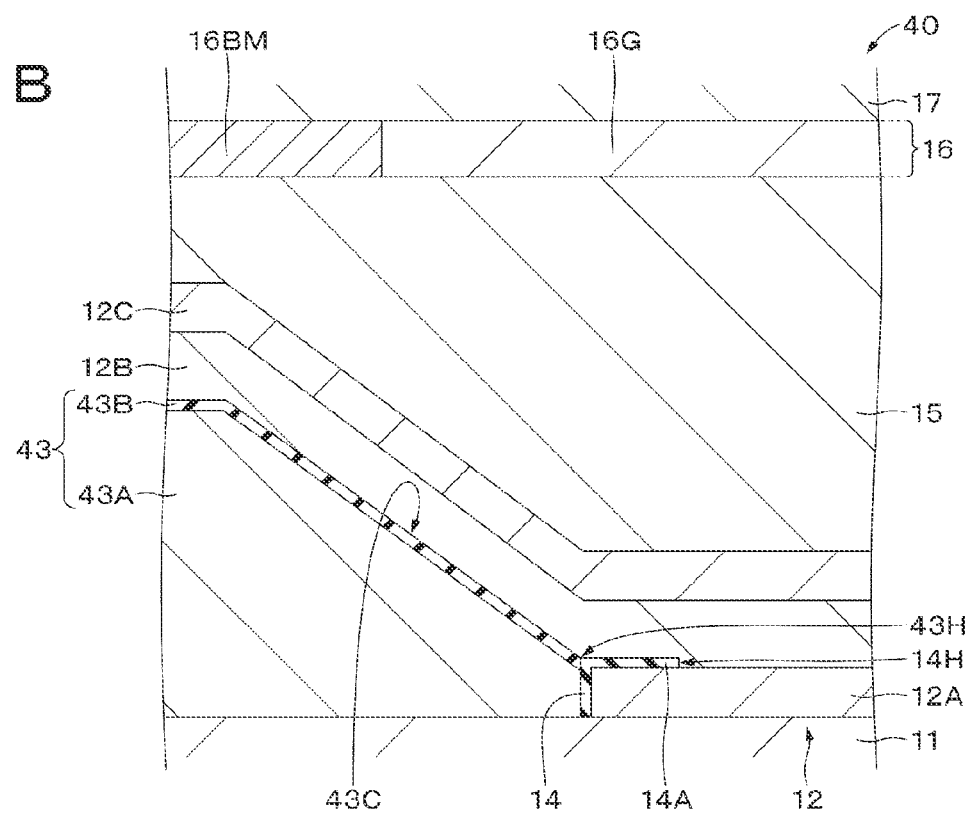

FIG. 25
A
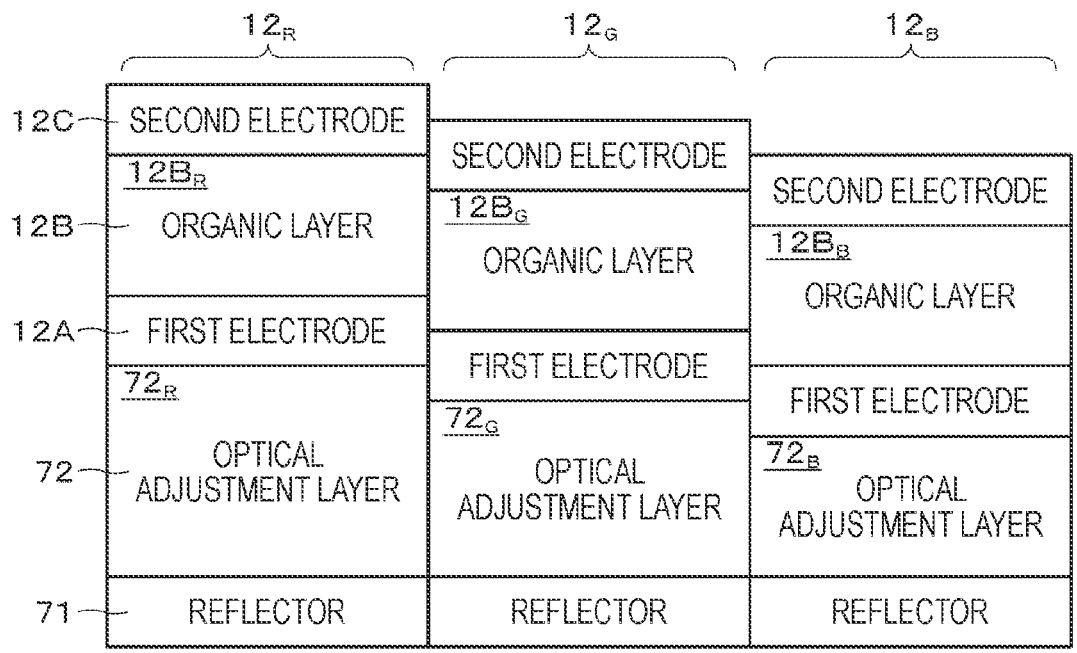
B
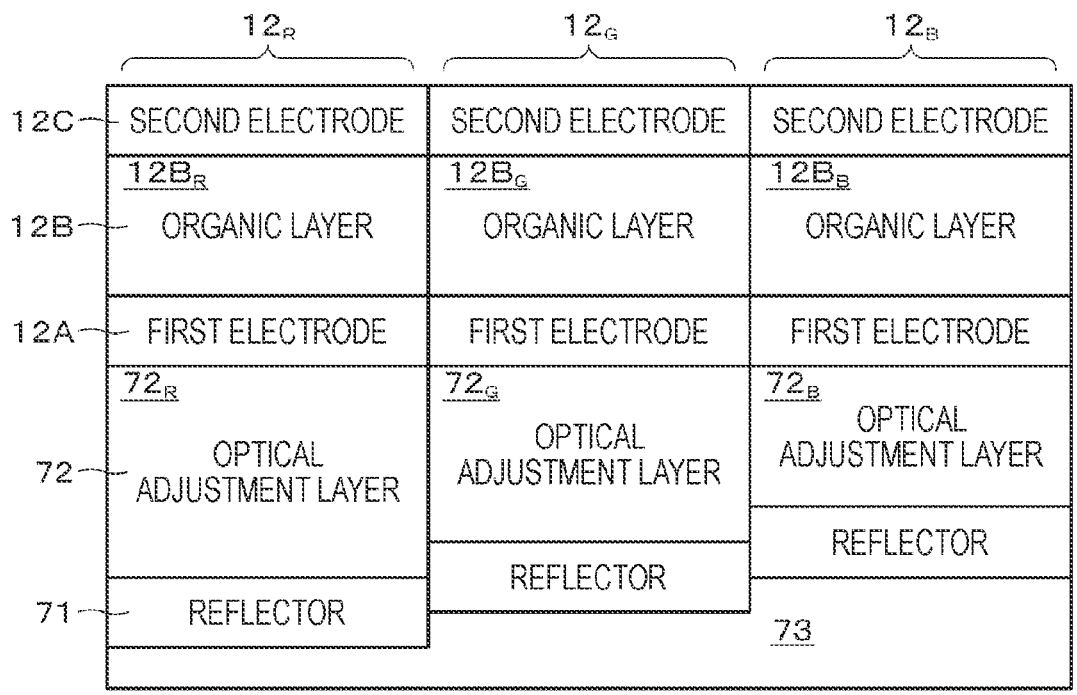

|  | $12_R$ | $12_G$ | $12_B$ |
|---|---|---|---|
| 12C — SECOND ELECTRODE | SECOND ELECTRODE | SECOND ELECTRODE |
| 12B — $12B_R$ ORGANIC LAYER | $12B_G$ ORGANIC LAYER | $12B_B$ ORGANIC LAYER |
| 12A — FIRST ELECTRODE | FIRST ELECTRODE | FIRST ELECTRODE |
| 72 — $72_R$ OPTICAL ADJUSTMENT LAYER | $72_G$ OPTICAL ADJUSTMENT LAYER | $72_B$ OPTICAL ADJUSTMENT LAYER |
| | $71_G$ REFLECTOR | $71_B$ REFLECTOR |
| 71 — $71_R$ REFLECTOR | | |

B

|  | $12_R$ | $12_G$ | $12_B$ |
|---|---|---|---|
| 12C — SECOND ELECTRODE | SECOND ELECTRODE | SECOND ELECTRODE |
| 12B — $12B_R$ ORGANIC LAYER | $12B_G$ ORGANIC LAYER | $12B_B$ ORGANIC LAYER |
| 12A — $12A_R$ FIRST ELECTRODE | $12A_G$ FIRST ELECTRODE | $12A_B$ FIRST ELECTRODE |
| 71 — REFLECTOR | REFLECTOR | REFLECTOR |

|  | $12_R$ | $12_G$ | $12_B$ |
|---|---|---|---|
| 12C | SECOND ELECTRODE | SECOND ELECTRODE | SECOND ELECTRODE |
| 12B | $12B_R$ ORGANIC LAYER | $12B_G$ ORGANIC LAYER | $12B_B$ ORGANIC LAYER |
| 12A | FIRST ELECTRODE | FIRST ELECTRODE | FIRST ELECTRODE |
| 74 | $74_R$ OXIDE FILM | $74_G$ OXIDE FILM | $74_B$ OXIDE FILM |
| 71 | $71_R$ REFLECTOR | $71_G$ REFLECTOR | $71_B$ REFLECTOR |

B

|  | $12_R$ | $12_G$ | $12_B$ |
|---|---|---|---|
| 12C | SECOND ELECTRODE | SECOND ELECTRODE | SECOND ELECTRODE |
| 12B | $12B_R$ ORGANIC LAYER | $12B_G$ ORGANIC LAYER | $12B_B$ ORGANIC LAYER |
| 12A | $12A_R$ FIRST ELECTRODE AND REFLECTOR | $12A_G$ FIRST ELECTRODE AND REFLECTOR | $12A_B$ FIRST ELECTRODE AND REFLECTOR |

FIG. 30
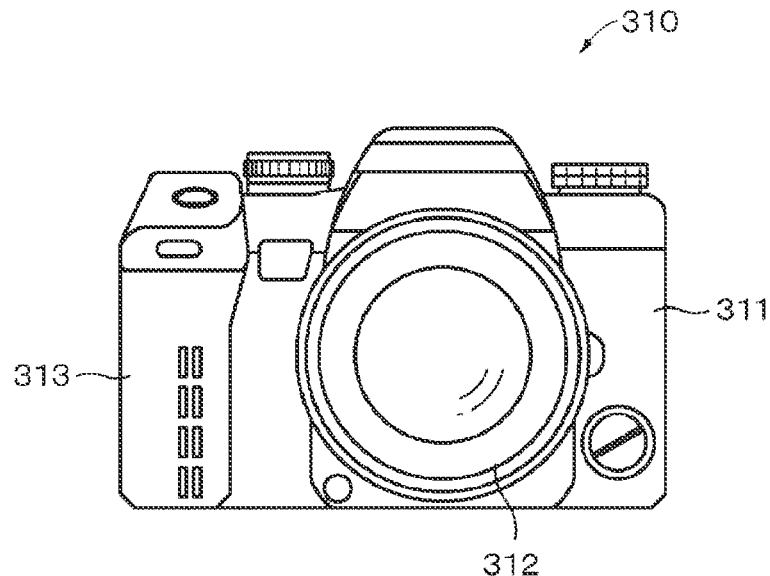
A
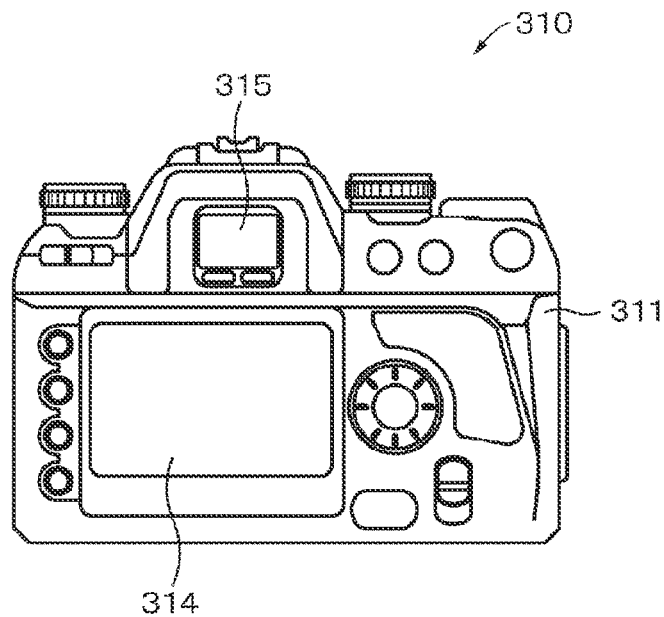
B

FIG. 34
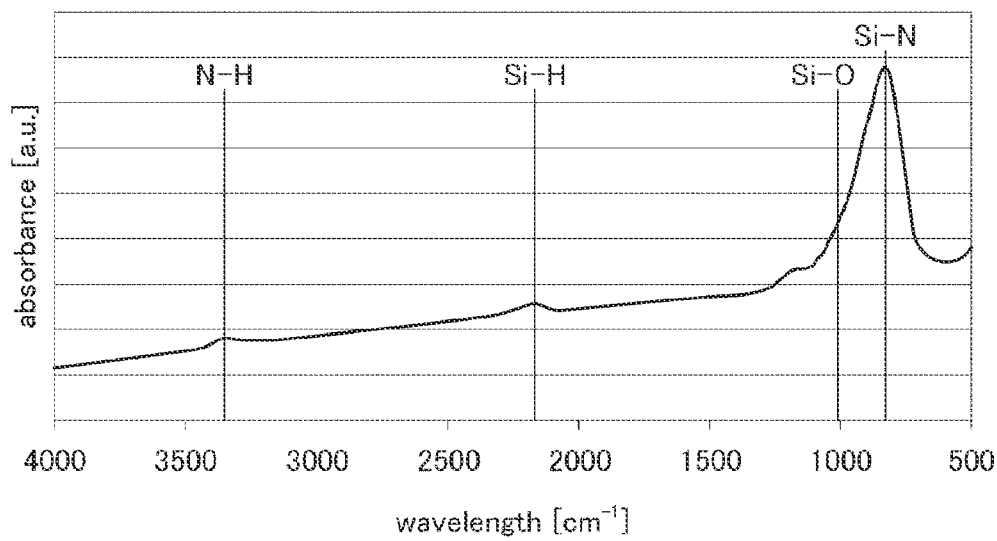
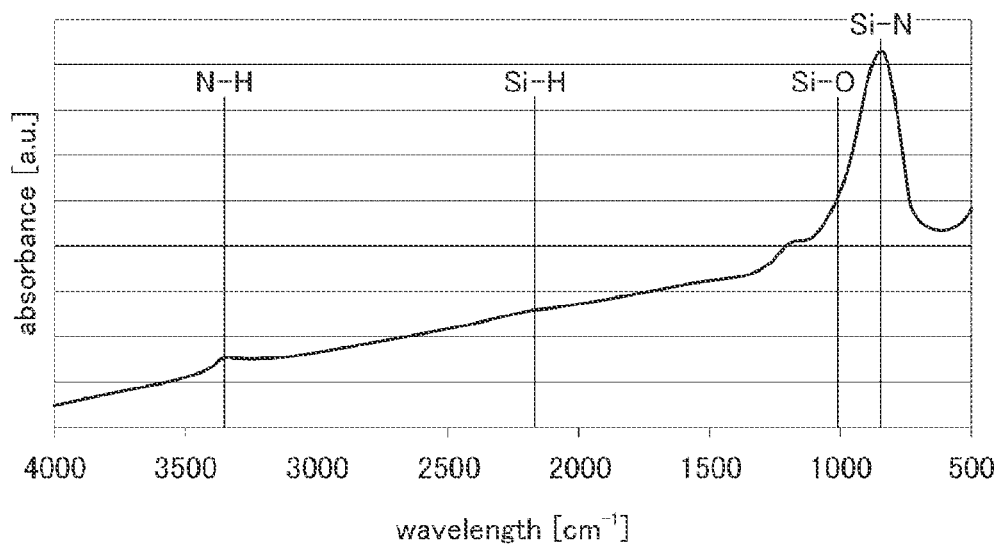

FIG. 38
A 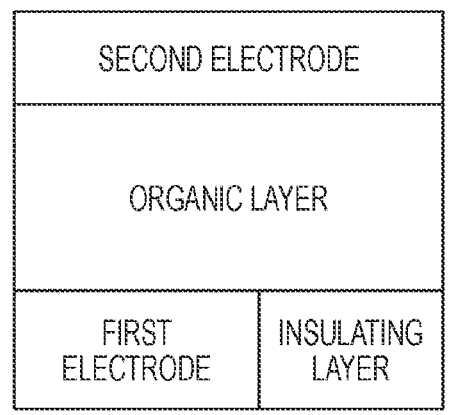
B 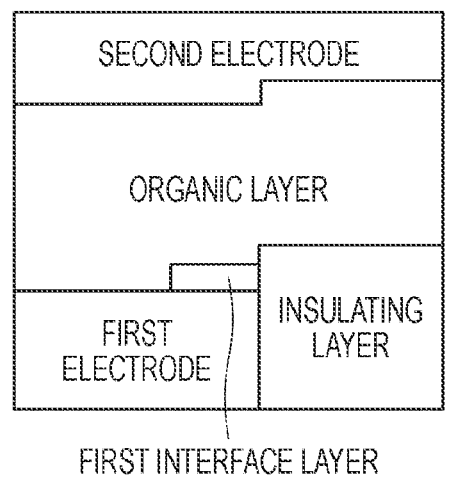

FIG. 39
A
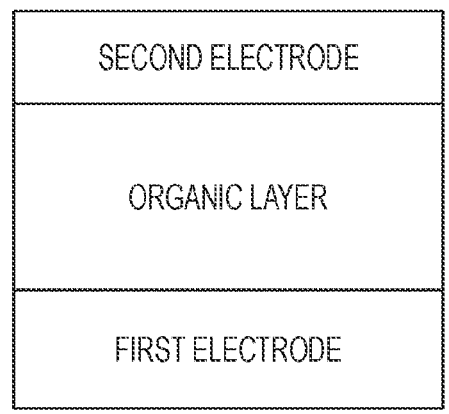
B
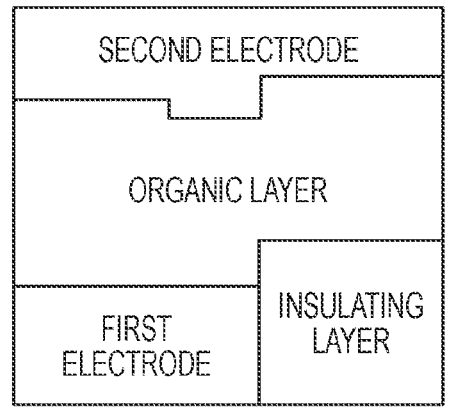

DISPLAY DEVICE AND ELECTRONIC DEVICE

TECHNICAL FIELD

The present disclosure relates to a display device and an electronic device.

BACKGROUND ART

In recent years, as a display device having a plurality of organic electro-luminescence diodes (OLEDs), a display device having an organic layer common to all of pixels has been proposed. However, in the display device having such a configuration, a leak of a drive current is likely to occur between adjacent light emitting elements.

Therefore, a technology for suppressing a leak of a drive current between adjacent light emitting elements has been proposed. Patent Document 1 proposes a technology in which an insulating film is provided in an inter-element region between a plurality of light emitting elements, and a groove is provided at a position between adjacent light emitting elements in the insulating film. Furthermore, Patent Document 2 proposes a technology of forming at least a part of a film thickness region of an insulating layer with a positively charged inorganic nitride.

CITATION LIST

Patent Document

Patent Document 1: Japanese Patent Application Laid-Open No. 2012-216338
Patent Document 2: International Publication No. 2018/147050

SUMMARY OF THE INVENTION

Problems to be Solved by the Invention

As described above, in recent years, the technology for suppressing a leak of a drive current generated between adjacent light emitting elements has been desired among the display devices having an organic layer common to all of pixels.

An object of the present disclosure is to provide a display device and an electronic device capable of suppressing a leak of a drive current generated between adjacent light emitting elements.

Solutions to Problems

To solve the above problem, the first disclosure is a display device including a plurality of first electrodes each provided for each pixel, an insulating layer containing a silicon compound, provided between the first electrodes, and covering a peripheral edge portion of the first electrode, a first interface layer containing a first silicon oxide and provided at an interface between the first electrode and the insulating layer, an organic layer including a light emitting layer, and provided on the first electrodes and the insulating layer, commonly to all of pixels, and a second electrode provided on the organic layer, in which the insulating layer contains a second silicon oxide in a surface portion on a side of the organic layer.

The second disclosure is a display device including a plurality of first electrodes each provided for each pixel, an insulating layer containing a silicon compound and provided between the first electrodes, a first interface layer containing a first silicon oxide and provided between a side surface of the first electrode and a side surface of the insulating layer, an organic layer including a light emitting layer, and provided on the first electrodes and the insulating layer, commonly to all of pixels, and a second electrode provided on the organic layer, in which a thickness of the organic layer on the first electrodes is substantially constant.

The third disclosure is a display device including a plurality of first electrodes each provided for each pixel, an insulating layer provided between the first electrodes, a first interface layer provided between a side surface of the first electrode and a side surface of the insulating layer, an organic layer including a light emitting layer, and provided on the first electrodes and the insulating layer, commonly to all of pixels, and a second electrode provided on the organic layer, in which a thickness of the organic layer on the first electrodes is substantially constant.

The fourth disclosure is an electronic device including any of the display devices according to the first to third disclosures.

BRIEF DESCRIPTION OF DRAWINGS

FIGS. 15A, 15B, 15C, 15D, 15E, and 15F are cross-sectional views illustrating an example of a manufacturing process of the display device.

FIGS. 16A, 16B, 16C, and 16D are cross-sectional views illustrating the example of the manufacturing process of the display device.

FIGS. 20A, 20B, and 20C are cross-sectional views illustrating an example of a manufacturing process of the display device.

FIGS. 21A, 21B, and 21C are cross-sectional views illustrating the example of the manufacturing process of the display device.

FIG. 24A is an enlarged cross-sectional view illustrating a part of the display device illustrated in FIG. 23. FIG. 24B is an enlarged cross-sectional view illustrating a part of the display device according to a modification.

FIG. 25A is a schematic cross-sectional view for describing a first example of a resonator structure. FIG. 25B is a schematic cross-sectional view for describing a second example of the resonator structure.

FIG. 26A is a schematic cross-sectional view for describing a third example of the resonator structure. FIG. 26B is a schematic cross-sectional view for describing a fourth example of the resonator structure.

FIG. 27A is a schematic cross-sectional view for describing a fifth example of the resonator structure.

FIG. 27B is a schematic cross-sectional view for describing a sixth example of the resonator structure.

FIG. 30A is a front view illustrating an example of an appearance of a digital still camera. FIG. 30B is a rear view illustrating an example of the appearance of the digital still camera.

FIG. 34A is a graph illustrating an absorption spectrum of a bulk layer measured by a Fourier transform infrared spectrophotometer. FIG. 34B is a graph illustrating the absorption spectrum of the bulk layer measured by the Fourier transform infrared spectrophotometer.

FIG. 38A is a diagram illustrating a model of electromagnetic field simulation of Example 6-1. FIG. 38B is a diagram illustrating a model of electromagnetic field simulation of Example 6-2.

FIG. 39A is a diagram illustrating a model of electromagnetic field simulation of Comparative Example 6-1. FIG. 39B is a diagram illustrating a model of electromagnetic field simulation of Comparative Example 6-2.

MODE FOR CARRYING OUT THE INVENTION

Figure 1:
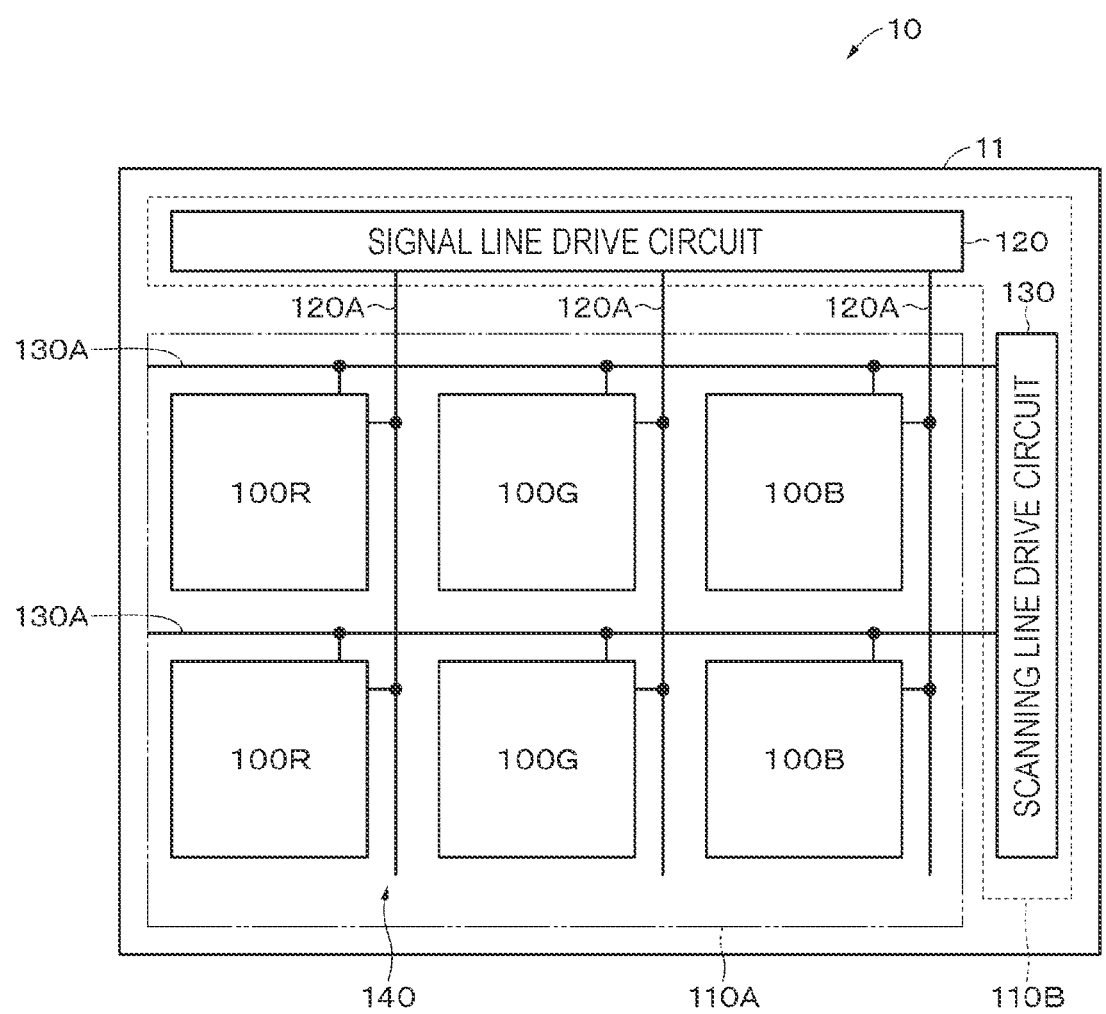
FIG. 1 is a schematic diagram illustrating an example of an overall configuration of a display device according to a first embodiment of the present disclosure.

The embodiments of the present disclosure will be described in the following order. Note that, in all the drawings of the following embodiments, the same or corresponding parts are designated by the same reference numerals.
  1 First Embodiment
    1-1 Configuration of Display Device
    1-2 Method of Manufacturing Display Device
    1-3 Effect
    1-4 Modification
  2 Second Embodiment
    2-1 Configuration of Display Device
    2-2 Method of Manufacturing Display Device
    2-3 Effect
    2-4 Modification
  3 Third Embodiment
    3-1 Configuration of Display Device
    3-2 Method of Manufacturing Display Device
    3-3 Effect
  4 Fourth Embodiment
    4-1 Configuration of Display Device
    4-2 Effect
  5 Examples of Resonator Structure Applied to Embodiments
  6 Application

[1-1 Configuration of Display Device]

FIG. 1 illustrates an example of an overall configuration of an organic electro-luminescence (EL) display device 10 (hereinafter simply referred to as "display device 10") according to a first embodiment of the present disclosure. The display device 10 is suitable for use in various electronic devices, and includes a display region 110A and a peripheral region 110B on peripheral edges of the display region 110A on a substrate 11. A plurality of subpixels 100R, 100G, and 100B is arranged in a matrix in the display region 110A. The subpixel 100R displays red, the subpixel 100G displays green, and the subpixel 100B displays blue. Note that, in the following description, in a case where the subpixels 100R, 100G, and 100B are not particularly distinguished, they are referred to as subpixel(s) 100.

Columns of the subpixels 100R, 100G, and 100B, each column displaying the same color, are repeatedly arranged in a row direction. Therefore, a combination of the three subpixels 100R, 100G, and 100B arranged in the row direction constitutes one pixel. A signal line drive circuit 120 and a scanning line drive circuit 130, which are drivers for displaying images, are provided in the peripheral region 110B.

The signal line drive circuit 120 supplies a signal voltage of a video signal corresponding to luminance information supplied from a signal supply source (not illustrated) to selected pixels via a signal line 120A. The scanning line drive circuit 130 includes a shift register that sequentially shifts (transfers) a start pulse in synchronization with an input clock pulse, and the like. The scanning line drive circuit 130 scans the video signals row by row when writing the video signals to the pixels, and sequentially supplies the scanning signals to scanning lines 130A.

Figure 2:
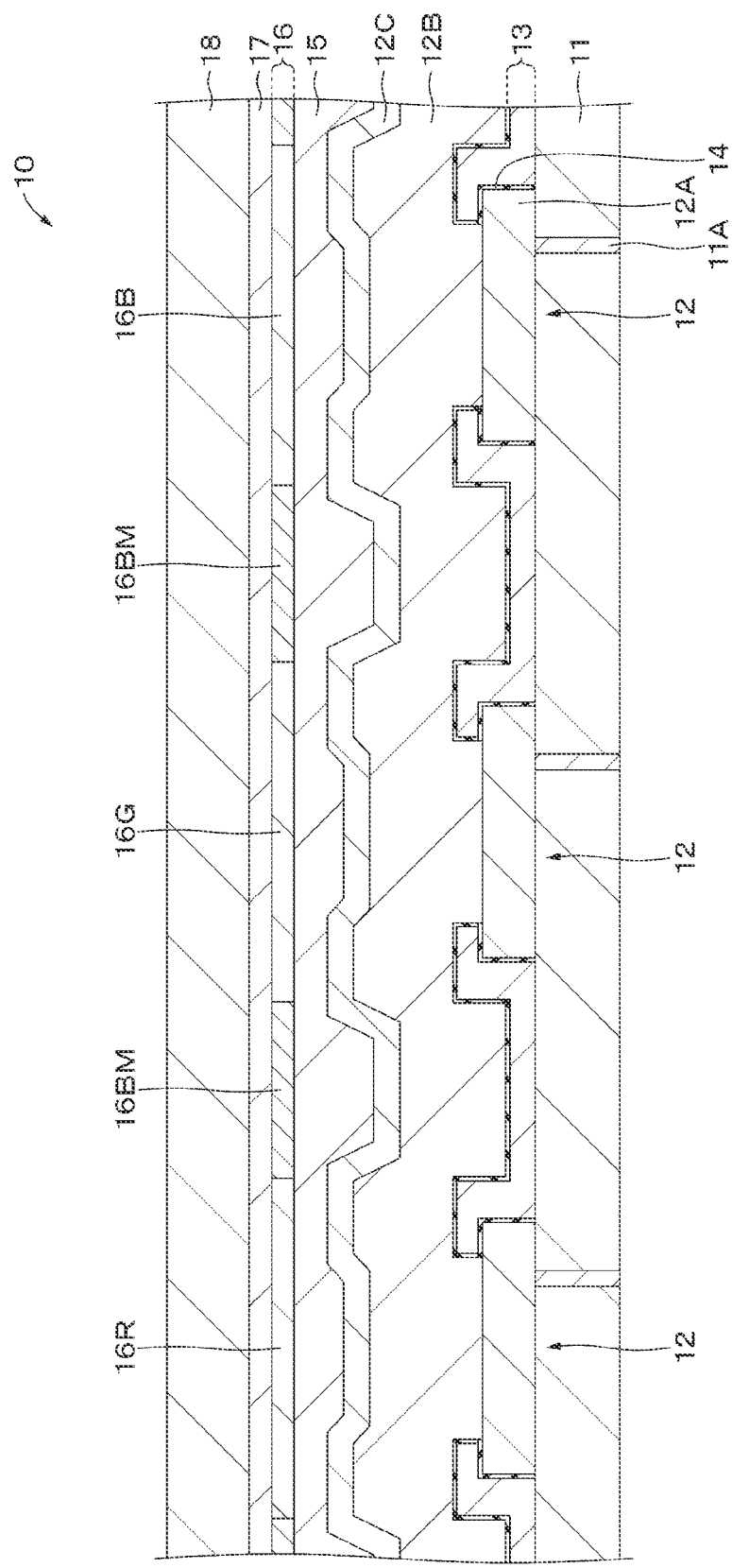
FIG. 2 is a cross-sectional view illustrating an example of a configuration of the display device according to the first embodiment of the present disclosure.
Figure 3:
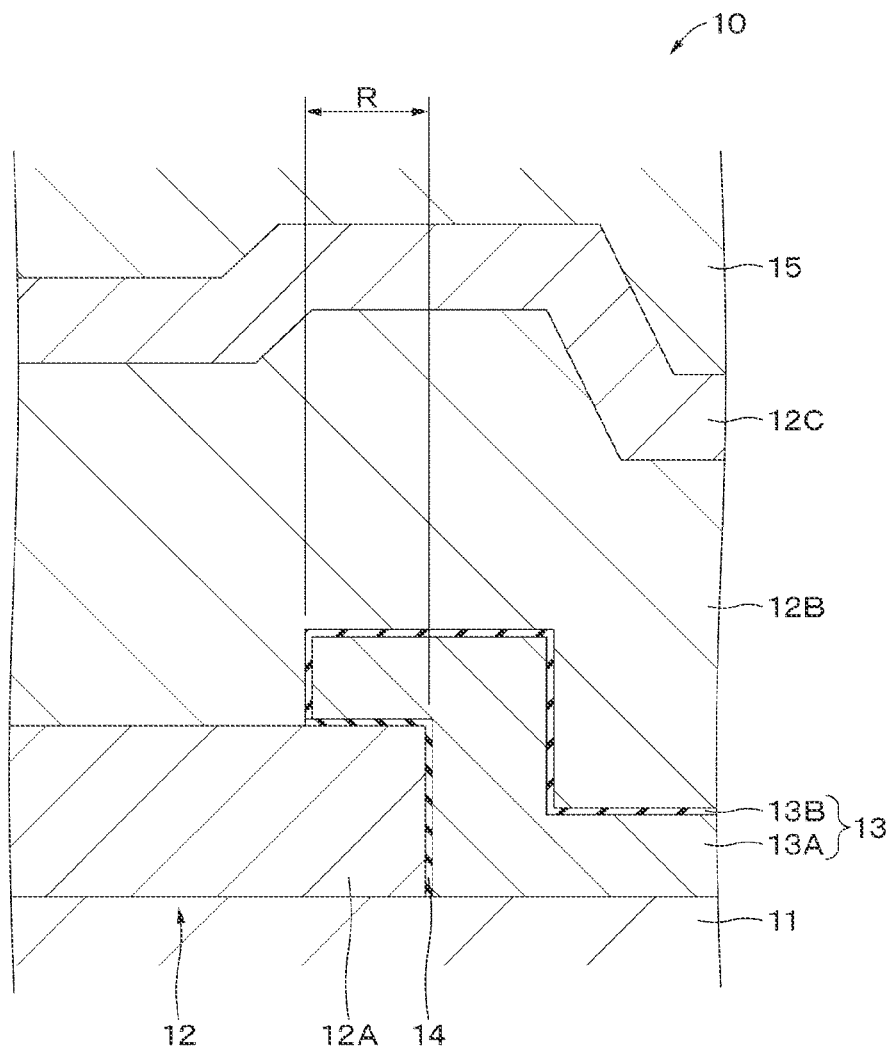
FIG. 3 is an enlarged cross-sectional view illustrating a part of the display device illustrated in FIG. 2.

FIG. 2 is a cross-sectional view illustrating an example of a configuration of the display device 10 according to the first embodiment of the present disclosure. FIG. 3 is an enlarged cross-sectional view illustrating a part of the display device 10 illustrated in FIG. 2. The display device 10 is a top emission-type display device, and includes a substrate (first substrate) 11, a plurality of light emitting elements 12 and an insulating layer 13 provided on one main surface of the substrate 11, a protective layer 15 provided on the plurality of light emitting elements 12, a color filter 16 provided on the protective layer 15, a filled resin layer 17 provided on the color filter 16, and a facing substrate (second substrate) 18 provided on the filled resin layer 17. Note that the facing substrate 18 side is a top side, and the substrate 11 side is a bottom side.

The plurality of light emitting elements 12 is arranged in a matrix on one main surface of the substrate 11. The light emitting element 12 is a white organic EL light emitting element, and as a colorization method in the display device 10, a method using the white organic EL light emitting element and the color filter 16 is used. Note that the colorization method is not limited thereto, and an RGB coloring method or the like may be used. Furthermore, a monochromatic filter may be used.

The light emitting element 12 has a first electrode 12A as an anode, for example, an organic layer 12B, and a second electrode 12C as a cathode, for example, loaded in this order from the substrate 11 side.

The substrate 11 is a support that supports the plurality of light emitting elements 12 arrayed on one main surface. Furthermore, although not illustrated, the substrate 11 may be provided with a drive circuit including a sampling transistor and a drive transistor for controlling drive of the plurality of light emitting elements 12 and a power supply circuit for supplying power to the plurality of light emitting elements 12.

The substrate 11 may be configured using, for example, glass or a resin having low water and oxygen permeability or may be configured using a semiconductor such as a transistor which can be easily formed. Specifically, the substrate 11 may be a glass substrate such as high-strain point glass, soda glass, borosilicate glass, forsterite, lead glass, or quartz glass, a semiconductor substrate such as amorphous silicon or polycrystalline silicon, or a resin substrate such as polymethyl methacrylate, polyvinyl alcohol, polyvinyl phenol, polyether sulfone, polyimide, polycarbonate, polyethylene terephthalate, or polyethylene naphthalate.

A contact plug 11A is provided in the substrate 11. The contact plug 11A electrically connects the first electrode 12A with the drive circuit, the power supply circuit, and the like. Specifically, the contact plug 11A electrically connects the first electrode 12A with the drive circuit, the power supply circuit, and the like (not illustrated) provided inside the substrate 11, and applies power for emitting light of the light emitting element 12 to the first electrode 12A. The contact plug 11A may be formed using, for example, a simple substance or an alloy of metal such as chromium (Cr), gold (Au), platinum (Pt), nickel (Ni), copper (Cu), molybdenum (Mo), tungsten (W), titanium (Ti), tantalum (Ta), aluminum (Al), iron (Fe), or silver (Ag), or a plurality of stacked metal films of the aforementioned metal.

(First Electrode)

The first electrode 12A is electrically separated for each of the subpixels 100R, 100G, and 100B. The first electrode 12A also functions as a reflective layer, and it is favorable to configure the first electrode 12A using a metal layer having the reflectance that is as high as possible and a large work function in order to increase luminous efficiency. As the configuration material of the metal layer, for example, at least one type of the simple substances or alloys of metal elements such as chromium (Cr), gold (Au), platinum (Pt), nickel (Ni), copper (Cu), molybdenum (Mo), titanium (Ti), tantalum (Ta), aluminum (Al), magnesium (Mg), iron (Fe), tungsten (W), and silver (Ag) can be used. Specific examples of the alloys include an AlNi alloy and an AlCu alloy. The first electrode 12A may be configured using a stacked film of a plurality of metal layers containing at least one type of the above-described simple substances or alloys of metal elements.

(Second Electrode)

The second electrode 12C is provided as an electrode common to all the subpixels 100R, 100G, and 100B in the display region 110A. The second electrode 12C is a transparent electrode having transparency to light generated in the organic layer 12B. Here, the transparent electrode is assumed to include a semi-transmissive reflective film. The second electrode 12C is configured using, for example, metal or a metal oxide. As the metal, for example, at least one type of the simple substances and alloys of metal elements such as aluminum (Al), magnesium (Mg), calcium (Ca), and sodium (Na) can be used. As the alloy, for example, an alloy (MgAg alloy) of magnesium (Mg) and silver (Ag) or an alloy (AlLi alloy) of aluminum (Al) and lithium (Li) is suitable. As the metal oxide, for example, a mixture (ITO) of an indium oxide and a tin oxide, a mixture (IZO) of an indium oxide and a zinc oxide, or a zinc oxide (ZnO) can be used.

(Insulating Layer)

The insulating layer 13 is for electrically separating the first electrode 12A for each of the subpixels 100R, 100G, and 100B. The insulating layer 13 is provided between the first electrodes 12A and covers a peripheral edge portion of the first electrode 12A. More specifically, the insulating layer 13 has an opening in a portion corresponding to each first electrode 12A, and covers a peripheral edge portion of an upper surface (a surface facing the second electrode 12C) of the first electrode 12A to a side surface (end face) of the first electrode 12A. A first interface layer 14 is provided at an interface between the first electrode 12A and the insulating layer 13.

The insulating layer 13 includes a bulk layer 13A serving as a main body of the insulating layer and a second interface layer 13B provided at an interface between the bulk layer 13A and the organic layer 12B.

(Bulk Layer)

The bulk layer 13A is favorably positively charged. Since the bulk layer 13A is positively charged, a hole current leak generated between adjacent light emitting elements 12 can be suppressed.

The bulk layer 13A contains a silicon compound as a main component. Here, the main component means a material component contained in the bulk layer 13A in the largest proportion. The silicon compound includes, for example, at least one type selected from the group consisting of a silicon nitride ($SiN_x$), a silicon oxide ($SiO_x$), a silicon oxynitride ($SiO_xN_y$), and a silicon carbide ($SiC_x$). Among these materials, at least one type of the silicon nitride or the silicon oxynitride is favorably used. This is because the bulk layer 13A tends to have a positive fixed charge by containing at least one type of the silicon nitride or the silicon oxynitride.

The bulk layer 13A may further contain hydrogen (H). For example, in a case where the bulk layer 13A is formed by bringing a Si-containing gas (for example, $SiH_4$) to react with an N-containing gas (for example, $NH_2$ or $NH_3$) by chemical vapor deposition (CVD) or the like, the bulk layer 13A usually contains hydrogen included in the material gas.

In a case where the bulk layer 13A contains the silicon nitride as a main component of the silicon compound, hydrogen may be bonded to silicon and nitrogen. In this case, a peak intensity ratio ($I_{N-H}/I_{Si-H}$) of peak intensity $I_{N-H}$ derived from an N—H bond and peak intensity $I_{Si-H}$ derived from an Si—H bond, which is obtained by analyzing the bulk layer 13A by a Fourier transform infrared spectrometer (FT-IR), is favorably less than 4, more favorably 3 or less. When the peak intensity ratio ($I_{N-H}/I_{Si-H}$) is less than 4, a dipole formed at the interface with the first interface layer 14 can be increased. Therefore, a fixed charge of the insulating layer 13 can be increased, and the insulating layer 13 can be effectively positively charged. Therefore, the hole current leak generated between adjacent light emitting elements 12 can be further suppressed.

The above peak intensity ratio ($I_{N-H}/I_{Si-H}$) is obtained as follows. First, the facing substrate 18 is peeled off from the display device 10, and then each layer stacked on the bulk layer 13A is peeled off to expose the surface of the bulk layer 13A. Next, the bulk layer 13A is analyzed by the FT-IR to obtain an FT-IR spectrum. Then, the above peak intensity ratio ($I_{N-H}/I_{Si-H}$) is obtained using the acquired FT-IR spectrum.

(Second Interface Layer)

The second interface layer 13B is for suppressing the hole current leak and an electron current leak generated between adjacent light emitting elements 12. The second interface layer 13B has a lattice strain, and therefore exhibits the above-described function to suppress the hole current leak and the electron current leak. Here, the "lattice strain" is assumed to include a lattice strain of minute crystal grains contained in the second interface layer 13B. In the present specification, the term "hole current leak" refers to a phenomenon in which holes injected from the first electrode 12A, which is the anode, flow through the interface between the insulating layer 13 and the organic layer 12B into the adjacent first electrode 12A. Further, the term "electron current leak" refers to a phenomenon in which electrons injected from the second electrode 12C, which is the cathode, flow through the organic layer 12B into the adjacent first electrode 12A, or electrons formed in a charge generation layer (for example, a hole injection layer) included in the organic layer 12B flow through the organic layer 12B.

The second interface layer 13B has a different composition from the bulk layer 13A. Specifically, the second interface layer 13B contains a silicon oxide. The second interface layer 13B may further contain nitrogen (N). In this case, nitrogen may form a bond with silicon in the second interface layer 13B and may be present as a silicon nitride or a silicon oxynitride. Since the second interface layer 13B contains nitrogen, the second interface layer 13B is likely to generate the lattice strain, and the above-described function to suppress the hole current leak and the electron current leak can be further improved.

The second interface layer 13B favorably cover an edge (end face) of the bulk layer 13A together with a main surface of the bulk layer 13A from the viewpoint of improving the function to suppress the hole current leak and the electron current leak. Furthermore, the second interface layer 13B favorably has a substantially uniform thickness in the entire layer from the viewpoint of improving the function to suppress the hole current leak and the electron current leak. An upper limit value of the average thickness of the second interface layer 13B is favorably 10 nm or less. When the average thickness of the second interface layer 13B is 10 nm or less, relaxation of the lattice strain of the second interface layer 13B can be suppressed. By suppressing the relaxation of the lattice strain in this way, deterioration of the function to suppress the hole current leak and the electron current leak can be suppressed. A lower limit value of the average thickness of the second interface layer 13B is favorably 2 nm or more. When the average thickness of the second interface layer 13B is 2 nm or more, the above-described function to suppress the hole current leak and the electron current leak can be effectively exhibited. Note that the average thickness of the second interface layer 13B is similarly obtained to the average thickness of the first interface layer 14 to be described below.

In a case where the bulk layer 13A contains the silicon nitride, a ratio of the silicon oxide to a total amount of the silicon oxide and the silicon nitride in the second interface layer 13B is favorably 80% or more. When the above-described ratio is 80% or more, the lattice strain can be effectively generated in the second interface layer 13B due to a difference in composition between the bulk layer 13A and the second interface layer 13B. Therefore, the function to suppress the hole current leak and the electron current leak can be further improved.

The ratio of the silicon oxide to the total amount of the silicon oxide and the silicon nitride is determined as follows. First, a cross section of the display device 10 is cut out by an FIB method or the like to prepare a flake. Next, the cross section of the flake is analyzed by an electron energy loss spectroscopy (EELS) to determine the silicon oxide and silicon nitride content in the second interface layer 13B. Then, using the content, the ratio of the silicon oxide to the total amount of the silicon oxide and the silicon nitride is calculated.

(First Interface Layer)

The first interface layer 14 is for suppressing exchange of elements constituting films of the first electrode 12A and the insulating layer 13, for example, exchange of oxygen, and suppressing deterioration of characteristics of the insulating layer 13. Specifically, for example, the first interface layer 14 is for suppressing a decrease in the fixed charge of the bulk layer 13A and maintaining the positively charged state of the insulating layer 13 (specifically, the bulk layer 13A).

The first interface layer 14 has a different composition from that of the bulk layer 13A. Specifically, the first interface layer 14 contains a silicon oxide. An average thickness of the first interface layer 14 is favorably from 1 to 15 nm, exclusive of 15 nm, more favorably from 1 to 13 nm, both inclusive, even more favorably from 1 to 9 nm, both inclusive, particularly favorably from 1 to 7 nm, both inclusive, or most favorably from 1 to 5 nm, both inclusive, from the viewpoint of suppressing the hole current leak between adjacent light emitting elements 12.

The average thickness of the first interface layer 14 is obtained as follows. First, a cross section of the display device 10 is cut out by cryo-focused ion beam (FIB) processing or the like to produce a flake. Next, the prepared flake is observed with a transmission electron microscope (TEM), and one cross-sectional TEM image is acquired. At this time, an accelerating voltage is set to 80 kV. Next, in the acquired one cross-sectional TEM image, the thickness of a portion (the portion of the region R in FIG. 3) of the first interface layer 14, the portion covering the first electrode 12A, is measured at ten points or more. At this time, each measurement position shall be randomly selected from the portion covering the first electrode 12A. Then, the film thicknesses of the first interface layer 14 measured at ten points or more are simply averaged (arithmetic mean) to obtain the average thickness of the first interface layer 14.

(Organic Layer)

Figure 4:
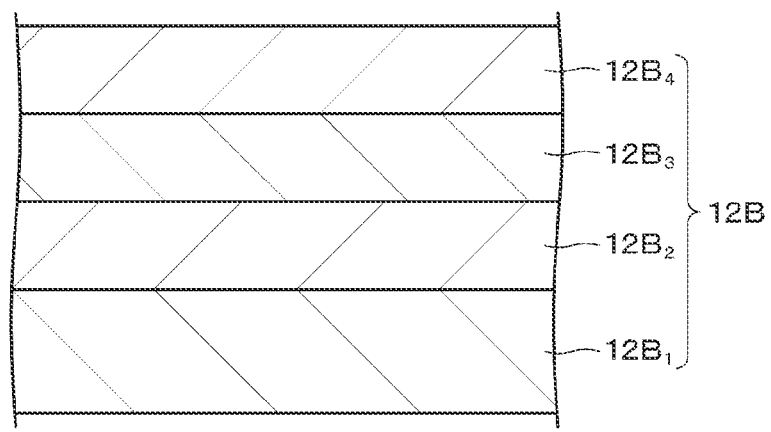
FIG. 4 is an enlarged cross-sectional view illustrating an example of a configuration of an organic layer illustrated in FIG. 2.

The organic layer 12B is provided as an organic layer common to all the subpixels 100R, 100G, and 100B in the display region 110A. FIG. 4 is an enlarged view illustrating the organic layer 12B illustrated in FIG. 2. The organic layer 12B has a configuration in which a hole injection layer $12B_1$, a hole transport layer $12B_2$, a light emitting layer $12B_3$, and an electron transport layer $12B_4$ are stacked in this order from the side of the first electrode 12A. Note that the configuration of the organic layer 12B is not limited to this configuration, and layers other than the light emitting layer $12B_3$ are provided as needed.

The hole injection layer $12B_1$ is a buffer layer for increasing hole injection efficiency into the light emitting layer $12B_3$ and for suppressing a leak. The hole transport layer $12B_2$ is for increasing hole transport efficiency to the light emitting layer $12B_3$. The light emitting layer $12B_3$ is applied an electric field to recombine electrics and holes to generate light. The electron transport layer $12B_4$ is for increasing electron transport efficiency to the light emitting layer $12B_3$. An electron injection layer (not illustrated) may be provided between the electron transport layer $12B_4$ and the second electrode 12C. This electron injection layer is for increasing electron injection efficiency.

(Protective Layer)

The protective layer 15 is for blocking the light emitting element 12 from outside air and suppressing infiltration of water from an external environment into the light emitting element 12. Furthermore, in a case where the second electrode 12C is configured using a metal layer, the protective layer 15 also has a function to suppress oxidation of the metal layer.

The protective layer 15 is configured using, for example, an inorganic material having low hygroscopicity, such as a silicon oxide ($SiO_x$), a silicon nitride ($SiN_x$), a silicon oxide nitride ($SiN_xO_y$), a titanium oxide ($TiO_x$), or an aluminum oxide ($Al_xO_y$). Furthermore, the protective layer 15 may have a single-layer structure, but may have a multi-layer structure in a case of increasing the thickness. This is to relieve an internal stress in the protective layer 15. Furthermore, the protective layer 15 may be configured using a polymer resin. In this case, as the polymer resin, at least one type of resin material of a thermosetting resin or an ultraviolet curable resin can be used.

(Color Filter)

The color filter 16 is a so-called on-chip color filter (OCCF). The color filter 16 includes, for example, a red filter 16R, a green filter 16G, and a blue filter 16B. The red filter 16R, the green filter 16G, and the blue filter 16B are provided facing the light emitting element 12 of the subpixel 100R, the light emitting element 12 of the subpixel 100G, and the light emitting element 12 of the subpixel 100B, respectively. As a result, the white light emitted from the light emitting elements 12 in the subpixel 100R, the subpixel 100G, and the subpixel 100B is transmitted through the above-described red filter 16R, green filter 16G, and blue filter 16B, respectively, so that red light, green light, and blue light are emitted from a display surface, respectively. Furthermore, a light shielding layer 16BM is provided between the color filters of the colors, that is, in a region between the subpixels 100.

(Filled Resin Layer)

The filled resin layer 17 is filled in a space between the protective layer 15 and the color filter 16. The filled resin layer 17 has a function as an adhesive layer for causing the color filter 16 to adhere with the facing substrate 18. The filled resin layer 17 is configured using at least one resin material of a thermosetting resin or an ultraviolet curable resin.

(Facing Substrate)

The facing substrate 18 is provided such that one main surface of the facing substrate 18 and one main surface of the substrate 11 provided with the plurality of light emitting elements 12 face each other. The facing substrate 18 seals the light emitting elements 12, the color filter 16, and the like together with the filled resin layer 17. The facing substrate 18 is configured using a material such as glass that is transparent to each color light emitted from the color filter 16.

[1-2 Method of Manufacturing Display Device]

Hereinafter, a method of manufacturing the display device 10 having the above configuration will be described.

First, a drive circuit and the like are formed on one main surface of the substrate 11, using, for example, a thin film forming technique, a photolithography technique, and an etching technique. Next, for example, a metal layer is formed on the drive circuit and the like by a sputtering method, and then the metal layer is patterned by using, for example, the photolithography technique and the etching technique, so that the plurality of first electrodes 12A each separated for each light emitting element 12 (that is, for each subpixel 100) is formed.

Next, the first interface layer 14 is formed on one main surface of the substrate 11 on which the plurality of first electrodes 12A has been formed by, for example, the CVD method, and then the bulk layer 13A is formed by, for example, the CVD method. The first interface layer 14 and the bulk layer 13A are then patterned using the photolithography technique and the etching technique. Then, the surface of the bulk layer 13A is plasma-treated to form the second interface layer 13B, or the second interface layer 13B is formed on the bulk layer 13A by an atomic layer deposition (ALD) method. As a result, the insulating layer 13 is obtained. As the plasma treatment, for example, oxygen plasma treatment or nitrogen plasma treatment can be used. Note that these plasma treatments may be used alone or in combination.

In the case of forming the second interface layer 13B on the bulk layer 13A by the ALD method, the second interface layer 13B is also formed on the first electrode 12A, but since adhesion efficiency of a precursor is different between the surface of the first electrode 12A containing the metal material and the surface of the bulk layer 13A containing the silicon compound such as the silicon nitride, the second interface layer 13B is hardly formed on the first electrode 12A. Therefore, the second interface layer 13B formed on the first electrode 12A does not substantially affect the driving of the light emitting element 12. However, for the purpose of a higher quality structure, the second interface layer 13B formed on the first electrode 12A may be removed by using a photolithography technique and an etching technique.

Next, for example, the organic layer 12B is formed by stacking the hole injection layer $12B_1$, the hole transport layer $12B_2$, the light emitting layer $12B_3$, and the electron transport layer $12B_4$ on the first electrode 12A and the insulating layer 13 in this order by a vapor deposition method. Next, the second electrode 12C is formed on the organic layer 12B by, for example, the sputtering method. As a result, the plurality of light emitting elements 12 is formed on one main surface of the substrate 11.

Next, the protective layer 15 is formed on the second electrode 12C by, for example, the vapor deposition method or the CVD method, and then the color filter 16 is formed on the protective layer 15. Note that, to flatten a step of the protective layer 15 and a step due to a difference in film thickness of the color filter 16 itself, a flattening layer may be formed on an upper side, a lower side, or both the upper and lower sides of the color filter 16. Next, for example, the color filter 16 is covered with the filled resin layer 17 by a one drop fill (ODF) method, and then the facing substrate 18 is placed on the filled resin layer 17. Next, for example, the substrate 11 and the facing substrate 18 are pasted together via the filled resin layer 17 by applying heat to the filled resin layer 17 or irradiating the filled resin layer 17 with ultraviolet rays to cure the filled resin layer 17. As a result, the display device 10 is sealed. Note that, in a case where the filled resin layer 17 contains both a thermosetting resin and an ultraviolet curable resin, the filled resin layer 17 is irradiated with ultraviolet rays to be temporarily cured, and then heat is applied to the filled resin layer 17 to finish curing.

[1-3 Effect]

As described above, the display device 10 according to the first embodiment includes the plurality of first electrodes 12A each provided for each subpixel 100, the insulating layer 13 containing a silicon compound, provided between the first electrodes 12A, and covering the peripheral edge portion of the first electrode 12A, the first interface layer 14 containing a silicon oxide and provided at the interface between the first electrode 12A and the insulating layer 13, the organic layer 12B including the light emitting layer $12B_3$, and provided on the first electrodes 12A and the insulating layer 13, commonly to all the pixels, and the second electrode 12C provided on the organic layer 12B. Furthermore, the insulating layer 13 includes the bulk layer 13A containing a silicon compound as a main component, and the second interface layer 13B containing a silicon oxide and provided at the interface between the bulk layer 13A and the organic layer 12B. Thereby, the hole current and the electron current transmitted through the interface between the organic layer 12B and the insulating layer 13 can be suppressed. Therefore, a decrease in the current luminous efficiency and an abnormality in the emitted color of the display device 10 can be suppressed.

[1-4 Modification]

(Modification 1)

Figure 5:
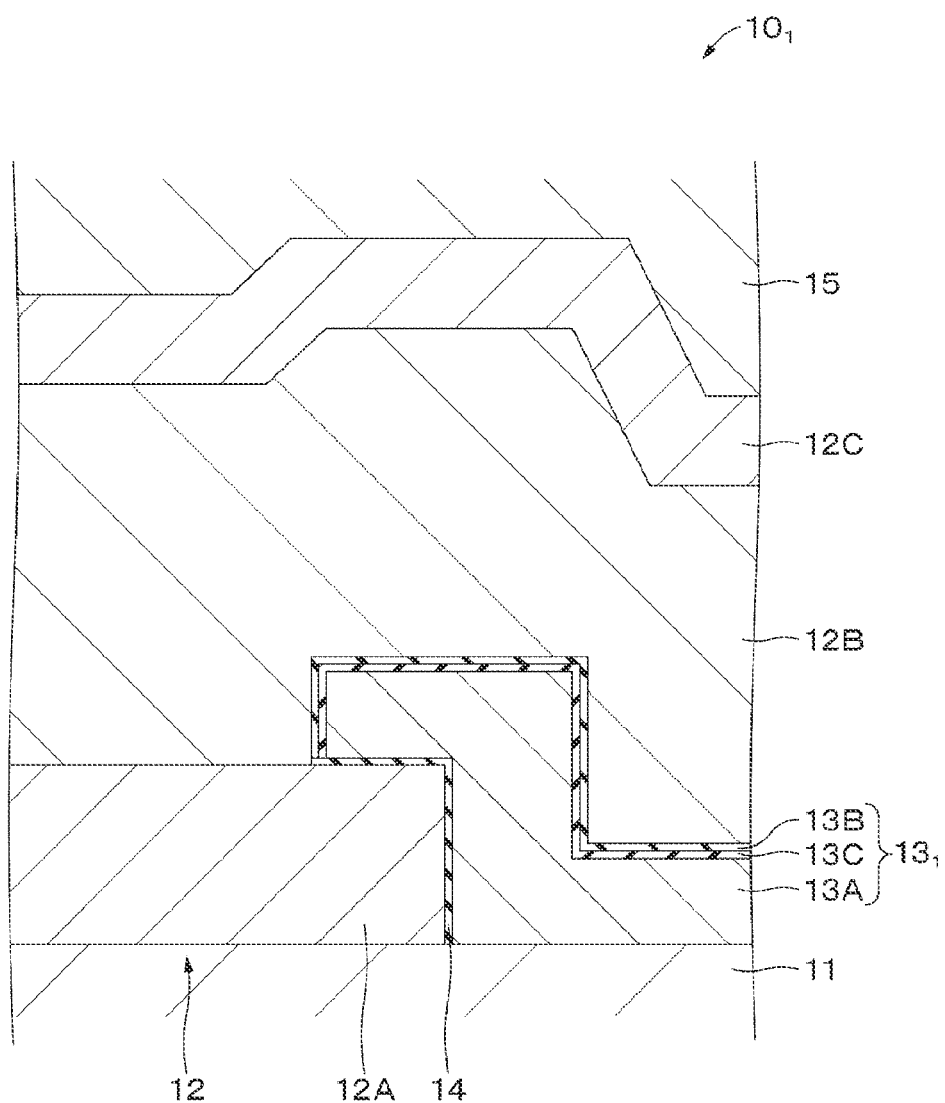
FIG. 5 is a cross-sectional view illustrating an example of a configuration of a display device according to a modification 1 of the first embodiment of the present disclosure.

FIG. 5 illustrates an example of a configuration of a display device $10_1$ according to a modification 1 of the first embodiment of the present disclosure. The display device $10_1$ is different from the display device 10 according to the first embodiment in including an insulating layer 131 instead of the insulating layer 13. The insulating layer $13_1$ includes the bulk layer 13A, the second interface layer 13B, and an intermediate layer 13C provided between the bulk layer 13A and the second interface layer 13B.

The intermediate layer 13C is a layer for facilitating formation of the fixed charge in the bulk layer 13A. The intermediate layer 13C favorably contains a silicon fluoride (SiFx) to have a charge bias. Note that whether or not the intermediate layer 13C contains a silicon fluoride can be confirmed by analyzing the interface between the bulk layer 13A and the second interface layer 13B by an X-ray photoelectron spectroscopy (XPS), for example.

(Modification 2)

Figure 6:
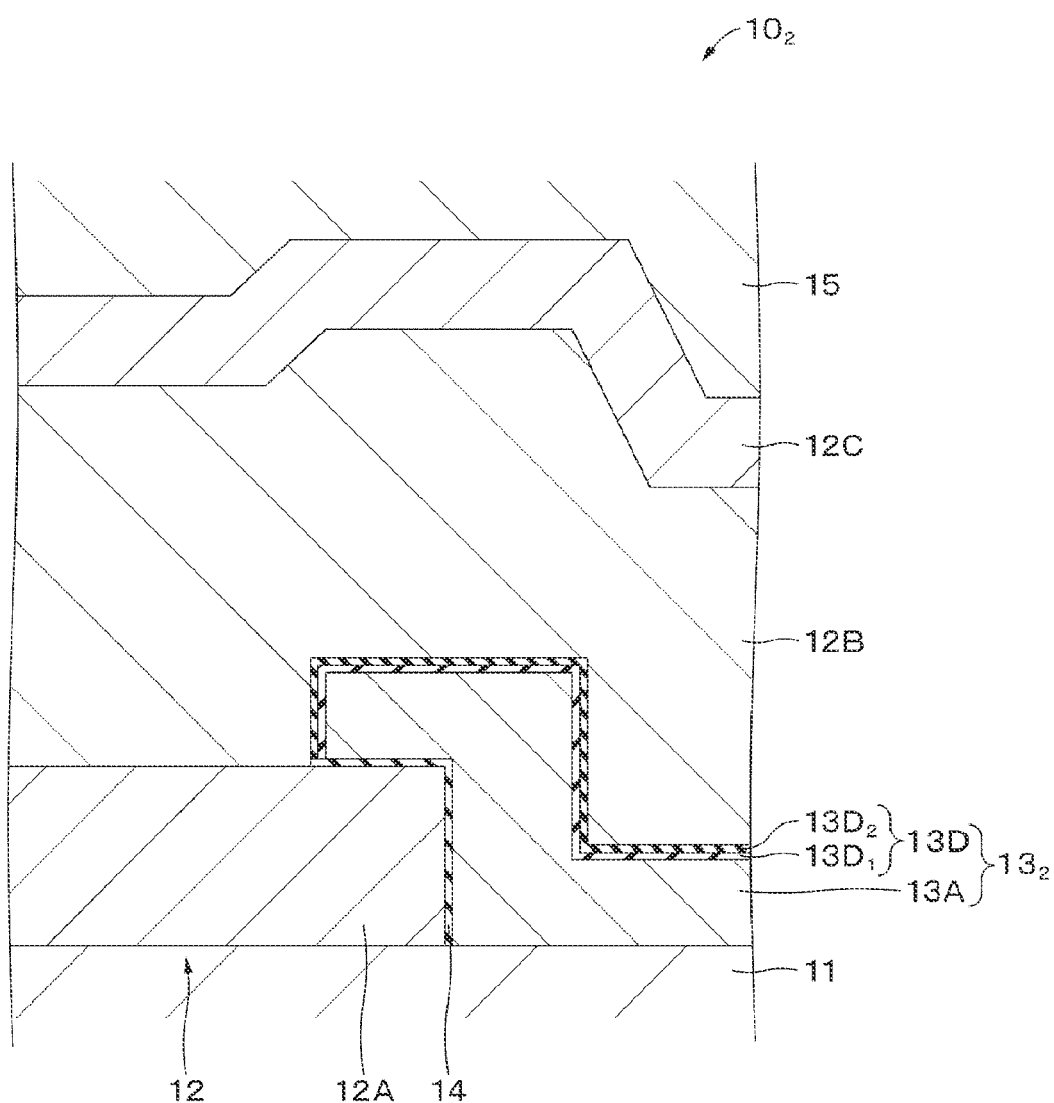
FIG. 6 is a cross-sectional view illustrating an example of a configuration of a display device according to a modification 2 of the first embodiment of the present disclosure.

FIG. 6 illustrates an example of a configuration of a display device $10_2$ according to a modification 2 of the first embodiment of the present disclosure. The display device $10_2$ is different from the display device 10 according to the first embodiment in including an insulating layer $13_2$ instead of the insulating layer 13. The insulating layer $13_2$ includes the bulk layer 13A and a second interface layer 13D having a two-layer structure provided on the bulk layer 13A.

The second interface layer 13D includes a first layer $13D_1$ and a second layer $13D_2$ provided on the first layer $13D_1$. The first layer $13D_1$ contains, for example, a silicon oxide. The second layer $13D_2$ contains at least one type of a silicon oxynitride or a silicon nitride, for example. Note that the stacking order of the first layer $13D_1$ and the second layer $13D_2$ may be reversed.

As described above, since the display device $10_2$ includes the second interface layer 13D having the two-layer structure, the lattice strain of the second interface layer 13D can be made larger than the lattice strain of the second interface layer 13B having the single-layer structure in the first embodiment. Therefore, the function to suppress the hole current leak and the electron current leak can be further improved.

In the above example, the case where the second interface layer 13D has the two-layer structure has been described, but the second interface layer 13D may have a stacked structure of two or more layers. In this case, at least one of the two or more layers may contain a silicon oxide. Furthermore, at least one of the two or more layers may contain at least one type of a silicon oxynitride or a silicon nitride. Even in the case of adopting the stacked structure of two or more layers, the function to suppress the hole current leak and the electron current leak can be further improved.

(Modification 3)

Figure 7:
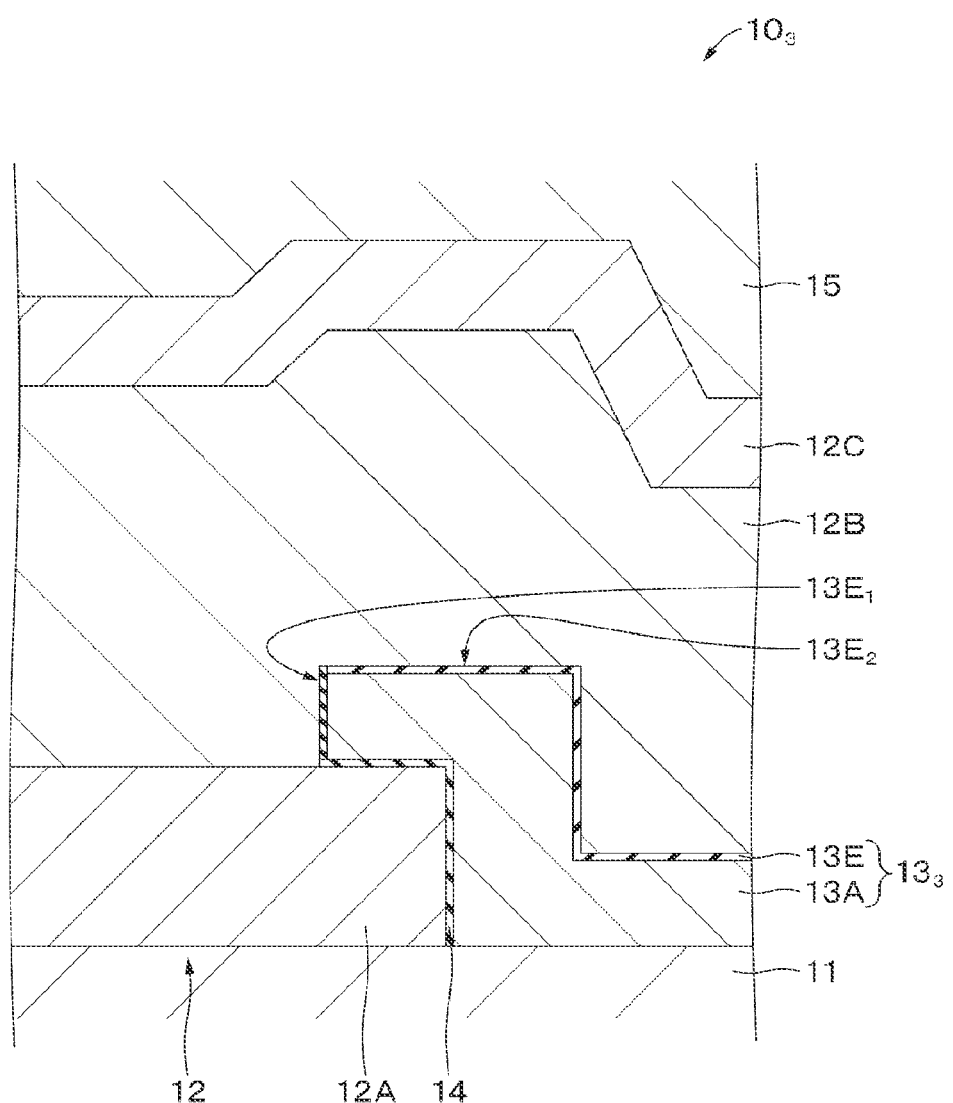
FIG. 7 is a cross-sectional view illustrating an example of a configuration of a display device according to a modification 3 of the first embodiment of the present disclosure.

FIG. 7 illustrates an example of a configuration of a display device $10_3$ according to a modification 3 of the first embodiment of the present disclosure. The display device $10_3$ is different from the display device 10 according to the first embodiment in including an insulating layer $13_3$ instead of the insulating layer 13.

The insulating layer $13_3$ includes the bulk layer 13A and a second interface layer 13E provided on the bulk layer 13A. A side wall portion $13E_1$ of the second interface layer 13E, the side wall portion $13E_1$ covering the edge (end face) of the bulk layer 13A, has a composition different from a main surface portion $13E_2$ of the second interface layer 13E, the main surface portion $13E_2$ covering the main surface of the bulk layer 13A. In the present specification, the term "different composition" means that configuration compositions are different, or the configuration compositions are the same but the proportions of the configuration compositions are different.

The side wall portion $13E_1$ and the main surface portion $13E_2$ contain, for example, a silicon oxide or a silicon oxynitride having a different composition. The side wall portion $13E_1$ favorably has a positive fixed charge and is favorably positively charged. Flow of the holes into the upper surface of the insulating layer $13_3$ through the edge of the insulating layer $13_3$ from the first electrode 12A can be suppressed. Therefore, the hole current leak can be further suppressed.

The configuration materials of the side wall portion $13E_1$ for giving the positive fixed charge include, for example, at least one type selected from the group consisting of a germanium oxide ($GeO_2$), an yttrium oxide ($Y_2O_3$), a lutetium oxide ($Lu_2O_3$), a lanthanum oxide ($La_2O_3$), and a strontium oxide (SrO).

The second interface layer 13E having the above-described configuration is formed, for example, as follows. After the first interface layer 14 is formed, an insulating layer containing the silicon compound as a main component is formed by a plasma CVD method. At this time, a flow ratio of a gas is adjusted and a silicon oxide film is formed on the surface portion of the insulating layer. Subsequently, after the insulating layer is patterned using the photolithography technique and the etching technique, a silicon oxide film is formed only on the side wall portion by, for example, oblique deposition.

(Modification 4)

Figure 8:
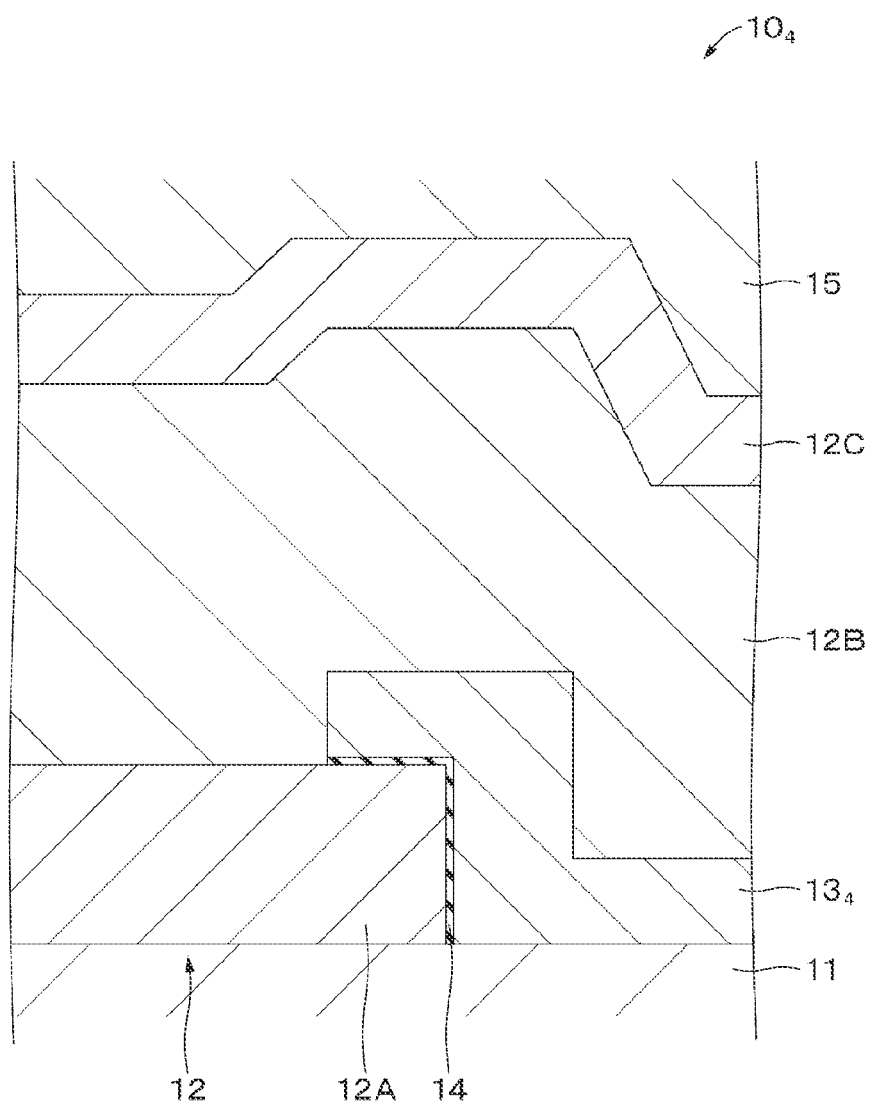
FIG. 8 is a cross-sectional view illustrating an example of a configuration of a display device according to a modification 4 of the first embodiment of the present disclosure.

FIG. 8 illustrates an example of a configuration of a display device 104 according to a modification 4 of the first embodiment of the present disclosure. The display device 104 is different from the display device 10 according to the first embodiment in including a single-layer insulating layer $13_4$ instead of the insulating layer 13 including the bulk layer 13A and the second interface layer 13B.

The insulating layer $13_4$ contains a silicon compound as a main component in the bulk, and contains a silicon oxide in a surface portion on the side of the organic layer 12B. Here, the "main component" means a material component contained in the insulating layer $13_4$ in the largest proportion. The silicon compound is similar to the silicon compound contained in the bulk layer 13A in the first embodiment.

The composition of the insulating layer $13_4$ continuously changes from the bulk toward the outermost surface on the side of the organic layer 12B, for example. Specifically, the oxygen concentration of the insulating layer $13_4$ (more specifically, the concentration of the silicon oxide in the insulating layer 134) gradually increases from the bulk toward the outermost surface on the side of the organic layer 12B. The composition of the insulating layer $13_4$ may continuously change from the bulk toward a surface on an edge side. In this case, the function to suppress the hole current leak and the electron current leak can be further improved.

The silicon oxide is favorably contained within a range from the outermost surface on the side of the organic layer 12B to the depth of 10 nm or less of the insulating layer $13_4$. This is because the lattice strain can be increased in the surface portion on the side of the organic layer 12B by changing the concentration of the silicon oxide in a narrow range.

The insulating layer $13_4$ may further contain nitrogen in the surface portion on the side of the organic layer 12B. In this case, nitrogen may form a bond with silicon in the surface portion on the side of the organic layer 12B, and may be present as a silicon nitride or a silicon oxynitride. Since the surface portion on the side of the organic layer 12B further contains nitrogen, the surface portion on the side of the organic layer 12B is likely to generate the lattice strain, and the function to suppress the hole current leak and the electron current leak can be further improved.

In a case where the insulating layer 134 contains the silicon nitride in the bulk as a main component, the ratio of the silicon oxide to the total amount of the silicon oxide and the silicon nitride in the surface portion on the side of the organic layer 12B is favorably 80% or more. When the above-described ratio is 80% or more, the lattice strain can be effectively generated in the surface portion on the side of the organic layer 12B due to a difference in composition between the bulk of the insulating layer 13 and the surface portion on the side of the organic layer 12B. Therefore, the function to suppress the hole current leak and the electron current leak can be further improved. The above-described ratio in the surface portion on the side of the organic layer 12B is similarly obtained to the ratio of the silicon oxide to the total amount of the silicon oxide and the silicon nitride in the second interface layer 13B of the first embodiment.

Note that it is more favorable to adopt the configuration of having the second interface layer 13B provided on the surface of the bulk layer 13A as in the first embodiment than the configuration of continuously changing the composition of the insulating layer 134 as described above. This is because providing the second interface layer 13B facilitates the lattice strain on the surface on the side of the organic layer 12B, of the insulating layer 13, and can further improve the leak suppressing effect.

(Modification 5)

Figure 9:
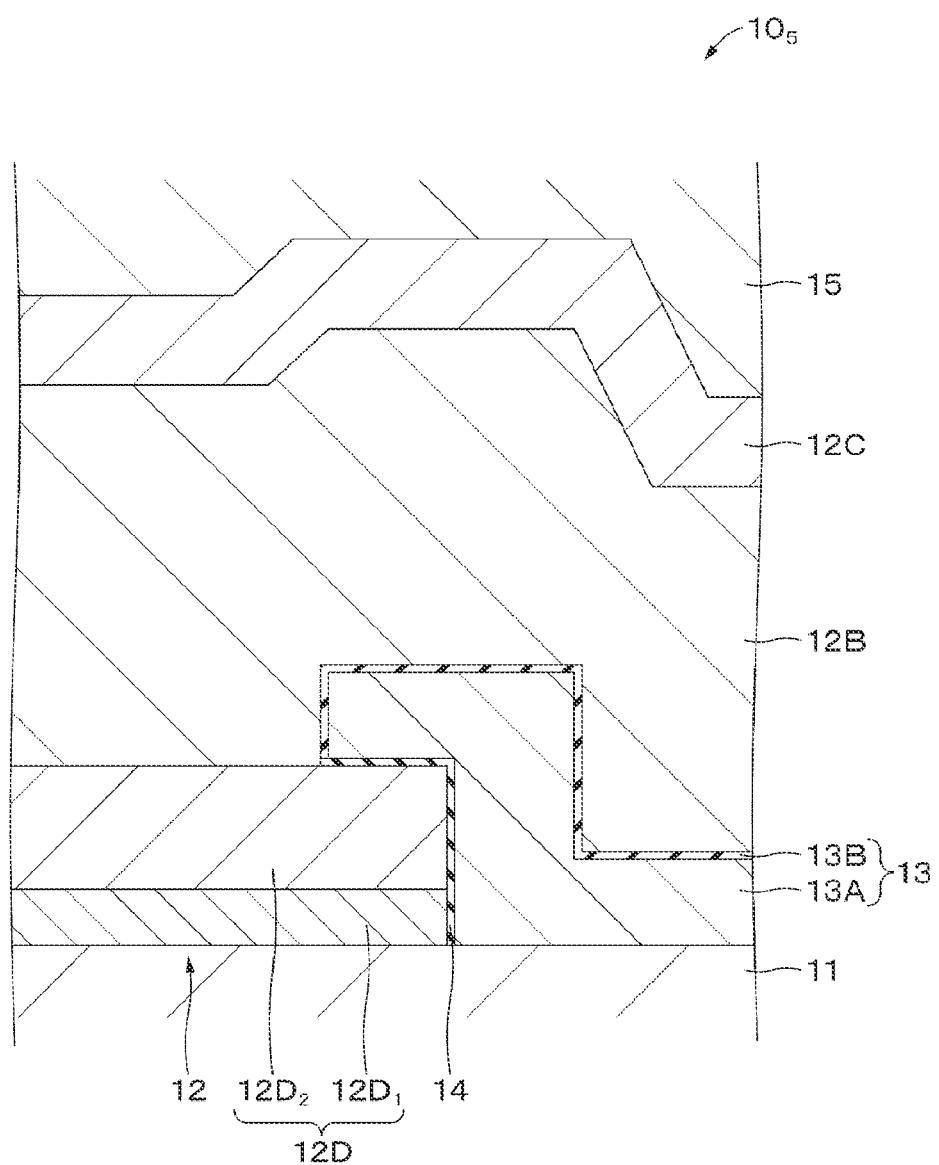
FIG. 9 is a cross-sectional view illustrating an example of a configuration of a display device according to a modification 5 of the first embodiment of the present disclosure.

FIG. 9 illustrates an example of a configuration of a display device 105 according to a modification 5 of the first embodiment of the present disclosure. The display device 10s is different from the display device 10 according to the first embodiment in including a first electrode 12D having a stacked structure instead of the first electrode 12A having a single-layer structure.

The first electrode 12D includes a metal layer $12D_1$ and an oxide conductive layer $12D_2$ having transparency and provided on the metal layer $12D_1$. The metal layer $12D_1$ is similar to the metal layer used as the first electrode 12A in the first embodiment. The oxide conductive layer $12D_2$ favorably includes at least one type of metal oxide selected from the group consisting of a mixture (ITO) of an indium oxide and a tin oxide, a mixture (IZO) of an indium oxide and a zinc oxide, and a mixture (IGZO) of an indium oxide, a gallium oxide, and a zinc oxide. This is because these metal oxides have a high work function, so a hole injection property can be improved.

The first interface layer 14 is particularly effective in the display device 105 including the first electrode 12D having the above configuration. When the oxide conductive layer $12D_2$ and the insulating layer 13 (specifically, the bulk layer 13A) are adjacent to each other, exchange of elements (for example, oxygen) constituting these layers is particularly likely to occur. For this reason, in a case where the first interface layer 14 is provided, the effect of suppressing the exchange of elements constituting films between the oxide conductive layer $12D_2$ and the insulating layer 13 is remarkably exhibited.

2 Second Embodiment

[2-1 Configuration of Display Device]

Figure 10:
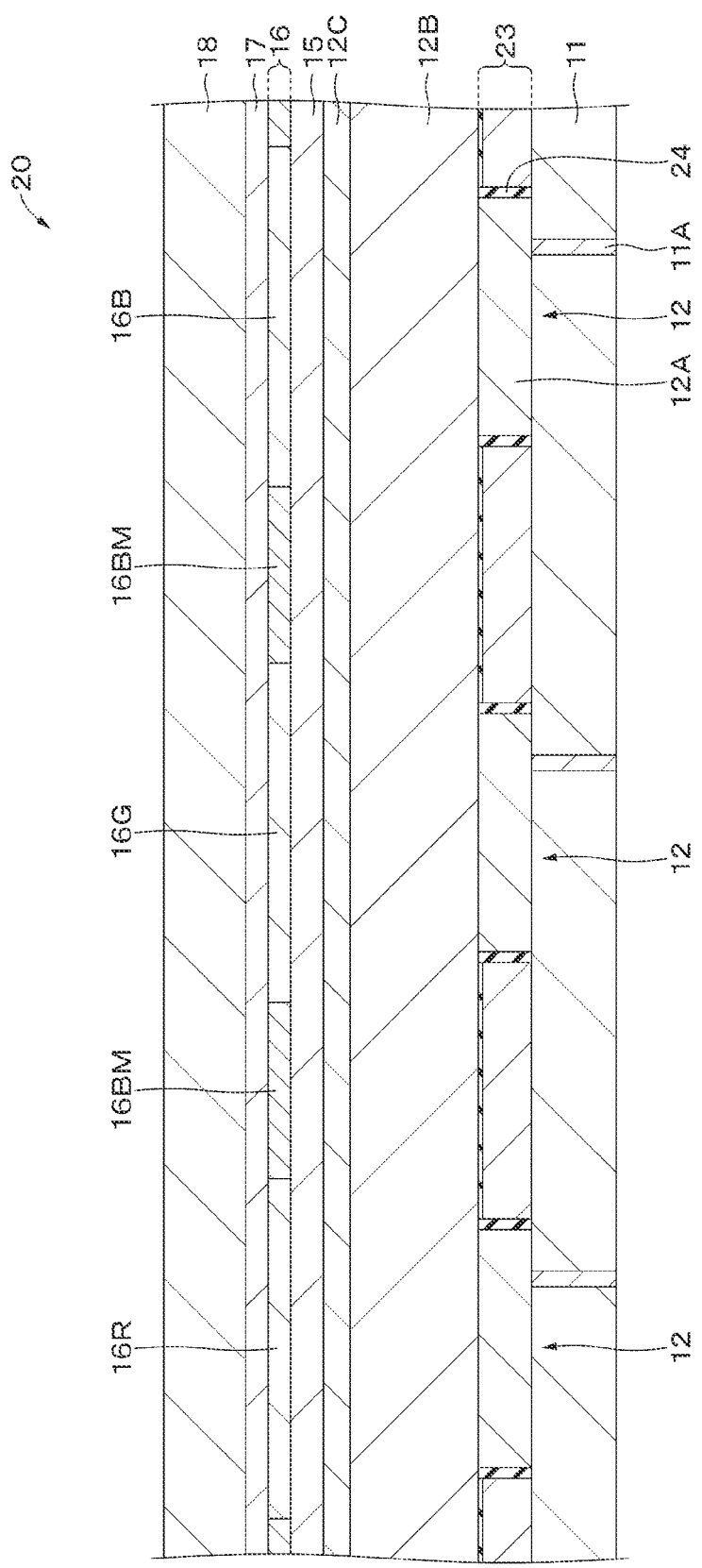
FIG. 10 is a cross-sectional view illustrating an example of a configuration of a display device according to a second embodiment of the present disclosure.
Figure 11:
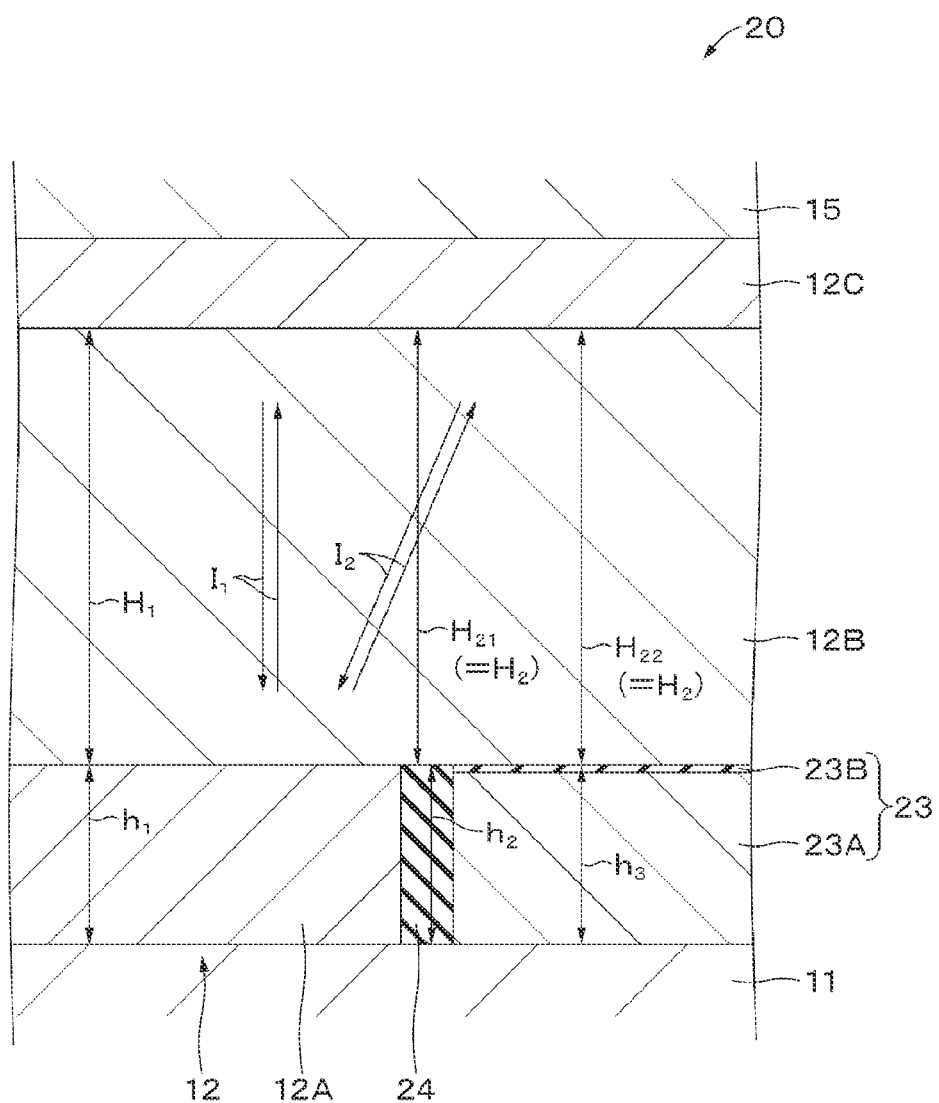
FIG. 11 is an enlarged cross-sectional view illustrating a part of the display device illustrated in FIG. 10.

FIG. 10 is a cross-sectional view illustrating an example of a configuration of a display device 20 according to a second embodiment of the present disclosure. FIG. 11 is an enlarged cross-sectional view illustrating a part of the display device 20 illustrated in FIG. 10. The display device 20 is different from the display device 10 according to the first embodiment in including an insulating layer 23 and a first interface layer 24 instead of the insulating layer 13 and the first interface layer 14.

(Insulating Layer)

The insulating layer 23 is for electrically separating a first electrode 12A for each of subpixels 100R, 100G, and 100B. The insulating layer 23 is provided between side surfaces of the first electrodes 12A adjacent in an in-plane direction of a substrate 11. An upper surface of the insulating layer 23 is flat. In the present specification, the "upper surface" refers to a surface on a display surface side of the display device 20.

The insulating layer 23 includes a bulk layer 23A serving as a main body of the insulating layer and a second interface layer 23B provided at an interface between the bulk layer 23A and an organic layer 12B. In the second embodiment, the case where the insulating layer 23 includes the second interface layer 23B will be described, but the insulating layer 23 does not have to include the second interface layer 23B.

The bulk layer 23A is similar to the bulk layer 13A in the first embodiment except that the bulk layer 23A is provided between the side surfaces of the first electrodes 12A adjacent in the in-plane direction of the substrate 11 without covering a peripheral edge portion of the first electrode 12A. The second interface layer 23B is similar to the second interface layer 13B in the first embodiment except that the second interface layer 23B is provided on an upper surface of the bulk layer 23A.

(First Interface Layer)

The first interface layer 24 is provided between a side surface of the insulating layer 23 and the side surface of the first electrode 12A. An upper surface of the first interface layer 24 is flat. In the first interface layer 24, configurations other than the above are similar to those of the first interface layer 14 in the first embodiment.

(Organic Layer)

Figure 12:
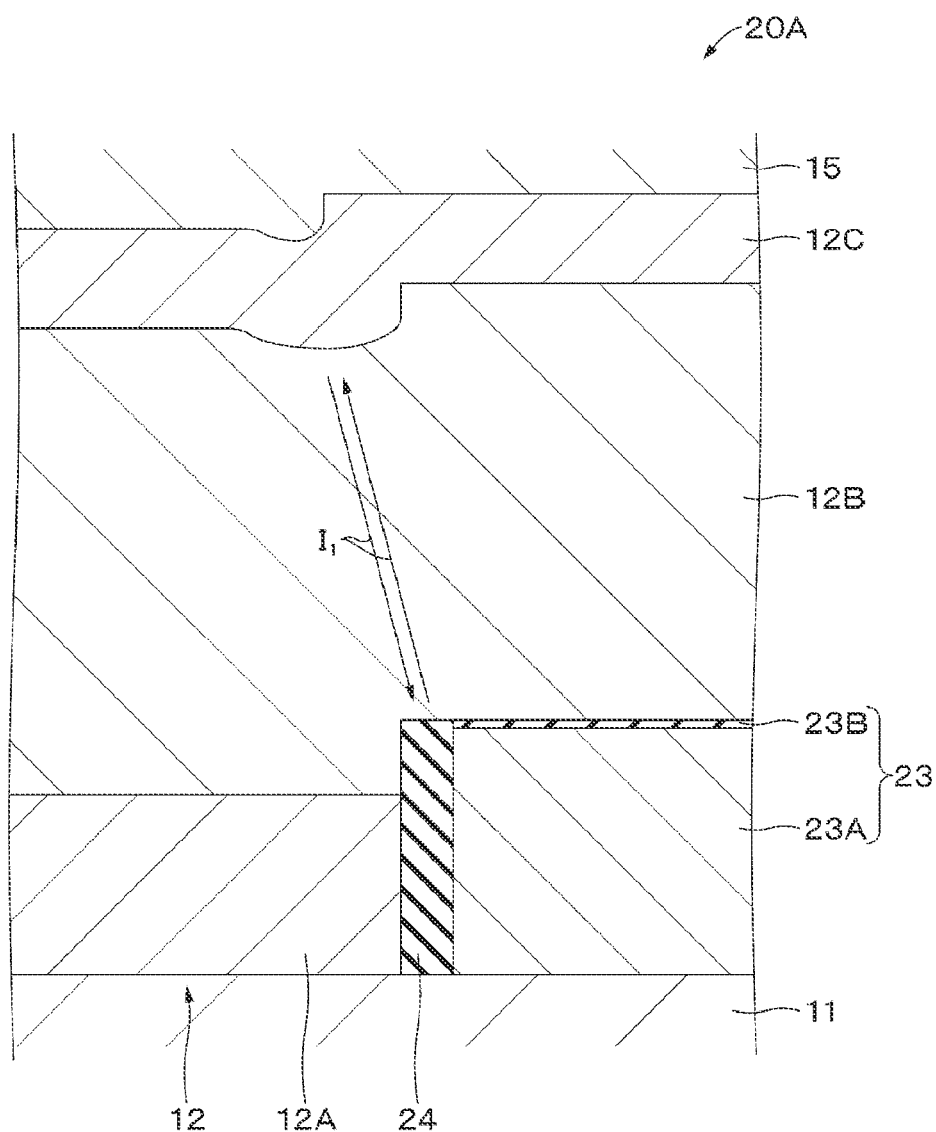
FIG. 12 is an enlarged cross-sectional view illustrating a part of a display device according to a comparative example.

The thickness of the organic layer 12B on the first electrode 12A is substantially constant. That is, the upper surface of the organic layer 12B on the first electrode 12A is substantially flat. Thereby, a vertical leak between the first electrode 12A and a second electrode 12C (specifically, a portion of the second electrode 12C, the portion corresponding to above the first electrode 12A) (see the arrow $I_1$ in FIG. 11) can be suppressed. In contrast, as illustrated in FIG. 12, in a display device 20A in which a recess 12BA is formed in a portion of the upper surface of the organic layer 12B, the portion corresponding to a peripheral edge portion of the first electrode 12A, and the thickness of the organic layer 12B on the first electrode 12A is not substantially constant (that is, a display device in which the upper surface of the organic layer 12B on the first electrode 12A is not substantially flat), an electric field is concentrated to a part between the first electrode 12A and the second electrode 12C. Thereby, the vertical leak between the first electrode 12A and the second electrode 12C (specifically, the portion of the second electrode 12C, the portion corresponding to above the first electrode 12A) (see the arrow $I_1$ in FIG. 11) becomes large. In the present specification, the term "vertical leak" refers to a hole current leak and an electron current leak between the first electrode 12A and the second electrode 12C in a thickness direction of the organic layer 12B.

In the present specification, "the thickness of the organic layer 12B on the first electrode 12A is substantially constant" means that variation in the thickness of the organic layer 12B on the first electrode 12A is within ±5% of an average thickness of the organic layer 12B on the first electrode 12A. Furthermore, "the upper surface of the organic layer 12B is substantially flat" means that displacement of the upper surface of the organic layer 12B (displacement in the thickness direction of the organic layer 12B) is within ±5% of the average thickness of the organic layer 12B. Note that the thickness and the average thickness of the organic layer 12B are similarly obtained to the thickness and the average thickness of the first interface layer 14 in the first embodiment.

(Relationship of Heights of Layers)

Figure 13:
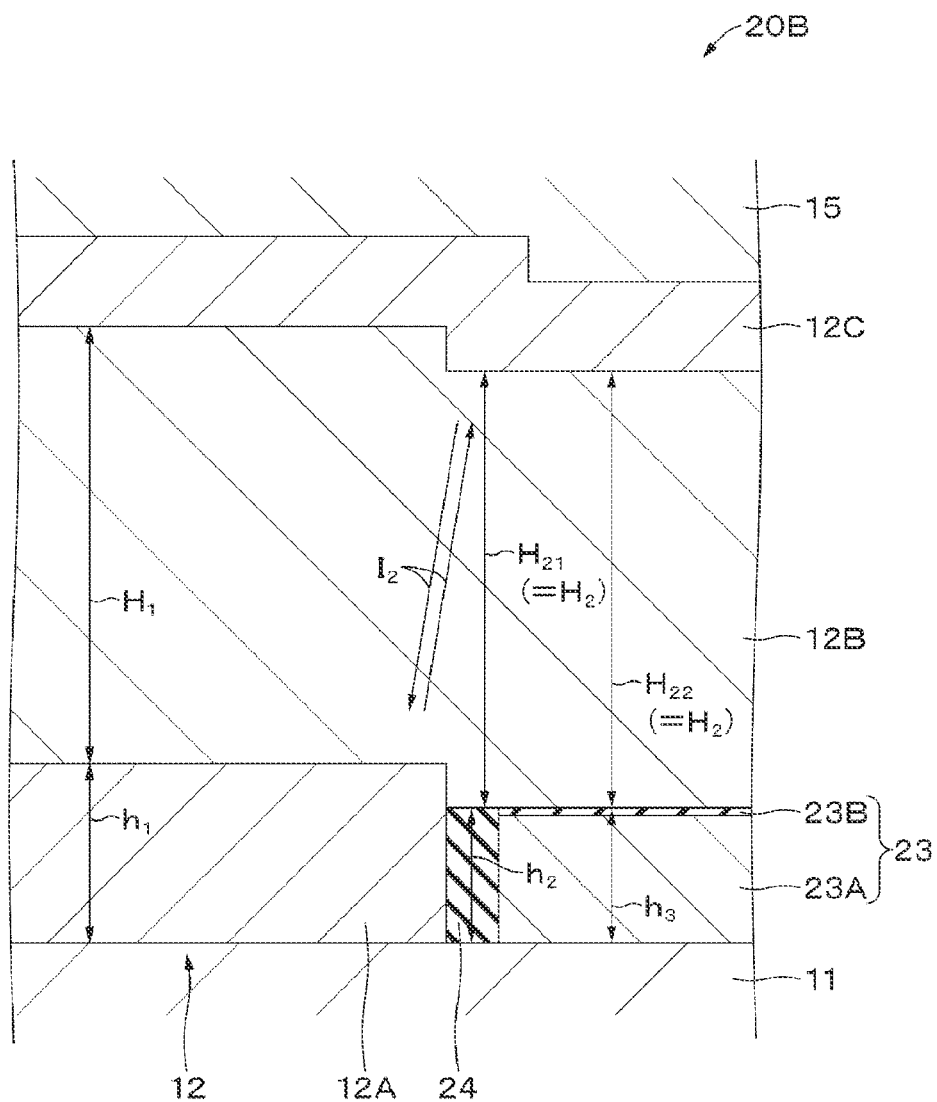
FIG. 13 is an enlarged cross-sectional view illustrating a part of a display device according to a comparative example.

A height $H_1$ of the organic layer 12B on the first electrode 12A and a height $H_2$ of the organic layer 12B in a portion around the first electrode 12A satisfy a relationship of $H_1 \leq H_2$. Thereby, the concentration of the electric field to a part between the first electrode 12A and the second electrode 12C can be suppressed. Therefore, a vertical leak between the first electrode 12A and the second electrode 12C (specifically, a portion of the second electrode 12C, the portion corresponding to a portion around the first electrode 12A) (see the arrow 12 in FIG. 11) can be suppressed. In contrast, as illustrated in FIG. 13, in a display device 20B in which the height $H_1$ of the organic layer 12B on the first electrode 12A and the height $H_2$ of the organic layer 12B in a portion around the first electrode 12A do not satisfy the relationship of $H_1 \leq H_2$, the electric field is concentrated to a part between the first electrode 12A and the second electrode 12C. Thereby, the vertical leak between the first electrode 12A and the second electrode 12C (specifically, the portion of the second electrode 12C, the portion corresponding to a portion around the first electrode 12A) (see the arrow 12 in FIG. 13) becomes large. In the present specification, the "portion around the first electrode 12A" means a range of 50 nm or less from the side surface of the first electrode 12A.

The height $H_1$ of the organic layer 12B on the first electrode 12A, a height $H_{21}$ of the organic layer 12B on the first interface layer 24, and a height $H_{22}$ of the organic layer in a portion around the first electrode 12A may satisfy a relationship of $H_1 \leq H_{21} \leq H_{22}$. Even in this case, the vertical leak (see the arrow $I_2$ in FIG. 11) can be suppressed.

Figure 14:
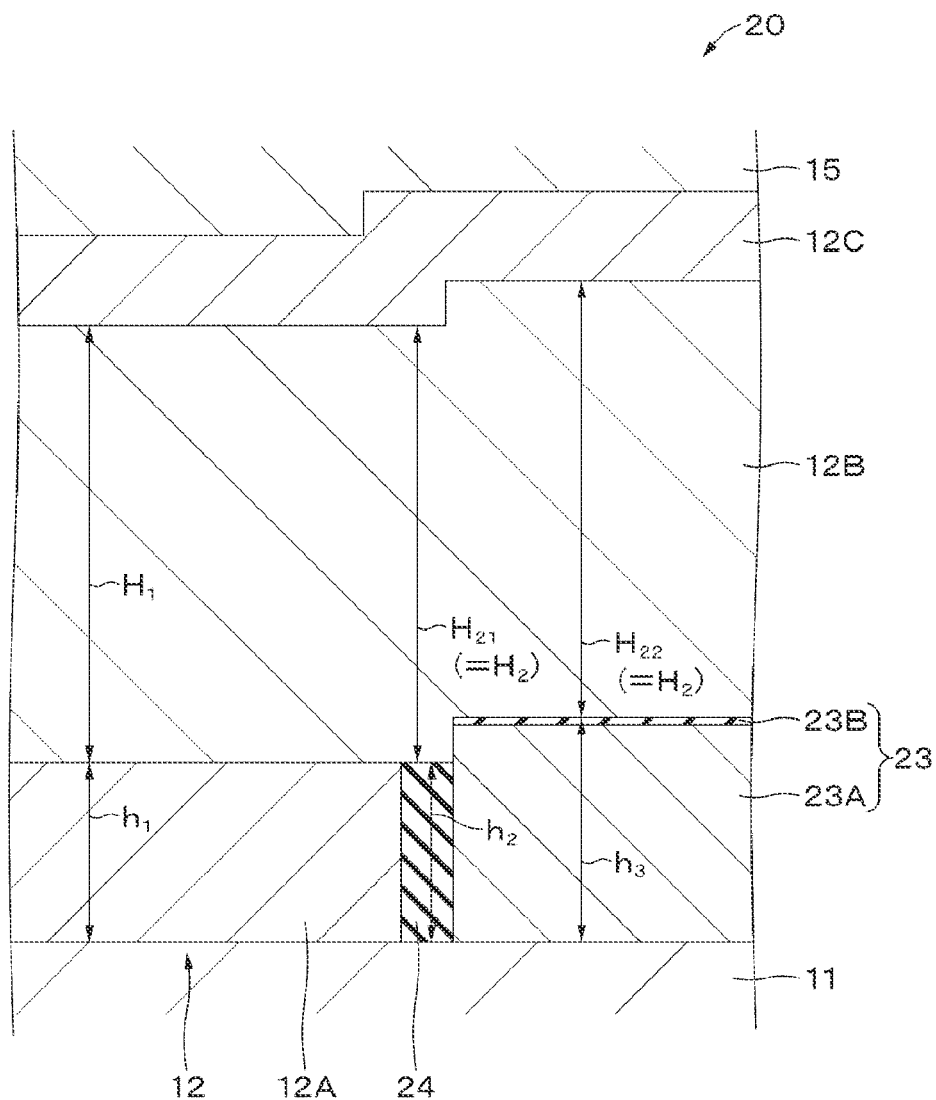
FIG. 14 is an enlarged cross-sectional view illustrating a part of a display device according to a modification.

FIG. 11 illustrates an example in which the height $H_1$ of the organic layer 12B on the first electrode 12A and the height $H_2$ of the organic layer 12B in a portion around the first electrode 12A satisfy a relationship of $H_1 = H_2$. FIG. 14 illustrates an example in which the height $H_1$ of the organic layer 12B on the first electrode 12A and the height $H_2$ of the organic layer 12B in a portion around the first electrode 12A satisfy a relationship of $H_1 < H_2$.

A height $h_1$ of the first electrode 12A, a height $h_2$ of the first interface layer 24, and a height $h_3$ of the insulating layer 23 favorably satisfy a relationship of $h_1 \leq h_2 \leq h_3$. When the above relationship is satisfied, in a case where the organic layer 12B is formed on the first electrode 12A, the first interface layer 24, and the insulating layer 23 by the CVD method or the like, the organic layer 12B in which the height $H_1$ of the organic layer 12B on the first electrode 12A and the height $H_2$ of the organic layer 12B in a portion around the first electrode 12A satisfy the relationship of $H_1 \leq H_2$ can be obtained. Therefore, the vertical leak can be suppressed as described above.

FIG. 11 illustrates an example in which the height $h_1$ of the first electrode 12A, the height $h_2$ of the first interface layer 24, and the height $h_3$ of the insulating layer 23 satisfy a relationship of $h_1=h_2=h_3$. FIG. 12 illustrates an example in which the height $h_1$ of the first electrode 12A, the height $h_2$ of the first interface layer 24, and the height $h_3$ of the insulating layer 23 satisfy a relationship of $h_1<h_2=h_3$. FIG. 14 illustrates an example in which the height $h_1$ of the first electrode 12A, the height $h_2$ of the first interface layer 24, and the height $h_3$ of the insulating layer 23 satisfy a relationship of $h_1=h_2<h_3$.

[2-2 Method of Manufacturing Display Device]

Hereinafter, a method of manufacturing the display device 20 having the above configuration will be described.

First, the substrate 11 including a drive circuit and the like is formed, as illustrated in FIG. 15A, using, for example, a thin film forming technique, a photolithography technique, and an etching technique. Next, for example, an electrode layer 12A1 such as a metal layer or a metal oxide layer is formed on the substrate 11, as illustrated in FIG. 15B, by a sputtering method, and then the electrode layer 12A1 is patterned by using, for example, the photolithography technique and the etching technique, so that a plurality of first electrodes 12A each separated for each light emitting element 12 (that is, for each subpixel 100) is formed, as illustrated in FIG. 15C.

Next, the first interface layer 24 is formed on one main surface of the substrate 11 on which the plurality of first electrodes 12A has been formed, as illustrated in FIG. 15D, by a CVD method, for example, then, the first interface layer 24 is removed while the first interface layer 24 remains on the side surface of the first electrode 12A, as illustrated in FIG. 15E, by an etchback method, for example. Next, the bulk layer 23A is formed on one main surface of the substrate 11 to cover the first electrode 12A and the first interface layer 24, as illustrated in FIG. 15F, by the CVD method, for example. Next, a photoresist layer 23A1 is formed on the bulk layer 23A to flatten the surface, as illustrated in FIG. 16A, by a spin coating method, for example. Next, the photoresist layer 23A1 is removed and a part of the bulk layer 23A is removed, so that the first electrode 12A, the first interface layer 24, and the bulk layer 23A having substantially the same thickness are formed, as illustrated in FIG. 16B, by the etchback method, for example.

Next, the surface of the bulk layer 23A is plasma-treated to form the second interface layer 23B, or the second interface layer 23B is formed on the upper surface of the bulk layer 23A by an atomic layer deposition (ALD) method, as illustrated in FIG. 16C. As a result, the insulating layer 23 is obtained.

Next, the organic layer 12B having a substantially flat upper surface is formed, as illustrated in FIG. 16D, by stacking the hole injection layer $12B_1$, the hole transport layer $12B_2$, the light emitting layer $12B_3$, and the electron transport layer $12B_4$ on the first electrode 12A and the insulating layer 23 in this order by a vapor deposition method, for example.

The display device 20 can be obtained by performing the other steps similarly to the method of manufacturing the display device 10 in the first embodiment.

[2-3 Effect]

As described above, in the display device 20 according to the second embodiment, the thickness of the organic layer 12B on the first electrode 12A is substantially constant, and the height $h_1$ of the organic layer 12B on the first electrode 12A and the height $h_2$ of the organic layer 12B in a portion around the first electrode 12A satisfy the relationship of $h_1 \leq h_2$. Thereby, the concentration of the electric field to a part between the first electrode 12A and the second electrode 12C can be suppressed. Therefore, occurrence of the vertical leak (see the arrows $I_1$ and $I_2$ in FIG. 11) due to electric field concentration can be suppressed.

Furthermore, since the thickness of the organic layer 12B on the first electrode 12A is substantially constant, occurrence of color shift due to a change in the film thickness (cavity shift) of the organic layer 12B can be suppressed.

[2-4 Modification]

Figure 17:
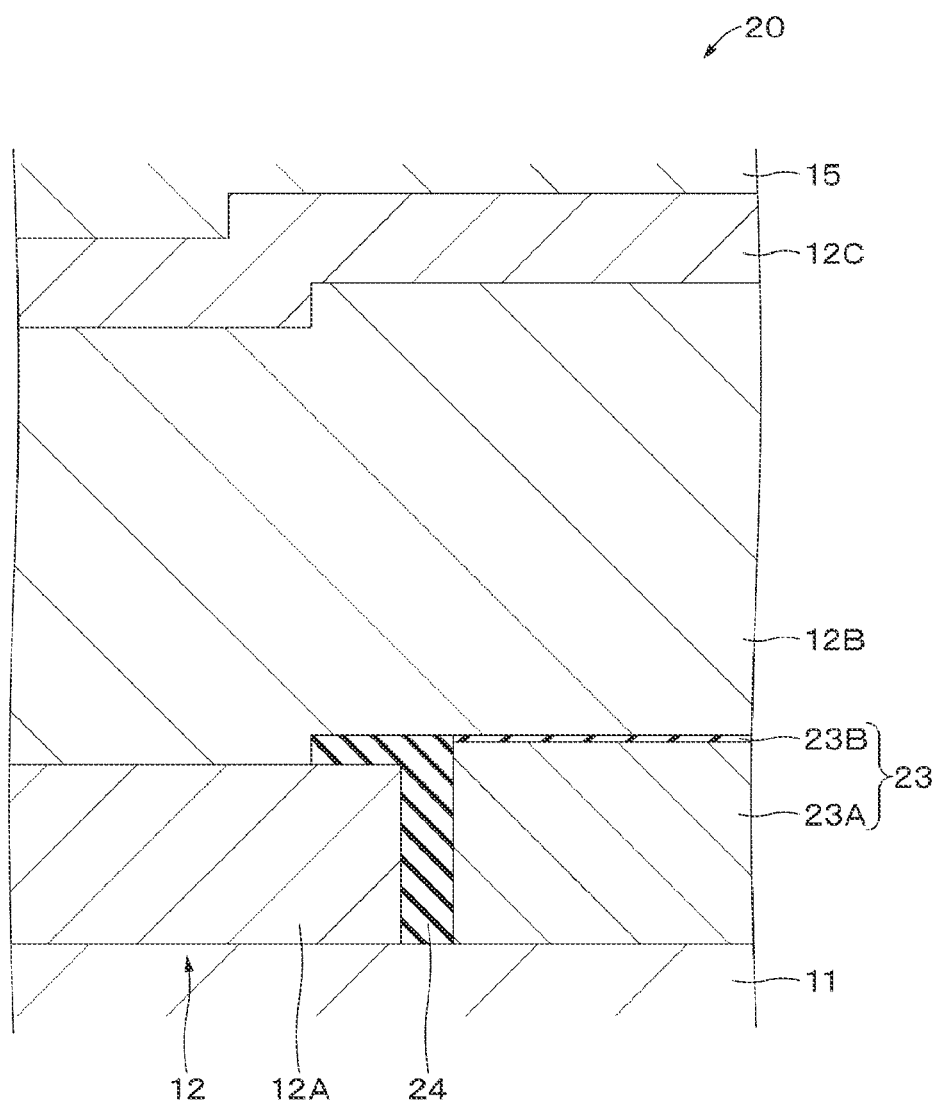
FIG. 17 is a cross-sectional view illustrating an example of a configuration of a display device according to a modification of the second embodiment of the present disclosure.

In the above-described second embodiment, the case in which the first interface layer 24 does not cover the peripheral edge portion of the upper surface of the first electrode 24A has been described. However, as illustrated in FIG. 17, the first interface layer 24 may cover the peripheral edge portion of the upper surface of the first electrode 12A.

3 Third Embodiment

[3-1 Configuration of Display Device]

Figure 18:
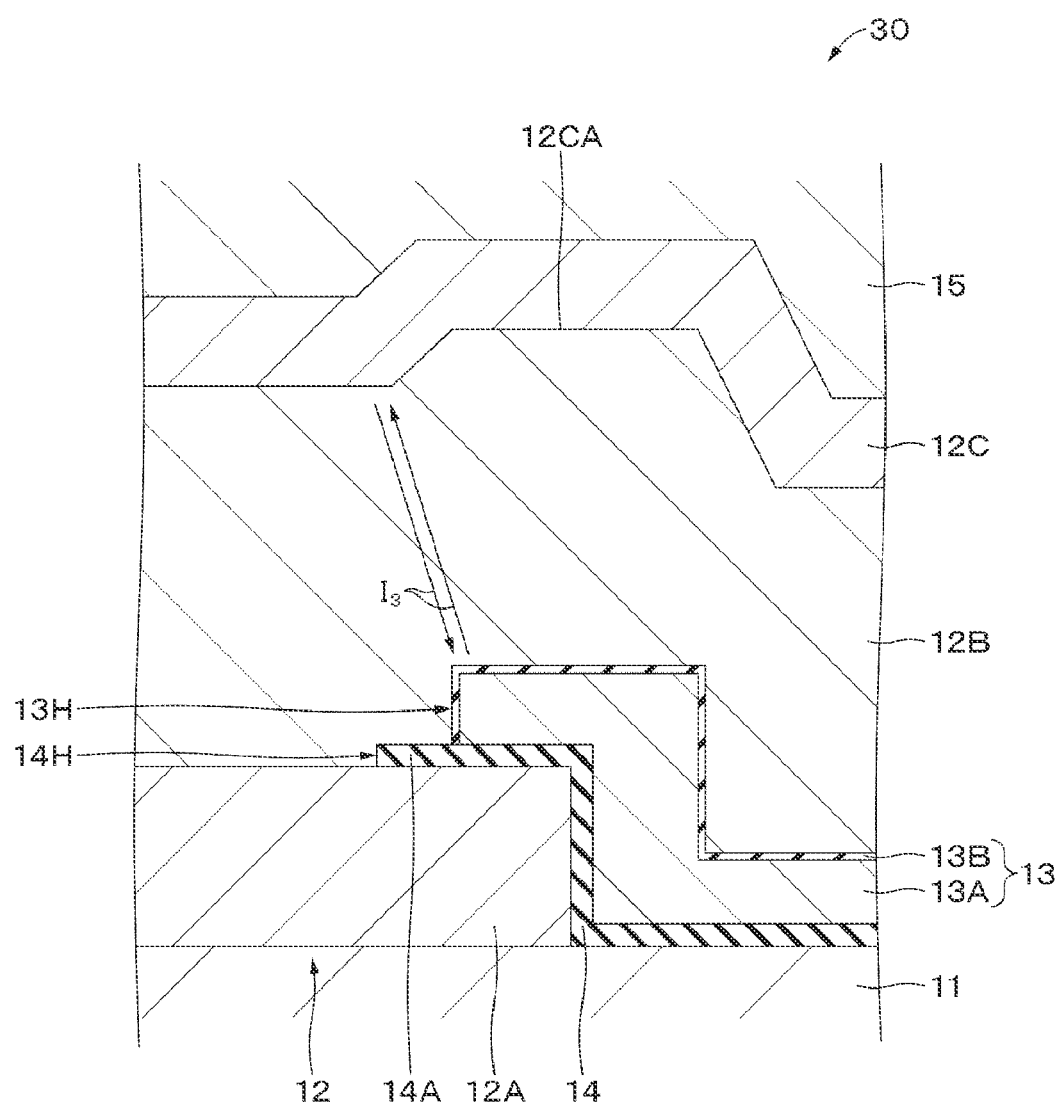
FIG. 18 is an enlarged cross-sectional view illustrating a part of a display device according to a third embodiment of the present disclosure.

FIG. 18 is an enlarged cross-sectional view illustrating a part of a display device 30 according to a third embodiment of the present disclosure. An organic layer 12B has a plurality of salients 12CA on an upper surface. The plurality of salients 12CA is provided in portions corresponding to respective peripheral edge portions of a plurality of first electrodes 12A. The thickness of the organic layer 12B in a region inside the salient 12CA is substantially constant.

A first interface layer 14 has a plurality of openings (first openings) 14H respectively provided above the plurality of first electrodes 12A. An insulating layer 13 has a plurality of openings (second openings) 13H respectively provided above the plurality of first electrodes 12A. A peripheral edge of the opening 14H is located inside a peripheral edge of the opening 13H. That is, the first interface layer 14 has a protrusion 14A protruding with respect to the peripheral edge of the opening 13H of the insulating layer 13. The thickness of the protrusion 14A is, for example, substantially uniform.

Since the peripheral edge of the opening 14H is located inside the peripheral edge of the opening 13H, in a case where the organic layer 12B is formed by a CVD method or the like, a portion inside the peripheral edge of the opening 13H being hidden behind the insulating layer 13 around the opening 13H, and the thickness of the organic layer 12B becoming thinner in a portion inside the salient 12CA can be suppressed. That is, formation of a recess 12CB (see FIG. 19) in a portion of the upper surface of the organic layer 12B, the portion being inside the salient 12CA, can be suppressed. Therefore, a vertical leak (see the arrows 13 in FIG. 18) due to electric field concentration can be suppressed.

In contrast, in a display device 30A in which the peripheral edge of the opening 14H is aligned with the peripheral edge of the opening 13H, in a case where the organic layer 12B is formed by a CVD method or the like, a portion inside the peripheral edge of the opening 12H is hidden behind the insulating layer 13 around the opening 13H, and the thickness of the organic layer 12B becomes thin in a portion inside the salient 12CA. That is, the recess 12CB is formed in a portion of the upper surface of the organic layer 12B, the portion being inside the salient 12CA. Therefore, the vertical leak (see the arrows $I_3$ in FIG. 19) due to electric field concentration becomes large.

An aperture ratio of the insulating layer 13 is favorably higher than an aperture ratio of the first interface layer 14.

Therefore, the peripheral edge of the opening 14H can be located inside the peripheral edge of the opening 13H. The aperture ratio of the insulating layer 13 is a ratio of a total area of the opening 13H of the insulating layer 13 to an area of a forming region of the insulating layer 13. The aperture ratio of the first interface layer 14 is a ratio of a total area of the opening 14H of the first interface layer 14 to an area of a forming region of the first interface layer 14. In the third embodiment, configurations other than the above are similar to those in the first embodiment.

[3-2 Method of Manufacturing Display Device]

First, a process of forming a substrate 11 to a process of forming the first interface layer 14 are similarly performed to the second embodiment, and the first interface layer 14 is formed on one main surface of the substrate 11 in which a plurality of first electrodes 12A has been formed, as illustrated in FIG. 20A.

Next, a bulk layer 13A is formed on the first interface layer 14, as illustrated in FIG. 20B, by a CVD method, for example. Next, a photoresist layer 13A1 is formed on the bulk layer 13A, and then an opening is formed in a portion of the photoresist layer 13A1, the portion corresponding to above the first electrode 12A, as illustrated in FIG. 20C, by a spin coating method, for example. Next, the opening 14H and the opening 13H are formed in portions of the first interface layer 14 and the bulk layer 13A, the portions corresponding to above the first electrode 12A, as illustrated in FIG. 21A, by an etching method, for example. At this time, an etching rate between the first interface layer (for example, SiO layer) and the bulk layer 13A (for example, SiN layer) is adjusted using a deposition gas such as $CH_2F_2$, and etching is conducted. As a result, the opening 13H and the opening 14H are formed such that the peripheral edge of the opening 14H is located inside the peripheral edge of the opening 13H.

Next, the surface of the bulk layer 13A is plasma-treated to form a second interface layer 13B, or the second interface layer 13B is formed on the upper surface of the bulk layer 13A by an atomic layer deposition (ALD) method, as illustrated in FIG. 21B. As a result, the insulating layer 13 is obtained.

Next, for example, a hole injection layer $12B_1$, a hole transport layer $12B_2$, a light emitting layer $12B_3$, and an electron transport layer $12B_4$ are stacked on the first electrode 12A and the insulating layer 13 in this order by a vapor deposition method. Thereby, the organic layer 12B having the plurality of salients 12CA on the upper surface and having a substantially constant thickness in the region inside the salient 12CA is formed, as illustrated in FIG. 21C.

The display device 30 can be obtained by performing the other steps similarly to the method of manufacturing the display device 10 in the first embodiment.

[3-3 Effect]

As described above, in the display device 20 according to the third embodiment, the thickness of the organic layer 12B in the region inside the salient 12CA is substantially constant. Thereby, concentration of an electric field to a part between the first electrode 12A and the second electrode 12C can be suppressed. Therefore, a vertical leak between the first electrode 12A and the second electrode 12C (see the arrows 13 in FIG. 18) can be suppressed.

Figure 19:
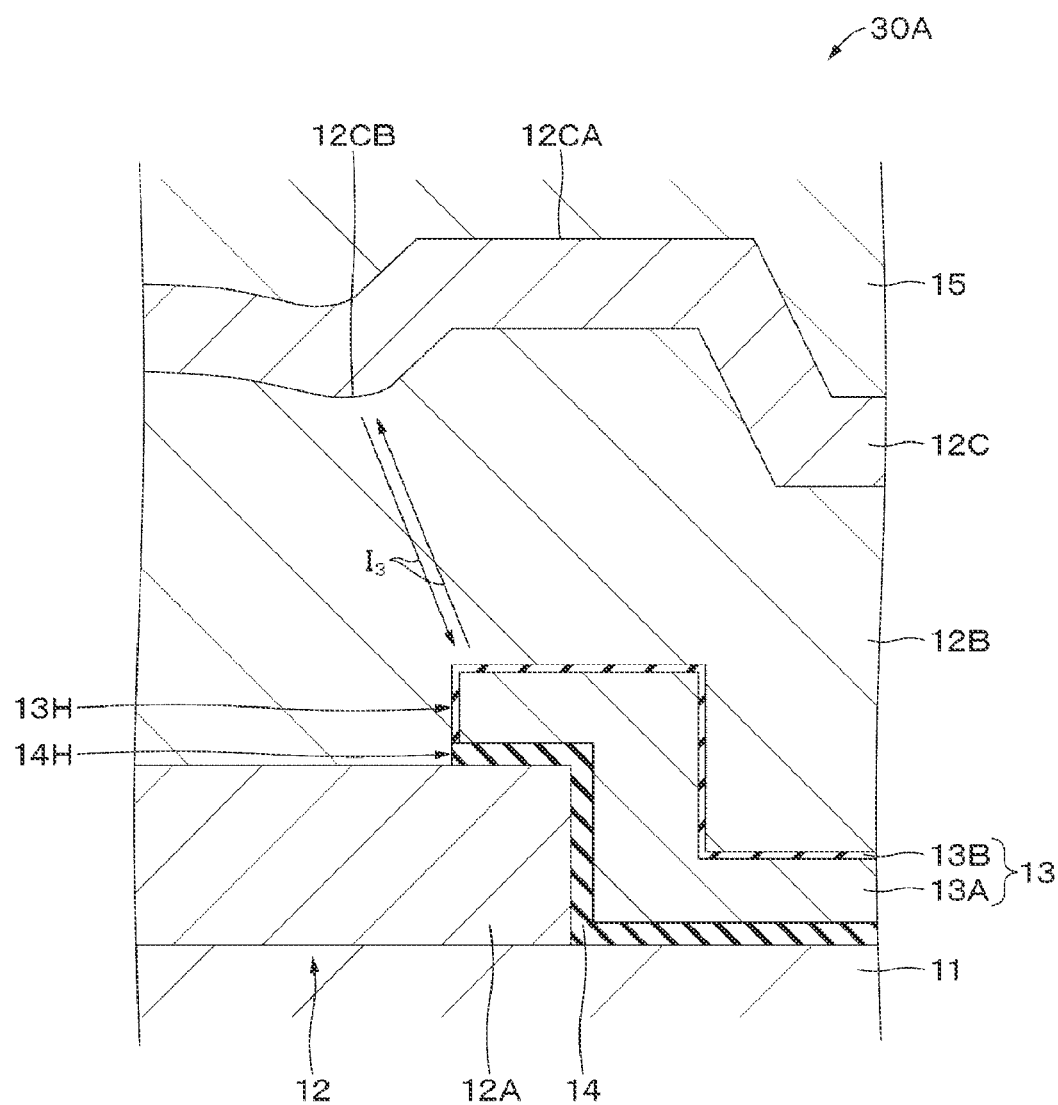
FIG. 19 is an enlarged cross-sectional view illustrating a part of a display device according to a modification.

In contrast, as illustrated in FIG. 19, in the display device 30A in which the organic layer 12B has the recess 12CB inside the salient 12CA, and the thickness of the organic layer 12B in the region inside the salient 12CA is not substantially constant, the electric field is concentrated to a part between the first electrode 12A and the second electrode 12C. Therefore, suppression of the vertical leak between the first electrode 12A and the second electrode 12C (see the arrows $I_3$ in FIG. 19) is difficult.

[3-4 Modification]

Figure 22:
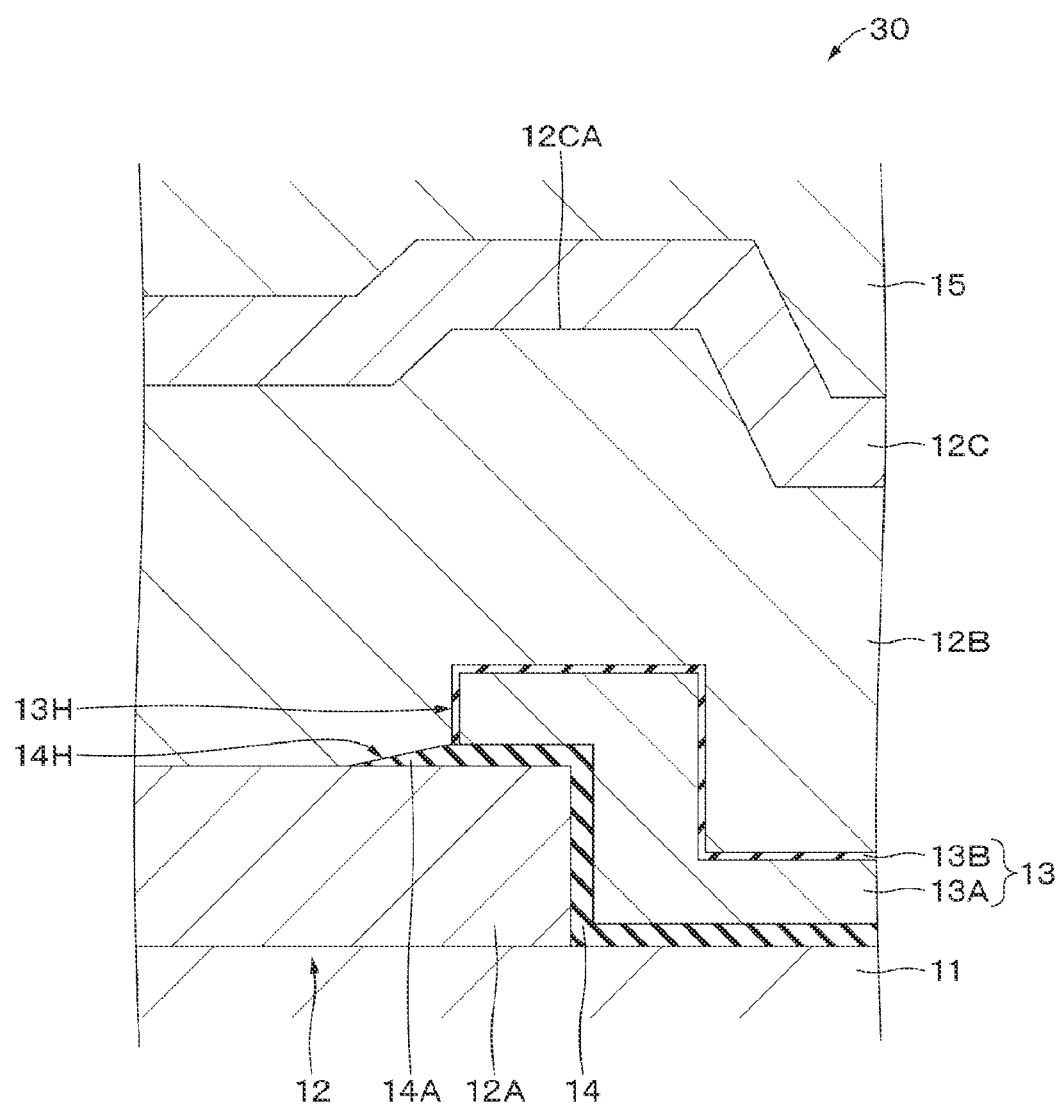
FIG. 22 is a cross-sectional view illustrating an example of a configuration of a display device according to a modification of the third embodiment of the present disclosure.

In the above-described third embodiment, the case in which the thickness of the protrusion 14A is substantially uniform has been described. However, the protrusion 14A may have a tapered shape in which the thickness of the protrusion 14A increases as being away from the opening 14H, as illustrated in FIG. 22.

4 Fourth Embodiment

[4-1 Configuration of Display Device]

Figure 23:
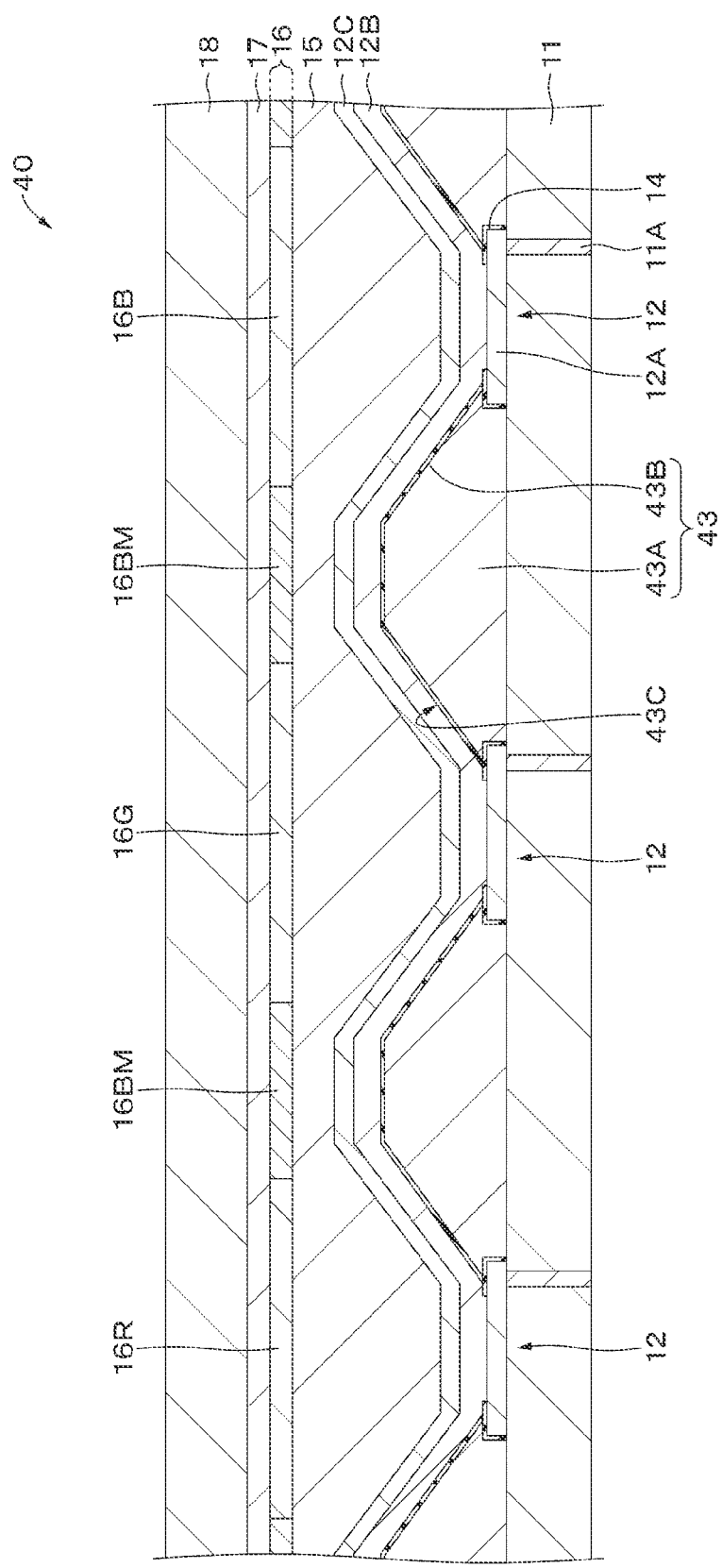
FIG. 23 is a cross-sectional view illustrating an example of a configuration of a display device according to a fourth embodiment of the present disclosure.

FIG. 23 is a cross-sectional view illustrating an example of a configuration of a display device 40 according to a second embodiment of the present disclosure. FIG. 24A is an enlarged cross-sectional view illustrating a part of the display device 40 illustrated in FIG. 23. An insulating layer 43 has a plurality of inclined surfaces 43C each protruding with respect to an upper surface of a first electrode 12A, and surrounding the plurality of first electrodes 12A, respectively. The insulating layer 43 has an opening 43H in a portion corresponding to a bottom of the inclined surface 43C. The bottom of the insulating layer 43 covers a peripheral edge portion of the upper surface of the first electrode 12A to a side surface (end face) of the first electrode 12A.

The thickness of an organic layer 12B on the first electrode 12A is substantially constant. The opening 43H is provided on the first electrode 12A. A peripheral edge of an opening 14H is located inside a peripheral edge of the opening 43H. That is, a first interface layer 14 has a protrusion 14A protruding with respect to the peripheral edge of the opening 43H of the insulating layer 43. The thickness of the protrusion 14A is, for example, substantially uniform. The protrusion 14A may have a tapered shape in which the thickness increases as being away from the opening 14H.

Since the peripheral edge of the opening 14H is located inside the peripheral edge of the opening 43H, in a case where the organic layer 12B is formed by a CVD method or the like, the thickness of the organic layer 12B becoming thinner can be suppressed in a portion inside a lower portion of the inclined surface 43C due to being hidden behind the inclined surface 43C. Therefore, the thickness of the organic layer 12B on the first electrode 12A can be made substantially constant. Therefore, occurrence of the vertical leak due to the electric field concentration can be suppressed.

An aperture ratio of the insulating layer 43 is favorably higher than the aperture ratio of the first interface layer 14. Therefore, the peripheral edge of the opening 43H can be located inside the peripheral edge of the opening 13H. The aperture ratio of the insulating layer 43 is a ratio of a total area of the opening 43H of the insulating layer 43 to an area of a forming region of the insulating layer 43.

The insulating layer 43 includes a bulk layer 43A serving as a main body of the insulating layer and a second interface layer 43B provided at an interface between the bulk layer 43A and the organic layer 12B. In the fourth embodiment, the case where the insulating layer 43 includes the second interface layer 43B will be described, but the insulating layer 43 does not have to include the second interface layer 43B.

The composition of the insulating layer 43 may continuously change from the bulk toward an outermost surface on the side of the organic layer 12B. Specifically, the oxygen concentration of the insulating layer 43 (more specifically, the concentration of a silicon oxide in the insulating layer 43) may gradually increase from the bulk toward the outermost surface on the side of the organic layer 12B. The composition of the insulating layer 43 may continuously change from the bulk toward a surface on an edge side. In the fourth embodiment, configurations other than the above are similar to those in the third embodiment.

[4-2 Effect]

In the fourth embodiment, the thickness of the organic layer 12B on the first electrode 12A is substantially constant. Thereby, concentration of an electric field to a part between the first electrode 12A and the second electrode 12C can be suppressed. Therefore, a vertical leak between the first electrode 12A and the second electrode 12C can be suppressed.

Furthermore, the insulating layer 43 has the plurality of inclined surfaces 43C surrounding the plurality of first electrodes 12A, respectively. As a result, light emitted from a light emitting element 12 can be reflected by the inclined surface 43C toward an upper side of the first electrode 12A. Therefore, luminance of the display device 40 can be improved.

[4-3 Modification]

In the above-described fourth embodiment, the case where the bottom of the insulating layer 43 covers the peripheral edge portion of the upper surface of the first electrode 12A has been described, but as illustrated in FIG. 24B, the bottom of the insulating layer 43 may be provided between side surfaces of the first electrodes 12A, and the bottom of the insulating layer 43 may not cover the peripheral edge portion of the upper surface of the first electrode 12A.

5 Examples of Resonator Structure Applied to Embodiments

The pixel used for the display device according to the above-described present disclosure can include a resonator structure that resonates light generated in the light emitting element. Hereinafter, the resonator structure will be described with reference to the drawings.

Resonator Structure: First Example

FIG. 25A is a schematic cross-sectional view for describing a first example of the resonator structure. In the following description, the light emitting elements 12 respectively provided corresponding to the subpixels 100R, 100G, and 100B may be referred to as light emitting elements $12_R$, $12_G$, and $12_B$. Furthermore, portions of the organic layers 12B, the portions respectively corresponding to the subpixels 100R, 100G, and 100B, may be referred to as organic layers $40_R$, $40_G$, and $40_B$.

In the first example, the first electrodes 12A are formed with a film thickness common to the light emitting elements 12. The same similarly applies to the second electrodes 12C.

A reflector 71 is arranged below the first electrode 12A of the light emitting element 12 across an optical adjustment layer 72. A resonator structure that resonates light generated by the organic layer 12B is formed between the reflector 71 and the second electrode 12C. In the following description, the optical adjustment layers 72 respectively provided corresponding to the subpixels 100R, 100G, and 100B may be referred to as optical adjustment layers $72_R$, $72_G$, and $72_B$.

The reflectors 71 are formed with a film thickness common to the light emitting elements 12. The film thickness of the optical adjustment layer 72 differs depending on the color to be displayed by the pixel. Since the optical adjustment layers $72_R$, $72_G$, and $72_B$ have different film thicknesses, an optical distance that causes optimum resonance for a wavelength of light according to the color to be displayed can be set.

In the illustrated example, the upper surfaces of the reflectors 71 of the light emitting elements $12_R$, $12_G$, and $12_B$ are arranged to be aligned. As described above, since the film thickness of the optical adjustment layer 72 differs depending on the color to be displayed by the pixel, the position of the upper surface of the second electrode 12C differs depending on the type of the light emitting element $12_R$, $12_G$, or $12_B$.

The reflector 71 can be formed using, for example, a metal such as aluminum (Al), silver (Ag), or copper (Cu), or an alloy containing the aforementioned metal as a main component.

The optical adjustment layer 72 can be configured using an inorganic insulating material such as a silicon nitride ($SiN_x$), a silicon oxide ($SiO_x$), or a silicon oxynitride ($SiO_xN_y$), or an organic resin material such as an acrylic resin or a polyimide resin. The optical adjustment layer 72 may be a single layer or a stacked film of a plurality of the aforementioned materials. Furthermore, the number of layers may be different depending on the type of the light emitting element 12.

The first electrode 12A can be formed using a transparent conductive material such as an indium tin oxide (ITO), an indium zinc oxide (IZO), or a zinc oxide (ZnO).

The second electrode 12C needs to function as a semi-transmissive reflective film. The second electrode 12C can be formed using magnesium (Mg) or silver (Ag), or a magnesium-silver (MgAg) alloy containing the magnesium (Mg) and silver (Ag) as main components or an alloy containing an alkali metal or an alkaline earth metal.

Resonator Structure: Second Example

FIG. 25B is a schematic cross-sectional view for describing a second example of the resonator structure.

Also in the second example, the first electrodes 12A and the second electrodes 12C are formed with film thicknesses common to the light emitting elements 12.

Then, also in the second example, the reflector 71 is arranged below the first electrode 12A of the light emitting element 12 across the optical adjustment layer 72. The resonator structure that resonates light generated by the organic layer 12B is formed between the reflector 71 and the second electrode 12C. Similar to the first example, the reflectors 71 are formed with a common film thickness in the light emitting elements 12, and the film thickness of the optical adjustment layer 72 differs depending on the color to be displayed by the pixel.

In the first example illustrated in FIG. 25A, the upper surfaces of the reflectors 71 in the light emitting elements $12_R$, $12_G$, and $12_B$ are arranged to be aligned, and the positions of the upper surfaces of the second electrodes 12C differ depending on the types of the light emitting elements $12_R$, $12_G$, and $12_B$.

In contrast, in the second example illustrated in FIG. 25B, the upper surfaces of the second electrodes 12C are arranged to be aligned among the light emitting elements $12_R$, $12_G$, and $12_B$. To align the upper surfaces of the second electrodes 12C, the upper surfaces of the reflectors 71 in the light emitting elements $12_R$, $12_G$, and $12_B$ are arranged to differ depending on the types of the light emitting elements $12_R$, $12_G$, and $12_B$. Therefore, lower surfaces of the reflectors 71 (in other words, a surface of a base 73 illustrated by reference numeral 73 in FIG. 25B) form a stepped shape according to the types of the light emitting elements 12.

The materials configuring the reflector 71, the optical adjustment layer 72, the first electrode 12A, and the second electrode 12C are similar to those described in the first example, and thus description thereof is omitted.

Resonator Structure: Third Example

FIG. 26A is a schematic cross-sectional view for describing a third example of the resonator structure. In the following description, the reflectors 71 respectively provided corresponding to the subpixels 100R, 100G, and 100B may be referred to as reflectors $71_R$, $71_G$, and $71_B$.

Also in the third example, the first electrodes 12A and the second electrodes 12C are formed with film thicknesses common to the light emitting elements 12.

Then, also in the third example, the reflector 71 is arranged below the first electrode 12A of the light emitting element 12 across the optical adjustment layer 72. A resonator structure that resonates light generated by the organic layer 12B is formed between the reflector 71 and the second electrode 12C. Similar to the first and second examples, the film thickness of the optical adjustment layer 72 differs depending on the color to be displayed by the pixel. Then, similarly to the second example, the positions of the upper surfaces of the second electrodes 12C are arranged to be aligned among the light emitting elements $12_R$, $12_G$, and $12_B$.

In the second example illustrated in FIG. 25B, the lower surfaces of the reflectors 71 have formed the stepped shape according to the types of the light emitting elements 12 in order to align the upper surfaces of the second electrodes 12C.

In contrast, in the third example illustrated in FIG. 26A, the film thicknesses of the reflectors 71 are set to differ depending on the types of the light emitting elements $12_R$, $12_G$, and $12_B$. More specifically, the film thicknesses are set such that the lower surfaces of the reflectors $71_R$, $71_G$, and $71_B$ are aligned.

The materials configuring the reflector 71, the optical adjustment layer 72, the first electrode 12A, and the second electrode 12C are similar to those described in the first example, and thus description thereof is omitted.

Resonator Structure: Fourth Example

FIG. 26B is a schematic cross-sectional view for describing a fourth example of the resonator structure. In the following description, the first electrodes 12A respectively provided corresponding to the subpixels 100R, 100G, and 100B may be referred to as first electrodes $12A_R$, $12A_G$, and $12A_B$.

In the first example in FIG. 25A, the first electrodes 12A and the second electrodes 12C of the light emitting elements 12 are formed with the common film thicknesses. Then, the reflector 71 is arranged below the first electrode 12A of the light emitting element 12 across the optical adjustment layer 72.

In contrast, in the fourth example illustrated in FIG. 26B, the optical adjustment layer 72 is omitted, and the film thicknesses of the first electrodes 12A are set to differ depending on the types of the light emitting elements $12_R$, $12_G$, and $12_B$.

The reflectors 71 are formed with a film thickness common to the light emitting elements 12. The film thickness of the first electrode 12A differs depending on the color to be displayed by the pixel. Since the first electrodes $12A_R$, $12A_G$, and $12A_B$ have different film thicknesses, an optical distance that causes optimum resonance for a wavelength of light according to the color to be displayed can be set.

The materials configuring the reflector 71, the optical adjustment layer 72, the first electrode 12A, and the second electrode 12C are similar to those described in the first example, and thus description thereof is omitted.

Resonator Structure: Fifth Example

FIG. 27A is a schematic cross-sectional view for describing a fifth example of the resonator structure.

In the first example in FIG. 25A, the first electrodes 12A and the second electrodes 12C are formed with film thicknesses common to the light emitting elements 12. Then, the reflector 71 is arranged below the first electrode 12A of the light emitting element 12 across the optical adjustment layer 72.

In contrast, in the fifth example illustrated in FIG. 27A, the optical adjustment layer 72 is omitted, and an oxide film 74 is formed on the surface of the reflector 71 instead. The film thicknesses of the oxide films 74 are set to differ depending on the types of the light emitting elements $12_R$, $12_G$, and $12_B$. In the following description, the oxide films 74 respectively provided corresponding to the subpixels 100R, 100G, and 100B may be referred to as oxide films $74_R$, $74_G$, and $74_B$.

The film thickness of the oxide film 74 differs depending on the color to be displayed by the pixel. Since the oxide films $74_R$, $74_G$, and $74_B$ have different film thicknesses, an optical distance that causes optimum resonance for a wavelength of light according to the color to be displayed can be set.

The oxide film 74 is a film obtained by oxidizing the surface of the reflector 71, and is configured using, for example, an aluminum oxide, a tantalum oxide, a titanium oxide, a magnesium oxide, a zirconium oxide, or the like. The oxide film 74 functions as an insulating film for adjusting an optical path length (optical distance) between the reflector 71 and the second electrode 12C.

The oxide films 74 having the different film thicknesses depending on the types of the light emitting elements $12_R$, $12_G$, and $12_B$ are formed as follows, for example.

First, a container is filled with an electrolytic solution, and a substrate on which the reflector 71 is formed is immersed in the electrolytic solution. Furthermore, an electrode is arranged to face the reflector 71.

Then, a positive voltage is applied to the reflector 71 with reference to the electrode to anodize the reflector 71. The film thickness of the oxide film by the anodization is proportional to a voltage value with respect to the electrode. Therefore, the anodization is performed in a state where a voltage corresponding to the type of the light emitting element 12 is applied to each of the reflectors $71_R$, $71_G$, and $71_B$. As a result, the oxide films 74 having different film thicknesses can be collectively formed.

The materials configuring the reflector 71, the first electrode 12A, and the second electrode 12C are similar to those described in the first example, and thus description thereof is omitted.

Resonator Structure: Sixth Example

FIG. 27B is a schematic cross-sectional view for describing a sixth example of the resonator structure.

In the sixth example, the light emitting element 12 is configured such that the first electrode 12A, the organic layer 12B, and the second electrode 12C are stacked. Note that, in the sixth example, the first electrode 12A is formed to function as both the electrode and the reflector. The first electrode (and reflector) 12A is formed using a material having an optical constant selected according to the type of light emitting element $12_R$, $12_G$, or $12_B$. Since a phase shift by the first electrode (and reflector) 12A differs, an optical distance that causes optimum resonance for a wavelength of light according to the color to be displayed can be set.

The first electrode (and reflector) 12A can be configured using a single metal such as aluminum (Al), silver (Ag), gold (Au), or copper (Cu), or an alloy containing the aforementioned metal as a main component. For example, a configuration in which the first electrode (and reflector) $12A_R$ of the light emitting element $12_R$ is formed using copper (Cu), and the first electrode (and reflector) $12A_G$ of the light emitting element $12_G$ and the first electrode (and reflector) $12A_B$ of the light emitting element $12_B$ are formed using aluminum can be adopted.

The material configuring the second electrode 12C is similar to that described in the first example, and thus description thereof is omitted.

Resonator Structure: Seventh Example

Figure 28:
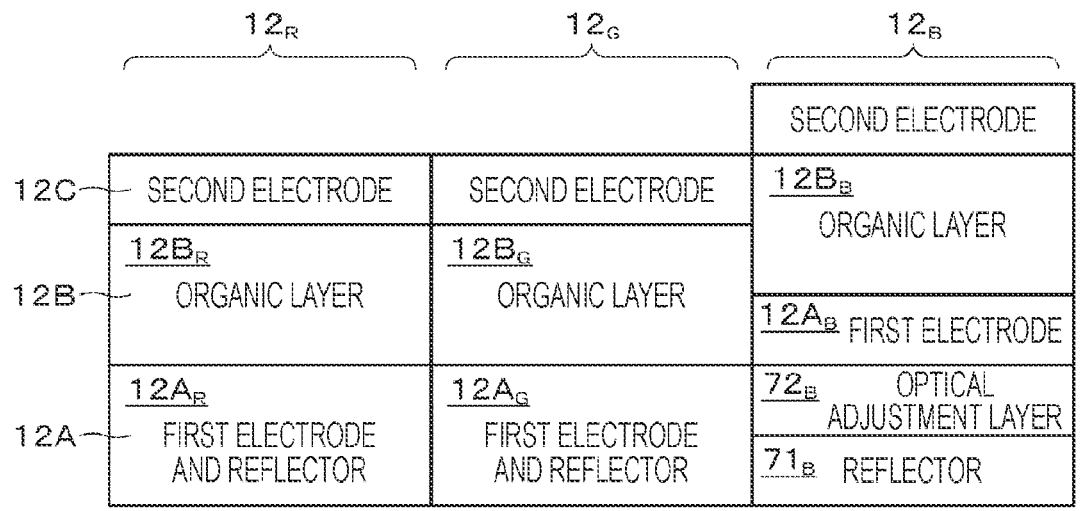
FIG. 28 is a schematic cross-sectional view for describing a seventh example of the resonator structure.

FIG. 28 is a schematic cross-sectional view for describing a seventh example of the resonator structure.

The seventh example has a configuration in which, basically, the sixth example is applied for the light emitting elements $12_R$ and $12_G$, and the first example is applied for the light emitting element $12_B$. With the configuration, an optical distance that causes optimum resonance for a wavelength of light according to the color to be displayed can be set.

The first electrodes (and reflectors) $12A_R$ and $12A_G$ used for the light emitting elements $12_R$ and $12_G$ can be configured using a single metal such as aluminum (Al), silver (Ag), gold (Au), or copper (Cu), or an alloy containing the aforementioned metal as a main component.

The materials configuring the reflector $71_B$, the optical adjustment layer $72_B$, and the first electrode $12A_B$, which are used for the light emitting element 123, are similar to those described in the first example, and thus the description thereof is omitted.

5 Application (Electronic Device)

Figure 29:
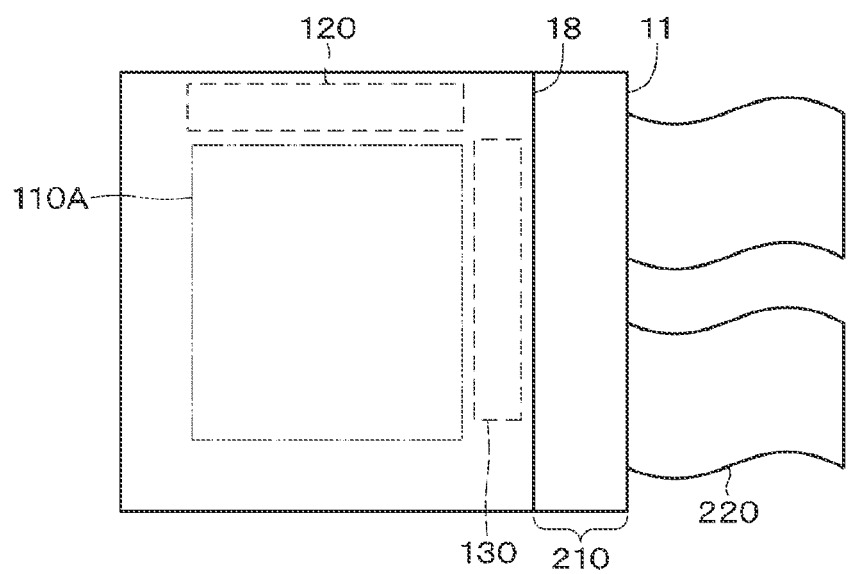
FIG. 29 is a plan view illustrating an example of a schematic configuration of a module.

The display device according to any one of the above-described first embodiment and its modifications is incorporated into various electronic devices as a module as illustrated in FIG. 29, for example. Similarly, the display device according to any one of the above-described second to fourth embodiments and its modifications may be incorporated into various electronic devices as a module as illustrated in FIG. 29, for example. In particular, the display device is suitable for those that require high resolution and are used by enlarging objects near the eyes, such as electronic viewfinders of video cameras and single-lens reflex cameras, or head-mounted displays. This module has a region 210 on one short side of the substrate 11, the region 210 being not covered by the facing substrate 18 and the filled resin layer 17 and exposed, and the signal line drive circuit 120 and the scanning line drive circuit 130 are wired and extended to the region 210 to form an external connection terminal (not illustrated). A flexible printed circuit board (FPC) 220 for signal input/output may be connected to the external connection terminal.

Specific Example 1

FIGS. 30A and 30B illustrate an example of an appearance of a digital still camera 310. The digital still camera 310 is a single-lens reflex-type camera with interchangeable lenses, and has an interchangeable imaging lens unit (interchangeable lens) 312 in an approximate center of a front of a camera main body (camera body) 311 and has a grip portion 313 gripped by a photographer on the left side of the front.

A monitor 314 is provided at a position shifted to the left from the center of a back surface of the camera main body 311. An electronic viewfinder (eyepiece window) 315 is provided above the monitor 314. The photographer can visually recognize an optical image of an object guided by the imaging lens unit 312 and determine the composition by looking into the electronic viewfinder 315. As the electronic viewfinder 315, the display device according to any one of the above-described first embodiment and its modifications can be used. Furthermore, as the electronic viewfinder 315, the display device according to any one of the above-described second to fourth embodiments and its modifications can also be used.

Specific Example 2

Figure 31:
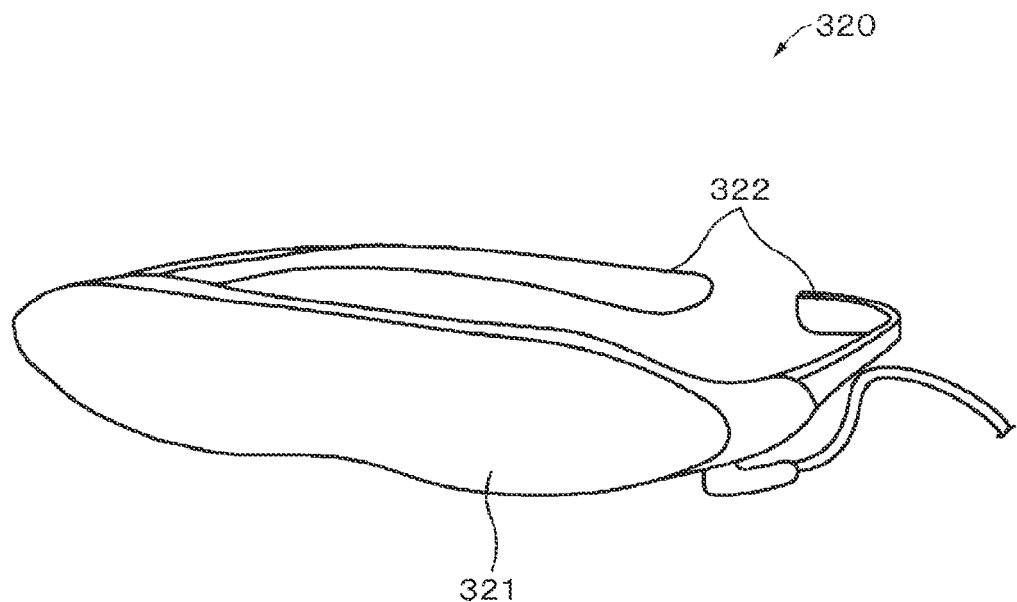
FIG. 31 is a perspective view of an example of an appearance of a head-mounted display.

FIG. 31 illustrates an example of an appearance of a head-mounted display 320. The head-mounted display 320 has, for example, ear hooks 322 for being worn on a user's head on both sides of an eyeglass-shaped display unit 321. As the display unit 321, the display device according to any one of the above-described first embodiment and its modifications can be used. Furthermore, as the display unit 321, the display device according to any one of the above-described second to fourth embodiments and its modifications can also be used.

Specific Example 3

Figure 32:
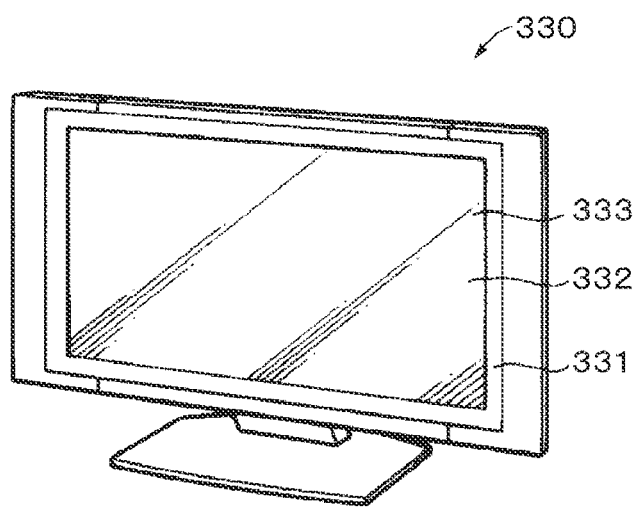
FIG. 32 is a perspective view illustrating an example of an appearance of a television device.

FIG. 32 illustrates an example of an appearance of a television device 330. The television device 330 has, for example, a video display screen unit 331 including a front panel 332 and a filter glass 333, and the video display screen unit 331 is configured using the display device according to any one of the above-described first embodiment and its modifications. Furthermore, the video display screen unit 331 may be configured using the display device according to any one of the above-described second to fourth embodiments and its modifications can also be used.

(Lighting Device)

In the above-described first to fourth embodiments, the examples in which the present disclosure is applied to the display device have been described. However, the present disclosure is not limited to the examples, and may be applied to lighting devices.

Figure 33:
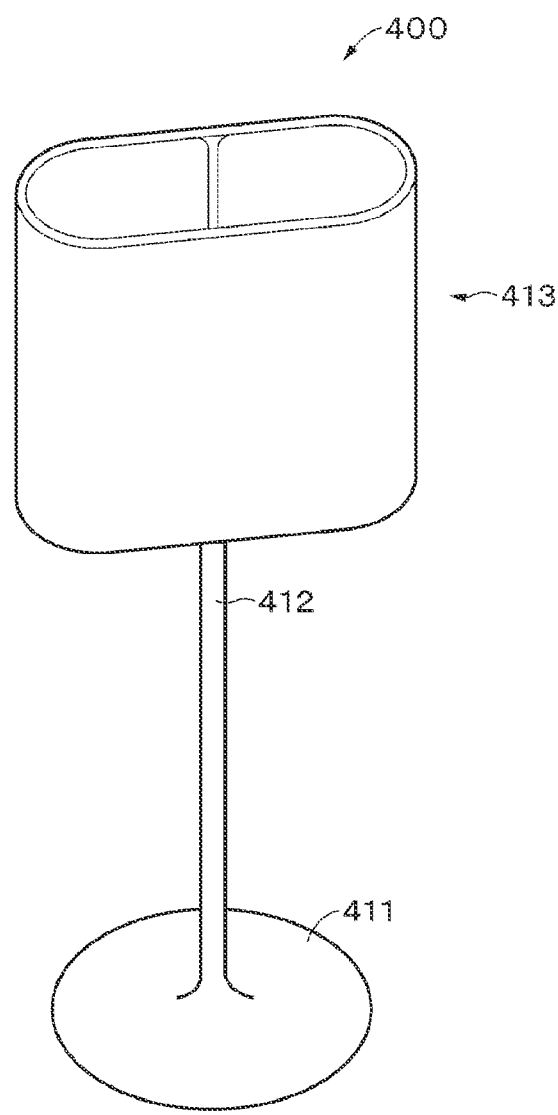
FIG. 33 is a perspective view illustrating an example of an appearance of a lighting device.

FIG. 33 illustrates an example of an appearance of a stand-type lighting device 400. The lighting device 400 has a lighting unit 413 attached to a support column 412 provided on a base 411. As the lighting unit 413, the display device according to any one of the first embodiment and its modifications or according to any one of the second to fourth embodiments or its modifications provided with a drive circuit for lighting device instead of the drive circuits for display device such as the signal line drive circuit 120 and the scanning line drive circuit 130 is used. Furthermore, the color filter 16 may not be provided, and the size of the opening of the insulating layer 13 may be appropriately selected according to optical characteristics of the lighting device 400. Moreover, by using a film as the substrate 11 and the facing substrate 18 and having a flexible configuration, an arbitrary shape such as a tubular shape or a curved surface shape illustrated in FIG. 33 can be adopted. Note that the number of light emitting elements 12 may be singular. Furthermore, a monochromatic filter may be provided instead of the color filter 16.

Here, the case where the lighting device is the stand-type lighting device 400 has been described, but the form of the lighting device is not limited to the case, and may be a form installed on a ceiling, a wall, a floor, or the like, for example.

Example

Hereinafter, the present disclosure will be specifically described with reference to examples, but the present disclosure is not limited to these examples.

The examples will be described in the following order. Note that, in the following examples, values of the average thicknesses of the first interface layer and the second interface layer, the peak intensity ratio ($I_{N-H}/I_{Si-H}$) of the bulk layer, and the ratio of the silicon oxide to the total amount of the silicon oxide and the silicon nitride contained in the second interface layer are obtained by the measuring method described in the first embodiment.

i Examination (1) of the relationship between the peak intensity ratio ($I_{N-H}/I_{Si-H}$) of the bulk layer and an interpixel leak current
  ii Examination (2) of the relationship between the peak intensity ratio ($I_{N-H}/I_{Si-H}$) of the bulk layer and the interpixel leak current
  iii Examination of the relationship between the average thickness of the first interface layer and the interpixel leak current
  iv Examination of the relationship between the ratio of the silicon oxide to the total amount of the silicon oxide and the silicon nitride contained in the second interface layer and the interpixel leak current
  v Examination of the relationship between the uniformity of the thickness of the organic layer on the first electrode and the vertical leak
  vi Examination of current density distribution by electromagnetic field simulation <i Examination (1) of the Relationship Between the Peak Intensity Ratio ($I_{N-H}/I_{Si-H}$) of the Bulk Layer and an Interpixel Leak Current>

Examples 1-1 and 1-2

First, a drive circuit and the like were formed on one main surface of a silicon substrate using the thin film forming technique, the photolithography technique, and the etching technique. Next, a metal layer was formed on the drive circuit and the like by the sputtering method, and then the metal layer was patterned by using the photolithography technique and the etching technique, so that a plurality of first electrodes each separated for each light emitting element (that is, for each subpixel) was formed.

Next, a first interface layer (SiO layer) having an average thickness of 5 nm was formed on one main surface of the silicon substrate on which the plurality of first electrodes was formed by the plasma CVD method, and then a bulk layer (SiN layer) having an average thickness of 40 nm was formed by the CVD method. At this time, $SiH_4$, $NH_2$, and $NH_3$ were used as a process gas. Note that a mixing ratio of the process gas was adjusted and the bulk layers having different composition ratios between Examples 1-1 and 1-2 were formed. Next, absorption spectrums of the bulk layers were measured by FT-IR. The results are illustrated in FIGS. 34A and 34B.

Next, the first interface layer and the bulk layer were patterned using the photolithography technique and the etching technique. Thereafter, the surface of the bulk layer was plasma-treated to form a second interface layer (SiON layer) of 3 nm on the surface of the bulk layer to obtain an insulating layer. At this time, conditions of the plasma treatment were adjusted such that the ratio of the silicon oxide to the total amount of the silicon oxide and the silicon nitride contained in the second interface layer is 90%.

Next, an organic layer was formed by stacking a hole injection layer, a hole transport layer, a light emitting layer, and an electron transport layer in this order on the first electrode and the insulating layer by the vapor deposition method. Next, a second electrode was formed on the organic layer by the sputtering method. As a result, a plurality of light emitting elements was formed on one main surface of the silicon substrate.

Next, a protective layer was formed on the second electrode by the CVD method, and then a color filter was formed on the protective layer. Next, the color filter was covered with a filled resin layer by the ODF method, and then the facing substrate was placed on the filled resin layer. Next, the substrate and the facing substrate were pasted together via the filled resin layer by irradiating the filled resin layer with ultraviolet rays to cure the filled resin layer. As a result, the display device was sealed.

(Peak Intensity Ratio)

The peak intensity ratio ($I_{N-H}/I_{Si-H}$) of the peak intensity $I_{N-H}$ derived from N—H and the peak intensity $I_{Si-H}$ derived from Si—H was obtained using the absorption spectrum measured after the bulk layer was formed. The results are illustrated in Table 1.

TABLE 1

|  | $I_{N-H}$ | $I_{Si-H}$ | $I_{N-H}/I_{Si-H}$ |
| --- | --- | --- | --- |
| Example 1-1 | 9.09 | 20.38 | 0.45 |
| Example 1-2 | 22.4 | 4.52 | 4.96 |

From Table 1, it can be seen that the peak intensity ratios ($I_{N-H}/I_{Si-H}$) of the bulk layers are different between Examples 1-1 and 1-2 in which the mixing ratio of the CVD process gas was adjusted and the bulk layer was formed.

(Interpixel Leak Amount)

Interpixel leak currents of the display devices of Examples 1-1 and 1-2 obtained as described above were measured. The interpixel leak currents were measured by measuring current values flowing through R and G subpixels with respect to a voltage applied to a B subpixel among RGB subpixels. Note that evaluation of an interpixel leak amount, which will be described below, was also performed by similar measurement. As a result of the above measurement, it was found that the interpixel leak current depends on the peak intensity ratio ($I_{N-H}/I_{Si-H}$) of the bulk layer. Specifically, it was found that the leak current flowing between pixels is suppressed in Example 1-1 where the peak intensity ratio ($I_{N-H}/I_{Si-H}$) is 0.45, as compared with Example 1-2 where the peak intensity ratio ($I_{N-H}/I_{Si-H}$) is 4.96.

<ii Examination (2) of the Relationship Between the Peak Intensity Ratio ($I_{N-H}/I_{Si-H}$) of the Bulk Layer and the Interpixel Leak Current>

Examples 2-1 to 2-5

Display devices were similarly obtained to Example 1-1 except that the peak intensity ratios ($I_{N-H}/I_{Si-F}$) of the bulk layers were set to 0.5 (Example 2-1), 1 (Example 2-2), 2 (Example 2-3), 3 (Example 2-4), and 4 (Example 2-5) by adjusting film formation conditions of bulk layers.
(Interpixel Leak Amount)

Interpixel leak currents of the display devices of Examples 2-1 to 2-5 obtained as described above were measured. The results are illustrated in FIG. 35.

Figure 35:
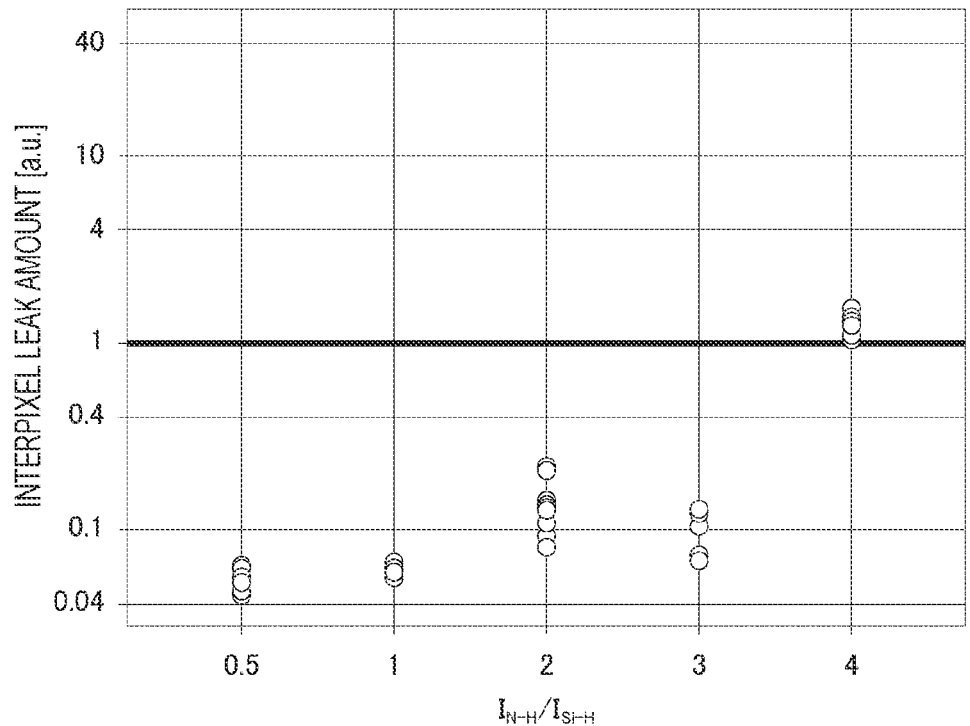
FIG. 35 is a graph illustrating a relationship between a peak intensity ratio ($I_{N-H}/I_{Si-H}$) of peak intensity $I_{N-H}$ derived from an N—H bond and peak intensity $I_{Si-H}$ derived from an Si—H bond, and an interpixel leak amount.

The following points can be seen from FIG. 35.

The interpixel leak current depends on the peak intensity ratio ($I_{N-H}/I_{Si-H}$) of the bulk layer, and the smaller the peak intensity ratio ($I_{N-H}/I_{Si-H}$), the more the interpixel leak current is suppressed.

From the viewpoint of suppressing the interpixel leak current, the peak intensity ratio ($I_{N-H}/I_{Si-F}$) is favorably less than 4, more favorably 3 or less.

<iii Examination of the Relationship Between the Average Thickness of the First Interface Layer and the Interpixel Leak Current>

Examples 3-1 to 3-6

Display devices were similarly obtained to Example 1-1 (the average thickness of the first interface layer: 5 nm) except that the average thicknesses of the first interface layers were 1 nm (Example 3-1), 3 nm (Example 3-2), 7 nm (Example 3-3), 9 nm (Example 3-4), 11 nm (Example 3-5), 13 nm (Example 3-6), and 15 nm (Example 3-7).

Comparative Example 3-1

A display device was similarly obtained to Example 1-1 except that a first interface layer was not formed.
(Interpixel Leak Amount)

The interpixel leak currents of the display devices of Examples 1-1, 3-1 to 3-6, and Comparative Example 3-1 obtained as described above were measured. The results are illustrated in FIG. 36.

Figure 36:
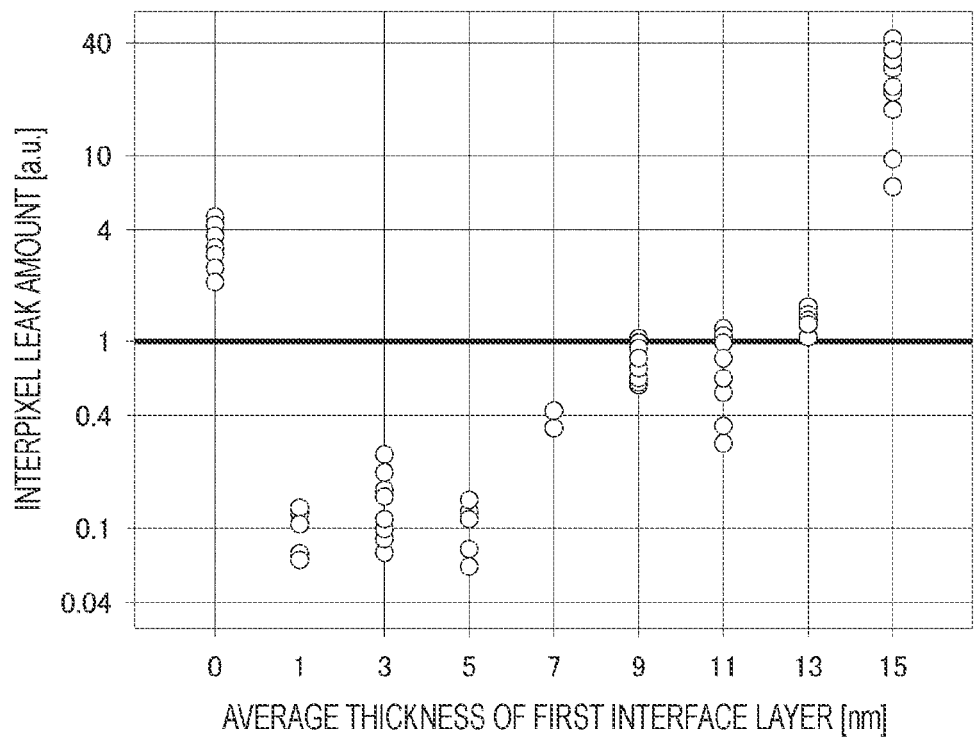
FIG. 36 is a graph illustrating a relationship between an average thickness of a first interface layer and an interpixel leak amount.

The following points can be seen from FIG. 36.

The interpixel leak current depends on the average thickness of the first interface. The average thickness of the first interface layer is favorably from 1 to 15 nm, exclusive of 15 nm, more favorably from 1 to 13 nm, both inclusive, even more favorably from 1 to 9 nm, both inclusive, particularly favorably from 1 to 7 nm, both inclusive, or most favorably from 1 to 5 nm, both inclusive, from the viewpoint of suppressing the interpixel leak current.

It is seen that the reason for an increase in the interpixel leak current when the average thickness of the first interface layer is less than 1 nm is that the fixed charge held by the bulk layer decreases due to a reaction between the first electrode and the bulk layer, and the bulk layer becomes unable to maintain the positively charged state. Meanwhile, it can be seen that the reason for an increase in the interpixel leak current when the average thickness of the first interface layer is 15 nm or more is that the hole current can easily flow from the first electrode to the upper surface of the insulating layer through the edge of the first interface layer.

<iv Examination of the Relationship Between the Ratio of the Silicon Oxide to the Total Amount of the Silicon Oxide and the Silicon Nitride Contained in the Second Interface Layer and the Interpixel Leak Current>

Examples 4-1 to 4-3

Display devices were similarly obtained to Example 1-1 except that the ratios of the silicon oxide to the total amount of the silicon oxide and the silicon nitride contained in the second interface layer were set to 60% (Example 4-1), 80% (Example 4-2), and 100% (Example 4-3) by adjusting film formation conditions (plasma treatment conditions) of second interface layers.
(Interpixel Leak Amount)

Interpixel leak currents of the display devices of Examples 4-1 to 4-3 obtained as described above were measured. As a result, it was found that the interpixel leak current depends on the ratio of the silicon oxide to the total amount of the silicon oxide and the silicon nitride contained in the second interface layer, and the ratio is favorably set to 80% or more from the viewpoint of suppressing the interpixel leak current.

<v Examination of the Relationship Between the Uniformity of the Thickness of the Organic Layer on the First Electrode and the Vertical Leak>

Example 5-1

In Example 5-1, a display device having the configuration illustrated in FIG. 11 was produced as follows.

First, a silicon substrate having a drive circuit and the like formed on one main surface was obtained, as illustrated in FIG. 15A, using the thin film forming technique, the photolithography technique, and the etching technique. Next, an electrode layer (ACX/ITO layer) was formed on the drive circuit and the like, as illustrated in FIG. 15B, by the sputtering method, and then an electrode layer was patterned using the photolithography technique and the etching technique, so that a plurality of first electrodes each separated for each light emitting element (that is, for each subpixel) was formed, as illustrated in FIG. 15C.

Next, a first interface layer (SiO layer) was formed on one main surface of the silicon substrate on which the plurality of first electrodes was formed, as illustrated in FIG. 15D, by the CVD method, then, the first interface layer 24 was removed while the first interface layer having the same height as the first electrode 12A remained on a side surface of the first electrode, as illustrated in FIG. 15E, by the etchback method. Next, a bulk layer (SiN layer) was formed by the CVD method as illustrated in FIG. 15F. Next, a photoresist layer was formed on the bulk layer to flatten the surface, as illustrated in FIG. 16A, by the spin coating method.

Next, the photoresist layer was removed and a part of the bulk layer was removed, so that the first electrode, the first interface layer, and the bulk layer having the same height were formed, as illustrated in FIG. 16B, by the etchback method. Next, the surface of the bulk layer 13A was plasma-treated to form a second interface layer (SiON layer) of an average thickness of 2.5 nm, as illustrated in FIG. 16C. Thereby, an insulating layer was obtained. Next, a hole injection layer, a hole transport layer, a light emitting layer, and an electron transport layer were stacked in this order on the first electrode, the first interface layer, and the insulating layer by the vapor deposition method. Thereby, an organic layer having a constant thickness was formed. The display device was obtained by performing the following processes similarly to Example 1-1.

Note that the average thicknesses of the first electrode, the first interface layer, and the insulating layer were set to 65 nm by adjusting process conditions.

Example 5-2

In Example 5-2, a display device having the configuration illustrated in FIG. 14 was produced as follows. That is, the display device was produced similarly to Example 1 except that the average thickness of an insulating layer was set to 85 nm by adjusting process conditions.

Example 5-3

In Example 5-3, a display device having the configuration illustrated in FIG. 18 was produced as follows.

First, a process of forming a substrate to a process of forming a first interface layer were similarly performed to Example 5-1, and the first interface layer (SiO layer) was formed on one main surface of the substrate on which a plurality of first electrodes was formed, as illustrated in FIG. 20A.

Next, a bulk layer (SiN layer) was formed on the first interface layer by the CVD method, as illustrated in FIG. 20B. Next, a photoresist layer was formed on the bulk layer, and then an opening was formed in a portion of the photoresist layer, the portion corresponding to above the first electrode, as illustrated in FIG. 20C by, for example, the spin coating method. Next, openings were formed in portions of the first interface layer and the bulk layer, the portions corresponding to above the first electrode layer, as illustrated in FIG. 21A, by the etching method. At this time, the etching rate between the first interface layer (SiO) and the bulk layer (SiN) was adjusted using a deposition gas such as $CH_2F_2$, and etching was conducted. As a result, these openings were formed such that peripheral edge of the opening of the insulating layer is located inside a peripheral edge of the opening of the first interface layer.

Next, the surface of the bulk layer 13A was plasma-treated to form a second interface layer (SiON layer) of an average thickness of 2.5 nm, as illustrated in FIG. 21B. Thereby, an insulating layer was obtained. Next, the hole injection layer, the hole transport layer, the light emitting layer, and the electron transport layer were stacked in this order on the first electrode and the insulating layer by a vapor deposition method. Thereby, an organic layer having a plurality of salients on an upper surface and having a substantially constant thickness in a region inside the salient was formed, as illustrated in FIG. 21C. The display device was obtained by performing the following processes similarly to Example 1-1.

Note that the average thickness of the first electrode was set to 65 nm, the average thickness of the first interface layer was set to 9 nm, and the average thickness of the insulating layer was set to 26 nm by adjusting process conditions.

Example 5-4

In Example 5-4, a display device having the configuration illustrated in FIG. 19 was produced as follows.

The display device was obtained similarly to Example 5-1 except that an etching rate between a first interface layer (SiO) and a bulk layer (SiN) was adjusted so that a peripheral edge of an opening of an insulating layer and a peripheral edge of an opening of the first interface layer overlap in a process of forming openings of the first interface layer and the bulk layer.

Comparative Example 5-1

In Comparative Example 5-1, a display device having the configuration illustrated in FIG. 13 was produced as follows.

That is, the display device was produced similarly to Example 1 except that the average thickness of an insulating layer was set to 45 nm by adjusting process conditions.

(Luminous Efficiency)

The luminous efficiency of the display devices of Examples 5-1 to 5-4 and Comparative Example 5-1 obtained as described above was obtained. The result is illustrated in FIG. 37.

Figure 37:
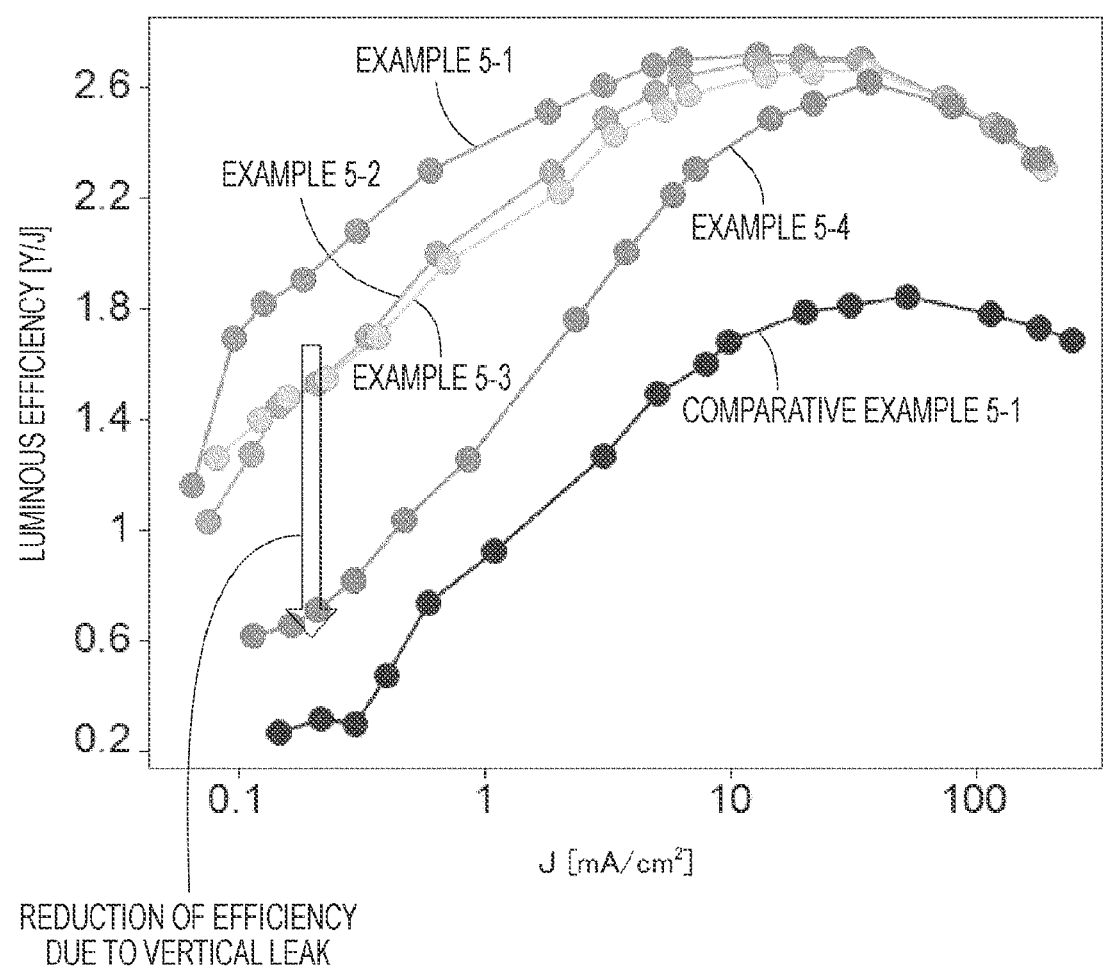
FIG. 37 is a graph illustrating evaluation results of luminous efficiency of display devices of Examples 5-1 to 5-4 and Comparative Example 5-1.

The following points are seen from FIG. 37.

The luminous efficiency of the display devices of Examples 5-1 to 5-3 is higher than the luminous efficiency of the display devices of Examples 5-4 and Comparative Example 5-1. In particular, the luminous efficiency in a low current density range is high.

<vi Examination of Current Density Distribution by Electromagnetic Field Simulation>

Example 6-1

First, as a model for electromagnetic field simulation, a display device having the configuration illustrated in FIG. 38A was set. Hereinafter, the setting conditions for the layers are described.

The Second Electrode: An MgAg Alloy Electrode

Figure 40:
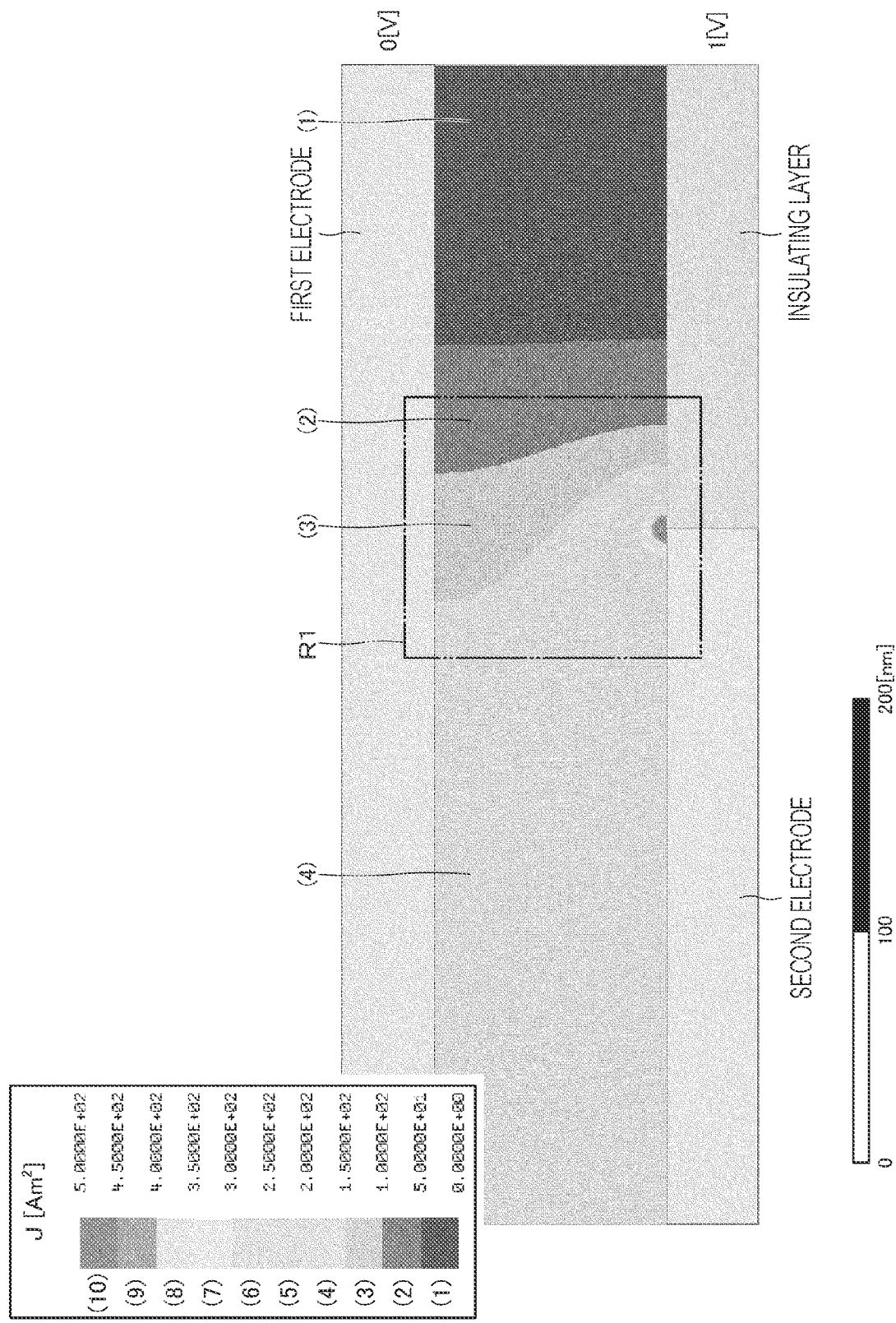
FIG. 40 is a diagram illustrating an analysis result of the electromagnetic field simulation of Example 6-1.
Figure 41:
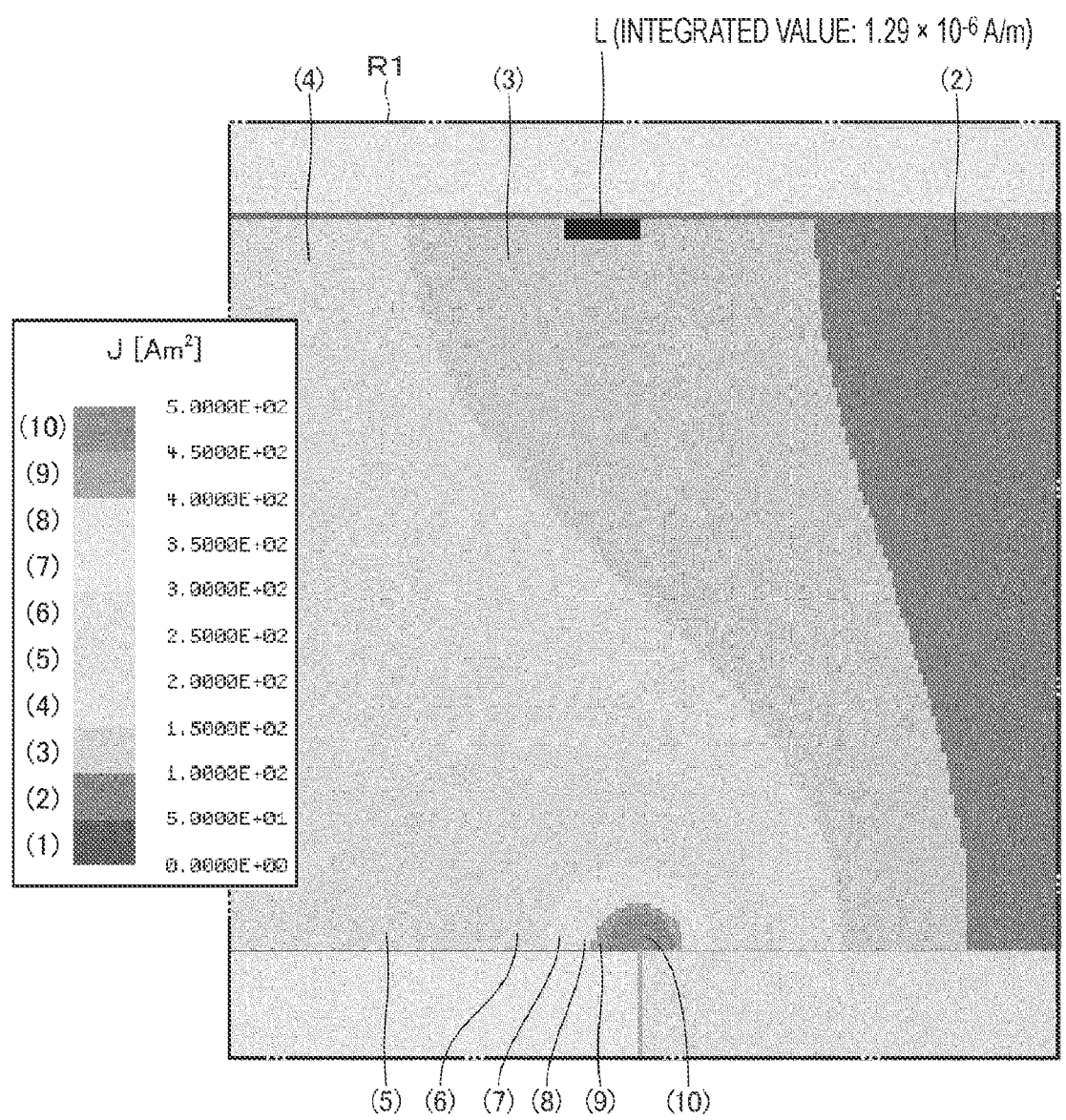
FIG. 41 is an enlarged diagram of region R1 in FIG. 40.

The organic layer: the thickness 100 nm, the permittivity $\varepsilon=4.35\times10^{-6}$ [S/m], and the relative permittivity $\varepsilon_r=3$ The insulating layer: the material SiN, the permittivity $\varepsilon=0$ [S/m], and the relative permittivity $\varepsilon_r=7$ The First Electrode: An Al Electrode Next, current density distribution of the organic layer was calculated by electromagnetic field simulation (ANSYS Maxwell) using the above model. The results are illustrated in FIGS. 40 and 41. An integrated value of the part illustrated by the straight line L (length 10 nm) in FIG. 41 was $1.29\times10^{-6}$ A/m.

The symbols (1), (2), (3), and the like in FIGS. 40 and 41 correspond to magnitude of current density (gradation legends). In the drawings illustrating results of simulations of Example 6-2 and Comparative Examples 6-1 and 6-2 below, the symbols (1), (2), (3) and the like also correspond to the magnitude of current density (gradation legends).

Example 6-1

First, as a model for electromagnetic field simulation, a display device having the configuration illustrated in FIG. 38B was set. Hereinafter, the setting conditions for the layers are described.

The Second Electrode: An MgAg Alloy Electrode

Figure 42:
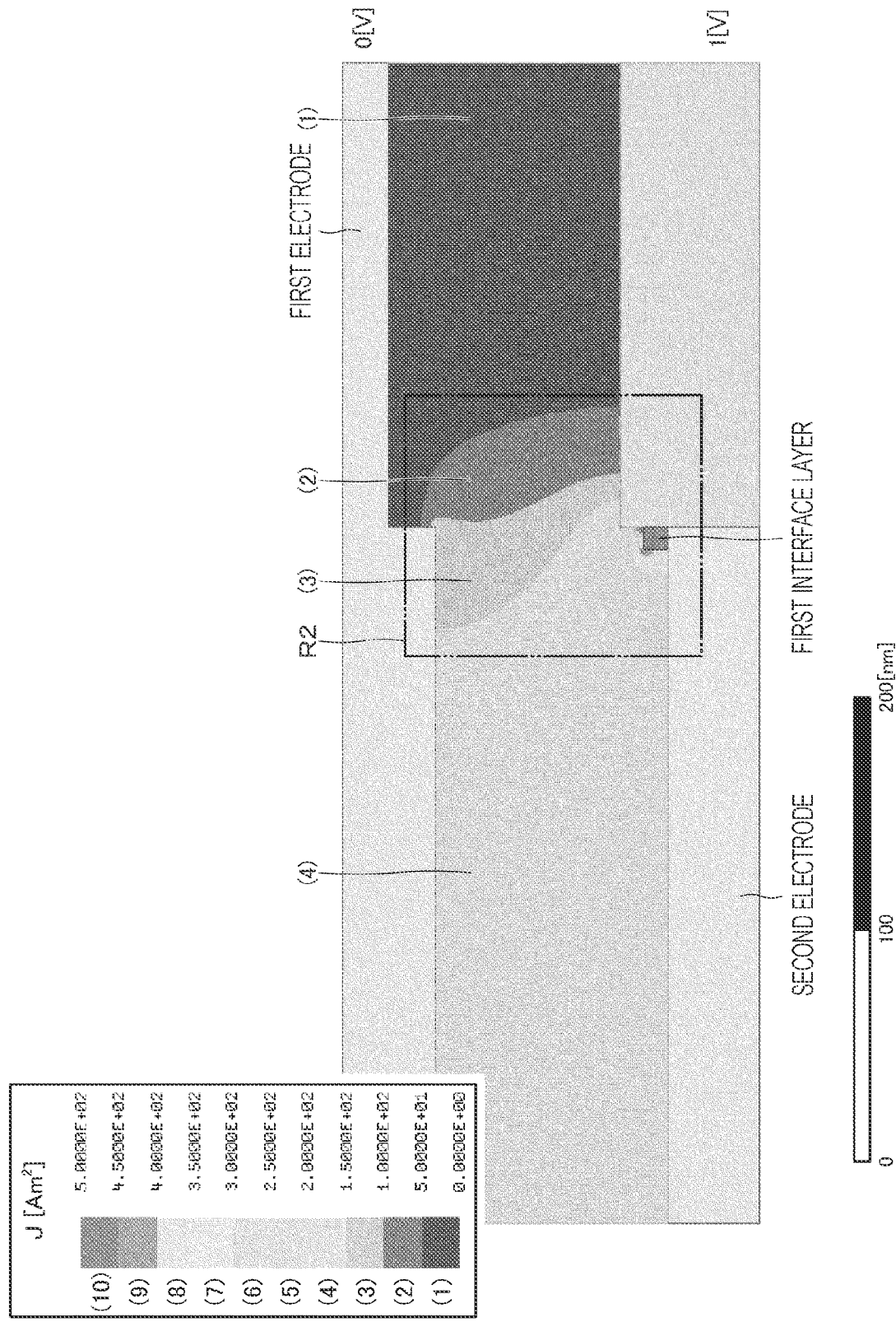
FIG. 42 is a diagram illustrating an analysis result of the electromagnetic field simulation of Example 6-2.
Figure 43:
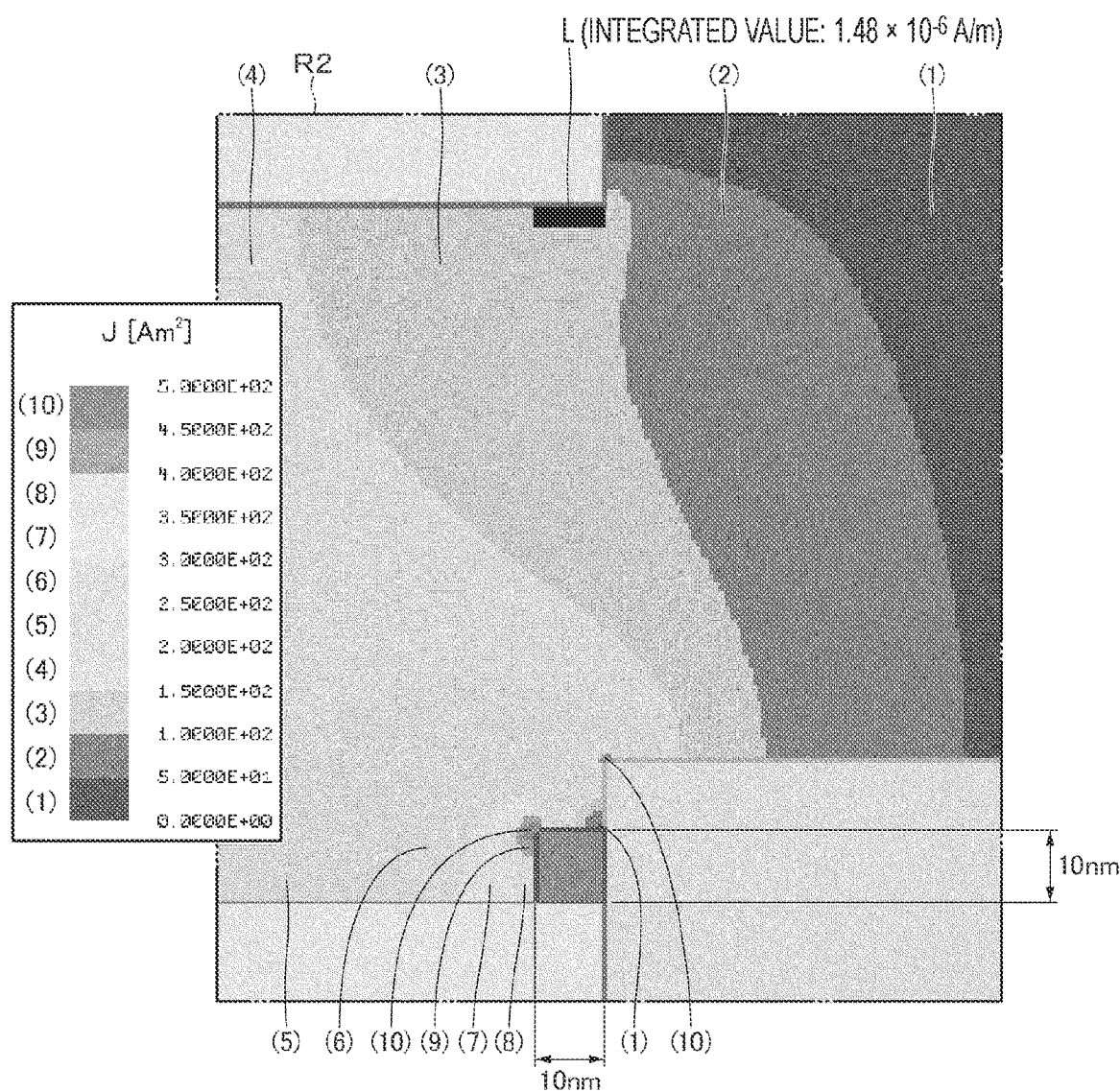
FIG. 43 is an enlarged diagram of region R2 in FIG. 42.

The organic layer: the thickness 100 nm, the permittivity $\varepsilon=4.35\times10^{-6}$ [S/m], and the relative permittivity $\varepsilon_r=3$ The insulating layer: the material SiN, the permittivity $\varepsilon=0$ [S/m], and the relative permittivity $\varepsilon_r=7$ The First Electrode: An Al Electrode Next, current density distribution of the organic layer was calculated by electromagnetic field simulation (ANSYS Maxwell) using the above model. The results are illustrated in FIGS. 42 and 43. The integrated value of the part illustrated by the straight line L (length 10 nm) in FIG. 43 was $1.48 \times 10^{-6}$ A/m.

Comparative Example 6-1

Figure 44:
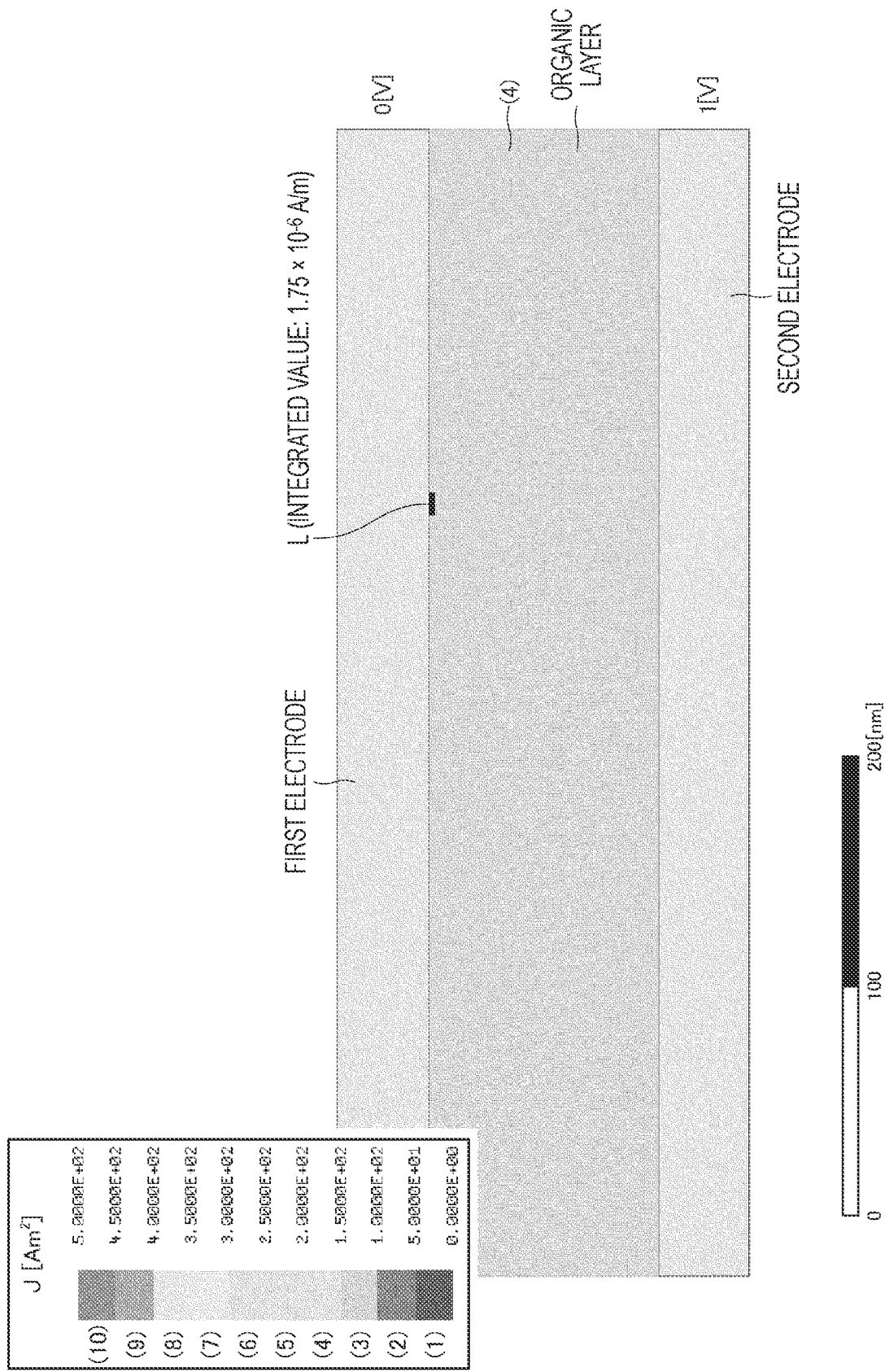
FIG. 44 is a diagram illustrating an analysis result of the electromagnetic field simulation of Comparative Example 6-1.

First, as a model for electromagnetic field simulation, a display device having the configuration illustrated in FIG. 39A was set. Hereinafter, the setting conditions for the layers are described.
The Second Electrode: An MgAg Alloy Electrode
The organic layer: the thickness 100 nm, the permittivity $\varepsilon = 4.35 \times 10^6$ [S/m], and the relative permittivity $\varepsilon_r = 3$
The First Electrode: An Al Electrode
Next, current density distribution of the organic layer was calculated by electromagnetic field simulation (ANSYS Maxwell) using the above model. The result is illustrated in FIG. 44. The integrated value of the part illustrated by the straight line L (length 10 nm) in FIG. 44 was $1.75 \times 10^{-6}$ A/m.

Comparative Example 6-3

Figure 45:
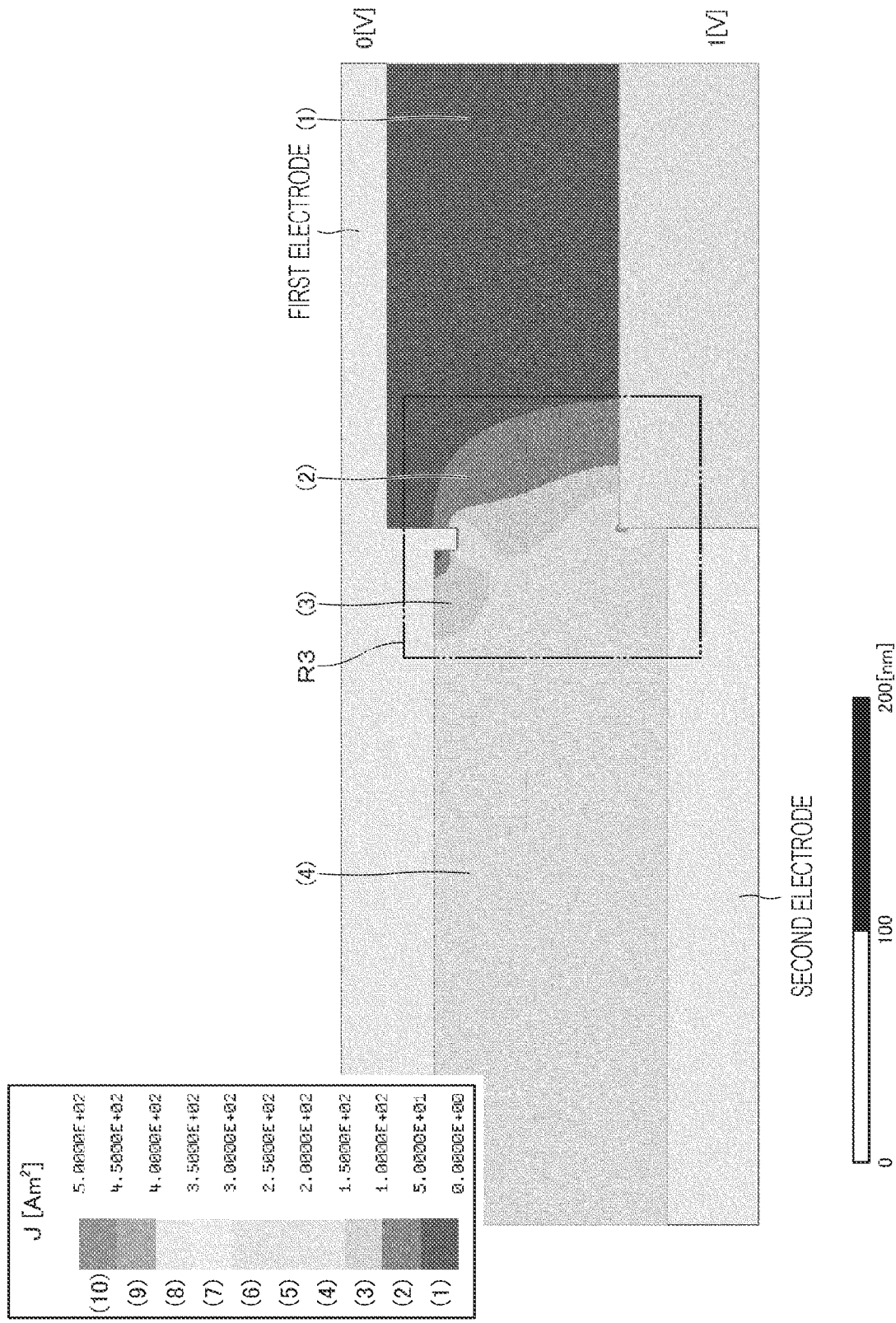
FIG. 45 is a diagram illustrating an analysis result of the electromagnetic field simulation of Comparative Example 6-2.
Figure 46:
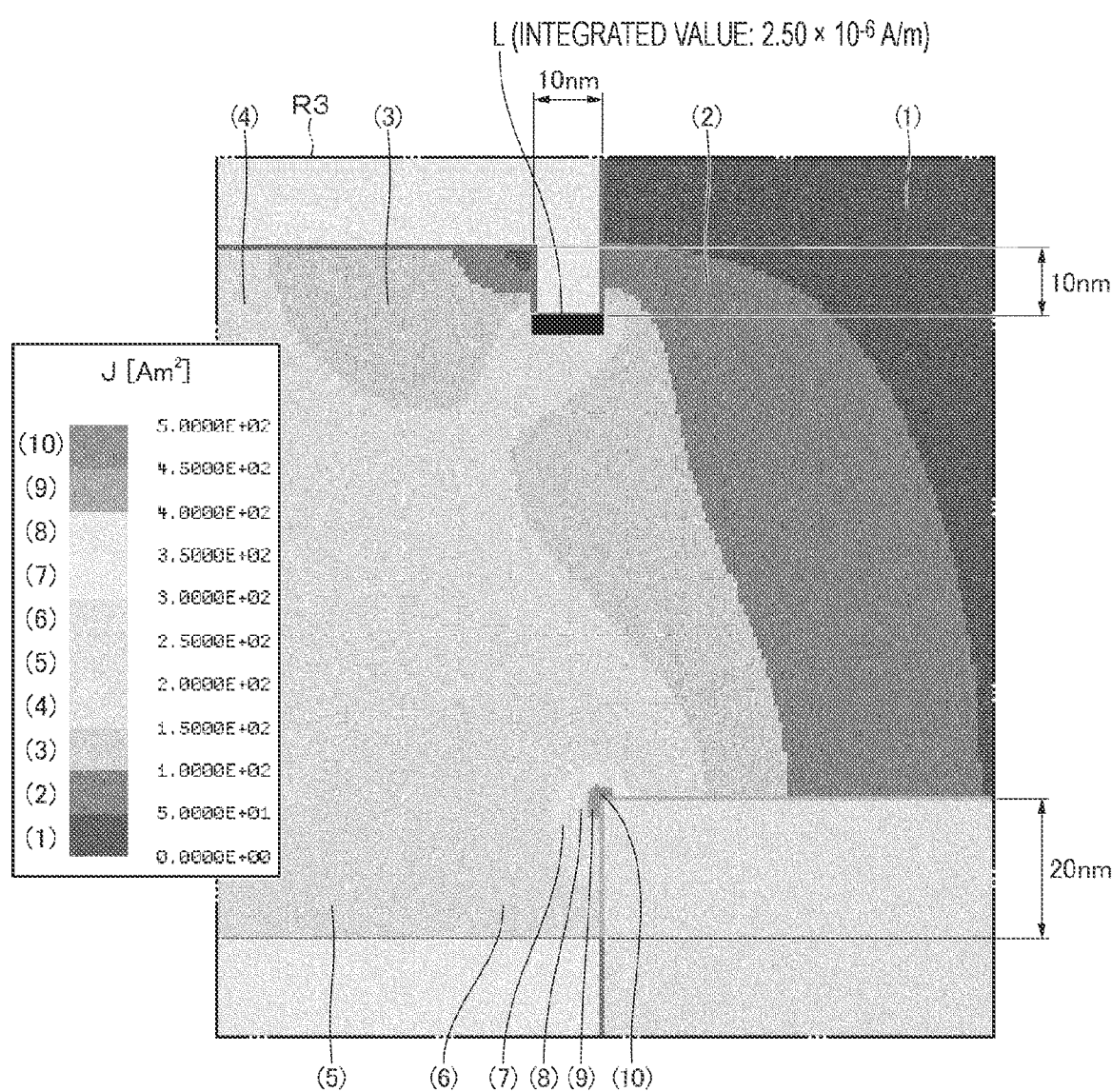
FIG. 46 is an enlarged diagram of region R3 in FIG. 45.

First, as a model for electromagnetic field simulation, a display device having the configuration illustrated in FIG. 39B was set. Hereinafter, the setting conditions for the layers are described.
The Second Electrode: An MgAg Alloy Electrode
The organic layer: the thickness 100 nm, the permittivity $\varepsilon = 4.35 \times 10^{-6}$ [S/m], and the relative permittivity $\varepsilon_r = 3$
The insulating layer: the material SiN, the permittivity $\varepsilon = 0$ [S/m], and the relative permittivity $\varepsilon_r = 7$
The First Electrode: An Al Electrode
Next, current density distribution of the organic layer was calculated by electromagnetic field simulation (ANSYS Maxwell) using the above model. The results are illustrated in FIGS. 45 and 46. The integrated value of the part illustrated by the straight line L (length 10 nm) in FIG. 46 was $2.50 \times 10^{-6}$ A/m.

It can be seen that the current value on the peripheral edge portion of the first electrode can be suppressed when the thickness of the organic layer on the first electrode is constant, that is, the height of the organic layer is constant, from the analysis results of the electromagnetic field simulations of Examples 6-1 and 6-2, and Comparative Example 6-1.

The first to fourth embodiments and its modifications of the present disclosure have been specifically described. However, the present disclosure is not limited to the first to fourth embodiments and its modifications and various modifications based on the technical idea of the present disclosure are possible.

For example, the configurations, methods, steps, shapes, materials, numerical values, and the like given in the first to fourth embodiments and its modifications are merely examples, and configurations, methods, steps, shapes, materials, numerical values, and the like different from those of the embodiments and modifications may be used as needed.

Furthermore, the configurations, methods, steps, shapes, materials, numerical values, and the like given in the first to fourth embodiments and its modifications can be combined with one another without departing from the gist of the present disclosure.

Furthermore, in the numerical range described stepwise in the first to fourth embodiments and its modifications, the upper limit value or the lower limit value of the numerical range of one step may be replaced with the upper limit value the lower limit value of the numerical range of another step.

Furthermore, the materials exemplified in the first to fourth embodiments and its modifications can be used alone or in combination of two or more types unless otherwise specified.

The present disclosure can also adopt the following configurations.

(1)
A display device including:
a plurality of first electrodes each provided for each pixel;
an insulating layer containing a silicon compound, provided between the first electrodes, and covering a peripheral edge portion of the first electrode;
a first interface layer containing a first silicon oxide and provided at an interface between the first electrode and the insulating layer;
an organic layer including a light emitting layer, and provided on the first electrodes and the insulating layer, commonly to all of pixels; and
a second electrode provided on the organic layer, in which
the insulating layer contains a second silicon oxide in a surface portion on a side of the organic layer.

(2)
The display device according to (1), in which the insulating layer further contains a silicon nitride in the surface portion on the side of the organic layer.

(3)
The display device according to (2), in which
the silicon compound contains a silicon nitride, and
a ratio of the second silicon oxide to a total amount of the second silicon oxide and the silicon nitride contained in the surface portion on the side of the organic layer is 80% or more.

(4)
The display device according to any one of (1) to (3), in which a composition of the insulating layer continuously changes from bulk toward a surface on the side of the organic layer.

(5)
The display device according to any one of (1) to (3), in which
the insulating layer includes
a bulk layer containing the silicon compound, and
a second interface layer containing the second silicon oxide and provided at an interface between the bulk layer and the organic layer.

(6)
The display device according to (5), in which an average thickness of the second interface layer is 10 nm or less.

(7)
The display device according to (5) or (6), in which
the second interface layer includes two or more layers, and
at least one layer of the two or more layers contains the second silicon oxide.

(8)
The display device according to (5) or (6), in which
the second interface layer includes
a first layer containing the second silicon oxide, and
a second layer containing at least one type of a silicon nitride or a silicon oxynitride and provided on the first layer.

(9)
The display device according to any one of (5) to (8), further including:
an intermediate layer containing a silicon fluoride and provided between the second interface layer and the bulk layer.

(10)
The display device according to any one of (5) to (9), in which the second interface layer covers a main surface of the bulk layer and an edge of the bulk layer.
(11)
The display device according to (10), in which a portion of the second interface layer, the portion covering the edge of the bulk layer, has a composition different from a portion of the second interface layer, the portion covering the main surface of the bulk layer.
(12)
The display device according to (11), in which a portion of the second interface layer, the portion covering an edge of the insulating layer, is positively charged.
(13)
The display device according to any one of (1) to (12), in which an average thickness of the first interface layer is less than 15 nm.
(14)
The display device according to any one of (1) to (13), in which the insulating layer is positively charged.
(15)
The display device according to any one of (1) to (14), in which the silicon compound contains a silicon nitride.
(16)
The display device according to (15), in which
the insulating layer further contains hydrogen, and
a peak intensity ratio ($I_{N-H}/I_{Si-H}$) of peak intensity $I_{N-H}$ derived from an N—H bond and peak intensity $I_{Si-H}$ derived from an Si—H bond, the peak intensity ratio being obtained by analyzing the insulating layer by an X-ray photoelectron spectroscopy, is less than 4.
(17)
The display device according to any one of (1) to (16), in which the first electrode includes an oxide conductive layer.
(18)
The display device according to any one of (1) to (17), in which
the organic layer includes a plurality of salients provided in portions corresponding to the respective peripheral edge portions of the plurality of first electrodes, the portions being of a surface on a side of the second electrode, and
a thickness of the organic layer in a region inside the salient is substantially constant.
(19)
The display device according to (18), in which
the first interface layer has a plurality of first openings respectively provided above the plurality of first electrodes,
the insulating layer has a plurality of second openings respectively provided above the plurality of first electrodes, and
an aperture ratio of the insulating layer is higher than an aperture ratio of the first interface layer.
(20)
The display device according to (18) or (19), in which
the first interface layer has a plurality of first openings respectively provided above the plurality of first electrodes,
the insulating layer has a plurality of second openings respectively provided above the plurality of first electrodes, and
a peripheral edge of the first opening is located inside a peripheral edge of the second opening.
(21)
The display device according to (20), in which
the first interface layer has a protrusion protruding with respect to the peripheral edge of the second opening, and
a thickness of the protrusion increases as a distance from the first opening increases.
(22)
The display device according to any one of (1) to (21), in which the first electrode contains an indium oxide and a tin oxide.
(23)
The display device according to any one of (1) to (22), in which the pixel has a resonator structure that resonates light generated by a light emitting element.
(24)
An electronic device including:
the display device according to any one of (1) to (23).
(25)
A display device including:
a plurality of first electrodes each provided for each pixel;
an insulating layer containing a silicon compound and provided between the first electrodes;
a first interface layer containing a first silicon oxide and provided between a side surface of the first electrode and a side surface of the insulating layer;
an organic layer including a light emitting layer, and provided on the first electrodes and the insulating layer, commonly to all of pixels; and
a second electrode provided on the organic layer, in which
a thickness of the organic layer on the first electrodes is substantially constant.
(26)
The display device according to (24), in which a height $H_1$ of the organic layer on the first electrode and a height $H_2$ of the organic layer in a portion around the first electrode satisfy a relationship of $H_1 \leq H_2$.
(27)
The display device according to (25) or (26), in which a height $h_1$ of the first electrode, a height $h_2$ of the first interface layer, and a height $h_3$ of the insulating layer satisfy a relationship of $h_1 \leq h_2 \leq h_3$.
(28)
The display device according to any one of (25) to (27), in which the first interface layer covers a peripheral edge portion of the first electrode.
(29)
The display device according to any one of (25) to (27), in which the first interface layer and the insulating layer cover a peripheral edge portion of the first electrode.
(30)
The display device according to any one of (25) to (29), in which
the first interface layer has a plurality of first openings provided respectively corresponding to the plurality of first electrodes,
the insulating layer has a plurality of second openings provided respectively corresponding to the plurality of first electrodes, and
an aperture ratio of the insulating layer is higher than an aperture ratio of the first interface layer.
(31)
The display device according to any one of (25) to (30), in which the first electrode contains an indium oxide and a tin oxide.

(32)

The display device according to any one of (25) to (31), in which the insulating layer contains a second silicon oxide in a surface portion on a side of the organic layer.

(33)

The display device according to any one of (25) to (32), in which the insulating layer has a plurality of inclined surfaces respectively surrounding the plurality of first electrodes.

(34)

The display device according to any one of (25) to (33), in which the pixel has a resonator structure that resonates light generated by a light emitting element.

(35)

A display device including:
a plurality of first electrodes each provided for each pixel;
an insulating layer provided between the first electrodes;
a first interface layer provided between a side surface of the first electrode and a side surface of the insulating layer;
an organic layer including a light emitting layer, and provided on the first electrodes and the insulating layer, commonly to all of pixels; and
a second electrode provided on the organic layer, in which a thickness of the organic layer on the first electrodes is substantially constant.

(36)

An electronic device including:
the display device according to any one of (25) to (35).

REFERENCE SIGNS LIST 10, 10$_1$, 10$_2$, 10$_3$, 10$_4$, 10$_5$, 20A, 20B, and 30A Display device
11 Substrate
12 Light emitting element
12A and 12D First electrode
12A1 Electrode layer
12$_B$ Organic layer
12B$_1$ Hole injection layer
12B$_2$ Hole transport layer
12B$_3$ Light emitting layer
12B$_4$ Electron transport layer
12C Second electrode
12CA Salient
12D$_1$ Metal layer
12D$_2$ Oxide conductive layer
13, 13$_1$, 13$_2$, 13$_3$, 13$_4$, 23, and 43 Insulating layer
13A, 23A, and 43A Bulk layer
13A1 Photoresist layer
13B, 13D, 13E, 23B, and 43B Second interface layer
13C Intermediate layer
13D$_1$ First layer
13D$_2$ Second layer
13H, 14H, and 43H Opening
14 and 24 First interface layer
14A Protrusion
15 Protective layer
16 Color filter
17 Filled resin layer
18 Facing substrate
23A1 Photoresist layer
43C Inclined surface
100R, 100G, and 100B Subpixel
110A Display region
110B Peripheral region
120 Signal line drive circuit
130 Scanning line drive circuit
120A Signal line
130A Scanning line
140 Pixel drive circuit
310 Digital still camera (electronic device)
320 Head-mounted display (electronic device)
330 Television device (electronic device)
400 Lighting device

The invention claimed is:

1. A display device comprising:
a first electrodes provided for a pixel;
an insulating layer covering a peripheral edge portion of the first electrode, the insulating layer having a first composition including a first silicon oxide and a first silicon nitride;
a first interface layer provided at an interface between the first electrode and the insulating layer, the first interface layer having a second composition;
an organic layer including a light emitting layer, and provided on the first electrodes and the insulating layer;
a second interface layer provided at an interface between the insulating layer and the organic layer, the second interface layer having a third composition including a second silicon oxide and a second silicon nitride; and
a second electrode provided on the organic layer, wherein a ratio of the second silicon oxide to a total amount of the second silicon oxide and the second silicon nitride is 80% or more.

2. The display device according to claim 1, wherein the first composition continuously changes from a first portion as the insulating layer extends toward a surface on a side of the organic layer.

3. The display device according to claim 1, wherein an average thickness of the second interface layer is 10 nm or less.

4. The display device according to claim 1, wherein the second interface layer includes two or more layers, and at least one layer of the two or more layers contains the second silicon oxide.

5. The display device according to claim 1, wherein the second interface layer includes a first layer containing the second silicon oxide, and a second layer containing at least one type of another silicon nitride or a silicon oxynitride and provided on the first layer.

6. The display device according to claim 1, further comprising:
an intermediate layer containing a silicon fluoride and provided between the second interface layer and the insulating layer.

7. The display device according to claim 1, wherein the second interface layer covers a main surface of the insulating layer and an edge of the insulating layer.

8. The display device according to claim 7, wherein a portion of the second interface layer that covers the edge of the insulating layer, has a different composition from a portion of the second interface layer that cover the main surface of the bulk layer.

9. The display device according to claim 8, wherein the portion of the second interface layer that covers the edge of the insulating layer is positively charged.

10. The display device according to claim 1, wherein an average thickness of the first interface layer is less than 15 nm.

11. The display device according to claim 1, wherein the insulating layer is positively charged.

12. The display device according to claim 1, wherein
the insulating layer further contains hydrogen, and a peak intensity ratio ($I_{N-H}/I_{Si-H}$) of peak intensity $I_{N-H}$ derived from an N—H bond and peak intensity $I_{Si-H}$ derived from an Si—H bond, the peak intensity ratio being obtained by analyzing the insulating layer by an X-ray photoelectron spectroscopy, is less than 4.

13. The display device according to claim 1, wherein the first electrode includes an oxide conductive layer.

14. The display device according to claim 1, wherein the organic layer includes a plurality of salients provided in a portions corresponding to the peripheral edge portions of the first electrodes, the portions being of a surface on a side of the second electrode, and a thickness of the organic layer in a region inside the salient is substantially constant.

15. The display device according to claim 1,
wherein the first electrode contains an indium oxide and a tin oxide.

16. The display device according to claim 1, wherein
the pixel has a resonator structure that resonates light generated by a light emitting element.

17. An electronic device comprising:
the display device according to claim 1.

18. The display device according to claim 1, wherein the second composition differs from the first composition.

19. The display device according to claim 1, wherein the third composition differs from the first composition.

* * * * *